US012638514B2

(12) United States Patent
Ikeda et al.

(10) Patent No.: US 12,638,514 B2
(45) Date of Patent: May 26, 2026

(54) POWER STORAGE SYSTEM, VEHICLE, AND ELECTRONIC DEVICE

(71) Applicant: Semiconductor Energy Laboratory Co., Ltd., Atsugi (JP)

(72) Inventors: Takayuki Ikeda, Atsugi (JP); Yosuke Tsukamoto, Atsugi (JP); Takeshi Osada, Isehara (JP); Hiroki Inoue, Atsugi (JP); Kiyotaka Kimura, Isehara (JP); Shunsuke Sato, Yokohama (JP); Toshiki Mizuguchi, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 584 days.

(21) Appl. No.: 18/035,992

(22) PCT Filed: Nov. 12, 2021

(86) PCT No.: PCT/IB2021/060484
§ 371 (c)(1),
(2) Date: May 9, 2023

(87) PCT Pub. No.: WO2022/112894
PCT Pub. Date: Jun. 2, 2022

(65) Prior Publication Data
US 2023/0408595 A1    Dec. 21, 2023

(30) Foreign Application Priority Data

Nov. 27, 2020    (JP) .................................. 2020-197181
Sep. 3, 2021    (JP) .................................. 2021-143691

(51) Int. Cl.
*G01R 31/389*    (2019.01)
*H01M 10/42*    (2006.01)
*H01M 10/48*    (2006.01)

(52) U.S. Cl.
CPC ...... *G01R 31/389* (2019.01); *H01M 10/4264* (2013.01); *H01M 10/48* (2013.01); *H01M 10/486* (2013.01)

(58) Field of Classification Search
CPC ............. H01M 10/4264; H01M 10/48; H01M 10/486; G01R 31/389
(Continued)

(56) References Cited

U.S. PATENT DOCUMENTS 5,416,470 A * 5/1995 Tanaka ................... G01R 31/66
340/661
7,311,441 B2    12/2007 Weaver et al.
(Continued)

FOREIGN PATENT DOCUMENTS

CN    103187757 A    7/2013
CN    103490099 A    1/2014
(Continued)

OTHER PUBLICATIONS

Taiwanese Office Action (Application No. 110142977) Dated May 12, 2025.
(Continued)

*Primary Examiner* — James M Erwin
(74) *Attorney, Agent, or Firm* — Eric J. Robinson; Robinson Intellectual Property Law Office, P.C.

(57)    ABSTRACT

Provided is a power storage system, a secondary battery control system, a secondary battery measurement circuit, or the like that consumes low power. Provided is a power storage system, a secondary battery control system, a secondary battery measurement circuit, or the like that is highly integrated. The power storage system includes a secondary battery and a measurement circuit; the measurement circuit includes a resistor, a capacitor, and an inductor; one terminal of the resistor is electrically connected to one electrode of
(Continued)

the capacitor; the other terminal of the resistor is electrically connected to one terminal of the inductor; one terminal of the inductor is electrically connected to a positive electrode of the secondary battery; and the measurement circuit has a function of measuring impedance of the secondary battery by measuring current of the resistor.

15 Claims, 29 Drawing Sheets

(58) Field of Classification Search
USPC ............................................................ 429/93
See application file for complete search history.

(56) References Cited

U.S. PATENT DOCUMENTS

| | | | |
|---|---|---|---|
| 7,395,163 B1 | 7/2008 | Morrison et al. | |
| 7,619,390 B2 | 11/2009 | Kim | |
| 8,150,643 B1 | 4/2012 | Morrison et al. | |
| 8,352,204 B2 | 1/2013 | Morrison et al. | |
| 8,471,526 B2 | 6/2013 | Kanno | |
| 8,749,204 B2 | 6/2014 | Majima et al. | |
| 8,762,109 B2 | 6/2014 | Christophersen et al. | |
| 8,868,363 B2 | 10/2014 | Morrison et al. | |
| 9,214,825 B2 | 12/2015 | Sun et al. | |
| 9,236,755 B2 | 1/2016 | Chang | |
| 9,244,130 B2 | 1/2016 | Morrison et al. | |
| 9,791,518 B2 | 10/2017 | Aoki et al. | |
| 9,851,414 B2 | 12/2017 | Morrison et al. | |
| 10,103,412 B2 | 10/2018 | Li | |
| 10,379,168 B2 | 8/2019 | Christophersen et al. | |
| 10,534,038 B2 | 1/2020 | Tanaka et al. | |
| 10,741,834 B2 | 8/2020 | Zhang et al. | |
| 10,777,475 B2 | 9/2020 | Fukuchi | |
| 10,886,579 B2 | 1/2021 | Tanabe et al. | |
| 10,901,044 B2 | 1/2021 | Christophersen et al. | |
| 2002/0110736 A1 | 8/2002 | Kweon et al. | |
| 2003/0104279 A1 | 6/2003 | Miyazaki et al. | |
| 2004/0142241 A1 | 7/2004 | Nagayama | |
| 2006/0263690 A1 | 11/2006 | Suhara et al. | |
| 2007/0117014 A1 | 5/2007 | Saito et al. | |
| 2008/0241693 A1 | 10/2008 | Fukuchi et al. | |
| 2009/0087362 A1 | 4/2009 | Sun. et al. | |
| 2009/0104532 A1 | 4/2009 | Hosoya | |
| 2010/0086854 A1 | 4/2010 | Kumar et al. | |
| 2010/0247986 A1 | 9/2010 | Toyama et al. | |
| 2011/0267726 A1 | 11/2011 | Ikeuchi et al. | |
| 2011/0270559 A1 | 11/2011 | Christophersen et al. | |
| 2013/0052154 A1 | 2/2013 | Fujiki et al. | |
| 2013/0169212 A1 | 7/2013 | Sun et al. | |
| 2013/0307486 A1 | 11/2013 | Chang | |
| 2013/0323596 A1 | 12/2013 | Morita et al. | |
| 2014/0212759 A1 | 7/2014 | Blangero et al. | |
| 2015/0008364 A1 | 1/2015 | Endo | |
| 2016/0006032 A1 | 1/2016 | Paulsen et al. | |
| 2016/0013478 A1 | 1/2016 | Satow et al. | |
| 2016/0156032 A1 | 6/2016 | Lee et al. | |
| 2016/0254574 A1 | 9/2016 | Li | |
| 2016/0268601 A1 | 9/2016 | Paulsen et al. | |
| 2016/0276659 A1 | 9/2016 | Choi et al. | |
| 2017/0003354 A1* | 1/2017 | Morrison | G01R 31/3842 |
| 2018/0013130 A1 | 1/2018 | Ochiai et al. | |
| 2018/0145317 A1 | 5/2018 | Momma et al. | |
| 2018/0145368 A1 | 5/2018 | Ochiai et al. | |
| 2018/0337536 A1* | 11/2018 | Li | H02J 7/00 |
| 2019/0198944 A1 | 6/2019 | Tanabe et al. | |
| 2019/0245199 A1 | 8/2019 | Zeng et al. | |
| 2020/0176770 A1 | 6/2020 | Takahashi et al. | |
| 2020/0185697 A1* | 6/2020 | Kim | G01R 31/08 |
| 2020/0220173 A1 | 7/2020 | Jo et al. | |
| 2021/0083281 A1 | 3/2021 | Mikami et al. | |
| 2021/0141023 A1 | 5/2021 | Gunji | |
| 2021/0313571 A1 | 10/2021 | Momma et al. | |
| 2022/0131146 A1 | 4/2022 | Saito et al. | |
| 2022/0359870 A1 | 11/2022 | Mikami et al. | |
| 2025/0105282 A1 | 3/2025 | Liu et al. | |

FOREIGN PATENT DOCUMENTS

| | | |
|---|---|---|
| CN | 105655554 A | 6/2016 |
| CN | 107923945 A | 4/2018 |
| CN | 108614220 A | 10/2018 |
| CN | 105992956 B | 11/2018 |
| CN | 109962309 A | 7/2019 |
| CN | 112470019 A | 3/2021 |
| CN | 113140726 A | 7/2021 |
| EP | 1674979 A | 6/2006 |
| EP | 2618449 A | 7/2013 |
| EP | 2665152 A | 11/2013 |
| EP | 3051622 A | 8/2016 |
| EP | 3109655 A | 12/2016 |
| EP | 3832329 A | 6/2021 |
| JP | 2000-203842 A | 7/2000 |
| JP | 2002-216760 A | 8/2002 |
| JP | 2007-514148 | 5/2007 |
| JP | 2008-175556 A | 7/2008 |
| JP | 2010-066161 A | 3/2010 |
| JP | 2010-080407 A | 4/2010 |
| JP | 2010-220389 A | 9/2010 |
| JP | 2013-141395 A | 7/2013 |
| JP | 2013-243114 A | 12/2013 |
| JP | 2015-023729 A | 2/2015 |
| JP | 2015-099722 A | 5/2015 |
| JP | 2018-523814 | 8/2018 |
| JP | 2018-161048 A | 10/2018 |
| JP | 2019-114464 A | 7/2019 |
| KR | 2013-0078386 A | 7/2013 |
| KR | 2016-0048206 A | 5/2016 |
| KR | 2018-0015753 A | 2/2018 |
| TW | 201349721 | 12/2013 |
| TW | 201710702 | 3/2017 |
| WO | WO-2010/144834 | 12/2010 |
| WO | WO-2010/144857 | 12/2010 |
| WO | WO-2011/140123 | 11/2011 |
| WO | WO-2011/140131 | 11/2011 |
| WO | WO-2015/039584 | 3/2015 |
| WO | WO-2016/121151 | 8/2016 |
| WO | WO-2017/003917 | 1/2017 |
| WO | WO-2017/094185 | 6/2017 |
| WO | WO-2020/026888 | 2/2020 |

OTHER PUBLICATIONS

Zhang.J et al., "Trace doping of multiple elements enables stable battery cycling of LiCoO2 at 4.6 V", Nature Energy, Jun. 17, 2019, vol. 4, pp. 594-603.

Hirooka.M et al., "Improvement of float charge durability for LiCoO2 electrodes under high voltage and storage temperature by suppressing O1-Phase transition", Journal of Power Sources, Jul. 1, 2020, vol. 463, pp. 228127-1-228127-8, Elsevier.

Wang.L et al., "A Novel Bifunctional Self-Stabilized Strategy Enabling 4.6 V LiCoO2 with Excellent Long-Term Cyclability and High-Rate Capability", Adv. Sci. (Advanced Science), Apr. 24, 2019, vol. 6, No. 12, pp. 1900355-1-1900355-11.

Okumura.T et al., "Correlation of lithium ion distribution and X-ray absorption near-edge structure in O3- and O2-lithium cobalt oxides from first-principle calculation", J. Mater. Chem. (Journal of Materials Chemistry), 2012, vol. 22, pp. 17340-17348.

Yano.A et al., "LiCoO2 Degradation Behavior in the High-Voltage Phase Transition Region and Improved Reversibility with Surface Coating", J. Electrochem. Soc. (Journal of the Electrochemical Society), Nov. 12, 2016, vol. 164, No. 1, pp. A6116-A6122.

Wang.Z et al., "EELS analysis of cation valence states and oxygen vacancies in magnetic oxides", Micron, Oct. 1, 2000, vol. 31, No. 5, pp. 571-580, Elsevier.

Chung.K et al., "Structural Studies on the Effects of ZrO2 Coating on LiCoO2 during Cycling Using In Situ X-Ray Diffraction Technique", J. Electrochem. Soc. (Journal of the Electrochemical Society), Sep. 20, 2006, vol. 153, No. 11, pp. A2152-A2157.

(56)　　　　　References Cited

OTHER PUBLICATIONS

Chen.Z et al., "Staging Phase Transitions in LixCoO2", J. Electrochem. Soc. (Journal of the Electrochemical Society), Oct. 29, 2002, vol. 149, No. 12, pp. A1604-A1609.

Ohzuku.T et al., "Solid-State Redox Reactions of LiCoO2 (R-3m) for 4 Volt Secondary Lithium Cells", J. Electrochem. Soc. (Journal of the Electrochemical Society), Nov. 1, 1994, vol. 141, No. 11, pp. 2972-2977.

Zou.M et al., "Synthesis and Electrochemical Performance of High Voltage Cycling LiM0.05Co0.95O2 as Cathode Material for Lithium Rechargeable Cells", Electrochemical and Solid-State Letters, Apr. 26, 2004, vol. 7, No. 7, pp. A176-A179.

Kim. Y et al., "Suppression of Cobalt Dissolution from the LiCoO2 Cathodes with Various Metal-Oxide Coatings", J. Electrochem. Soc. (Journal of the Electrochemical Society), Nov. 5, 2003, vol. 150, No. 12, pp. A1723-A1725.

Liu.A et al., "Synthesis of Mg and Mn Doped LiCoO2 and Effects on High Voltage Cycling", J. Electrochem. Soc. (Journal of the Electrochemical Society), Jun. 2, 2017, vol. 164, No. 7, pp. A1655-A1664.

Shim.J et al., "Effects of MgO Coating on the Structural and Electrochemical Characteristics of LiCoO2 as Cathode Materials for Lithium Ion Battery", Chem. Mater. (Chemistry of Materials), Mar. 24, 2014, vol. 26, No. 8, pp. 2537-2543.

Wang.Z et al., "Mg doping and zirconium oxyfluoride coating co-modification to enhance the high-voltage performance of LiCoO2 for lithium ion battery", Journal of Alloys and Compounds, Oct. 5, 2014, vol. 621, pp. 212-219.

Shim.J et al., "Synergistic effects of coating and doping for lithium ion battery cathode materials: synthesis and characterization of lithium titanate-coated LiCoO2 with Mg doping", Electrochimica Acta, Nov. 11, 2015, vol. 186, pp. 201-208, Elsevier.

Taguchi.N et al., "Characterization of MgO-coated-LiCoO2 particles by analytical transmission electron microscopy", Journal of Power Sources, Aug. 10, 2016, vol. 328, pp. 161-166, Elsevier.

Amatucci.G et al., "CoO2, The End Member of the LixCoO2 Solid Solution", J. Electrochem. Soc. (Journal of the Electrochemical Society), Mar. 1, 1996, vol. 143, No. 3, pp. 1114-1123.

Qian.J et al., "Electrochemical surface passivation of LiCoO2 particles at ultrahigh voltage and its applications in lithium-based batteries", Nature Communications, Nov. 21, 2018, vol. 9, pp. 4918-1-4918-11.

Yin.R et al., "In Situ XRD Investigation and Thermal Properties of Mg Doped LiCoO2 for Lithium Ion Batteries", J. Electrochem. Soc. (Journal of the Electrochemical Society), Jan. 3, 2012, vol. 159, No. 3, pp. A253-A258.

Shao-horn. Y et al., "Probing Lithium and Vacancy Ordering in O3 Layered Lix CoO2 (x = 0.5) : An Electron Diffraction Study", J. Electrochem. Soc. (Journal of the Electrochemical Society), Feb. 6, 2003, vol. 150, No. 3, pp. A366-A373.

Kalluri.S et al., "Surface Engineering Strategies of Layered LiCoO2 Cathode Material to Realize High-Energy and High-Voltage Li-Ion Cells", Advanced Energy Materials, Oct. 12, 2016, vol. 7, No. 1, pp. 1601507-1-1601507-21.

Zhang.S et al., "Surface engineering of LiCoO2 by a multifunctional nanoshell for stable 4.6V electrochemical performance", Energy Storage Materials, Feb. 21, 2023, vol. 57, pp. 289-298.

Yano.A et al., "Capability and Reversibility of LiCoO2 during Charge/Discharge with O3/H1-3 Layered Structure Change", J. Electrochem. Soc. (Journal of the Electrochemical Society), May 11, 2021, vol. 168, No. 5, pp. 050517-1-050517-11.

International Search Report (Application No. PCT/IB2021/060484) Dated Feb. 8, 2022.

Written Opinion (Application No. PCT/IB2021/060484) Dated Feb. 8, 2022.

* cited by examiner

POWER STORAGE SYSTEM, VEHICLE, AND ELECTRONIC DEVICE

TECHNICAL FIELD

One embodiment of the present invention relates to a measurement circuit, a control system, and a power storage system. One embodiment of the present invention relates to a battery control circuit, a battery protection circuit, a power storage device, and an electric device. One embodiment of the present invention relates to a secondary battery. One embodiment of the present invention relates to a semiconductor device and an operation method of the semiconductor device.

Note that one embodiment of the present invention is not limited to the above technical field. The technical field of the invention disclosed in this specification and the like relates to an object or a method. Alternatively, one embodiment of the present invention relates to a process, a machine, manufacture, or a composition of matter. Thus, more specifically, examples of the technical field of one embodiment of the present invention disclosed in this specification include a display device, a light-emitting device, a power storage device, an imaging device, a memory device, a driving method thereof, and a manufacturing method thereof.

BACKGROUND ART

Power storage devices (also referred to as batteries or secondary batteries) have been utilized in a wide range of areas from small electronic devices to automobiles. As the application range of batteries expands, the number of applications each with a multi-cell battery stack where a plurality of battery cells are connected in series increases.

The power storage device is provided with a circuit for detecting an abnormality at charging and discharging, such as overdischarging, overcharging, overcurrent, or a short circuit. In such a circuit performing protection and control of a battery, data of a voltage, a current, and the like is obtained in order to detect the abnormality at charging and discharging. Also in such a circuit, stop of charging and discharging, cell balance, and the like are controlled on the basis of the observed data.

Patent Document 1 discloses a protection IC that functions as a battery protection circuit. Patent Document 1 discloses a protection IC that detects abnormality in charging and discharging by comparing, using a plurality of comparators provided inside, a reference voltage and a voltage of a terminal to which a battery is connected.

Patent Document 2 discloses a battery state detector that detects a micro-short circuit of a secondary battery and a battery pack incorporating the detector.

Patent Document 3 discloses a protection semiconductor device for protecting an assembled battery in which secondary battery cells are connected in series. Patent Document 4 discloses a device that detects an internal resistance value of a secondary battery.

Patent Document 5 describes a power MOSFET used in a semiconductor device that controls a battery.

REFERENCE

Patent Documents

[Patent Document 1] Specification of United States Patent Application Publication No. 2011-267726

[Patent Document 2] Japanese Published Patent Application No. 2010-66161

[Patent Document 3] Japanese Published Patent Application No. 2010-220389

[Patent Document 4] Japanese Published Patent Application No. 2008-175556

[Patent Document 5] PCT International Publication No. 2017/094185

SUMMARY OF THE INVENTION

Problems to be Solved by the Invention

An object of one embodiment of the present invention is to provide a novel power storage system, a novel secondary battery control system, a novel secondary battery measurement circuit, or the like. An object of one embodiment of the present invention is to provide a power storage system, a secondary battery control system, a secondary battery measurement circuit, or the like that consumes low power. An object of one embodiment of the present invention is to provide a power storage system, a secondary battery control system, a secondary battery measurement circuit, or the like that is highly integrated.

An object of one embodiment of the present invention is to provide a novel system, a novel measurement circuit, a novel battery control circuit, a novel battery protection circuit, a novel power storage device, a novel semiconductor device, a novel vehicle, a novel electronic device, or the like.

Note that the objects of one embodiment of the present invention are not limited to the objects listed above. The objects listed above do not preclude the existence of other objects. Note that the other objects are objects that are not described in this section and will be described below. The objects that are not described in this section are derived from the description of the specification, the drawings, and the like and can be extracted as appropriate from the above objects by those skilled in the art. Note that one embodiment of the present invention is to solve at least one of the objects listed above and the other objects.

Means for Solving the Problems

One embodiment of the present invention is a power storage system including a secondary battery and a measurement circuit, in which the measurement circuit includes a resistor, a capacitor, and an inductor; one terminal of the resistor is electrically connected to one electrode of the capacitor; the other terminal of the resistor is electrically connected to one terminal of the inductor; the one terminal of the inductor is electrically connected to one of a positive electrode and a negative electrode of the secondary battery; and the measurement circuit has a function of measuring impedance of the secondary battery by measuring current of the resistor.

One embodiment of the present invention is a power storage system including a secondary battery and a measurement circuit, in which the measurement circuit includes a resistor, a capacitor, and an inductor; one terminal of the resistor is electrically connected to one electrode of the capacitor; the other terminal of the resistor is electrically connected to one terminal of the inductor; the one terminal of the inductor is electrically connected to a positive electrode of the secondary battery; and the measurement circuit has a function of measuring impedance of the secondary battery by measuring current of the resistor.

One embodiment of the present invention is a power storage system including a secondary battery and a measurement circuit, in which the measurement circuit includes a resistor, a capacitor, and an inductor; one terminal of the resistor is electrically connected to one electrode of the capacitor; the other electrode of the capacitor is electrically connected to one terminal of the inductor; the one terminal of the inductor is electrically connected to one of a positive electrode and a negative electrode of the secondary battery; and the measurement circuit has a function of measuring impedance of the secondary battery by measuring current of the resistor.

One embodiment of the present invention is a power storage system including a secondary battery and a measurement circuit, in which the measurement circuit includes a resistor, a capacitor, and an inductor; one terminal of the resistor is electrically connected to one electrode of the capacitor; the other electrode of the capacitor is electrically connected to one terminal of the inductor; the one terminal of the inductor is electrically connected to a positive electrode of the secondary battery; and the measurement circuit has a function of measuring impedance of the secondary battery by measuring current of the resistor.

In the above structure, the power storage system preferably has a function of measuring the impedance while supplying charge current or discharge current to the secondary battery.

In the above structure, it is preferred that the other terminal of the inductor be electrically connected to a first circuit, and the first circuit have a function of controlling charging of the secondary battery.

In the above structure, the charge current is preferably supplied to the secondary battery from the first circuit through the inductor.

In the above structure, it is preferred that the measurement circuit have a function of applying voltage with an alternating component to the secondary battery, the measurement circuit have a function of sweeping a frequency of the alternating component, and the power storage system have a function of estimating a state of the secondary battery on the basis of correlation between the frequency and a value of the current of the resistor.

In the above structure, the power storage system preferably has a function of determining a charging condition of the secondary battery on the basis of the estimated state.

One embodiment of the present invention is a power storage system including a secondary battery and a measurement circuit, in which the measurement circuit includes a resistor, a capacitor, an inductor, and an alternating signal source; one terminal of the resistor is electrically connected to one electrode of the capacitor; the other terminal of the resistor is electrically connected to one terminal of the inductor; the one terminal of the inductor is electrically connected to one of a positive electrode and a negative electrode of the secondary battery; and the alternating signal source is electrically connected to the other electrode of the capacitor and the other of the positive electrode and the negative electrode of the secondary battery.

One embodiment of the present invention is a power storage system including a secondary battery and a measurement circuit, in which the measurement circuit includes a resistor, a capacitor, an inductor, and an alternating signal source; one terminal of the resistor is electrically connected to one electrode of the capacitor; the other terminal of the inductor is electrically connected to a positive electrode of the secondary battery;

and the alternating signal source is electrically connected to the other electrode of the capacitor and a negative electrode of the secondary battery.

One embodiment of the present invention is a power storage system including a secondary battery and a measurement circuit, in which the measurement circuit includes a resistor, a capacitor, an inductor, and an alternating signal source; one terminal of the resistor is electrically connected to one electrode of the capacitor; the other electrode of the capacitor is electrically connected to one terminal of the inductor; the one terminal of the inductor is electrically connected to one of a positive electrode and a negative electrode of the secondary battery; and the alternating signal source is electrically connected to the other terminal of the resistor and the other of the positive electrode and the negative electrode of the secondary battery.

One embodiment of the present invention is a power storage system including a secondary battery and a measurement circuit, in which the measurement circuit includes a resistor, a capacitor, an inductor, and an alternating signal source; one terminal of the resistor is electrically connected to one electrode of the capacitor; the other electrode of the capacitor is electrically connected to one terminal of the inductor; the one terminal of the inductor is electrically connected to a positive electrode of the secondary battery; and the alternating signal source is electrically connected to the other terminal of the resistor and a negative electrode of the secondary battery.

In the above structure, the power storage system preferably has a function of sweeping a frequency of a signal output from the alternating signal source and obtaining correlation between a current value of the resistor and the frequency.

In the above structure, the power storage system preferably has a function of estimating a state of the secondary battery on the basis of the correlation between the current value of the resistor and the frequency, and has a function of determining a charging condition of the secondary battery on the basis of the estimated state.

In the above structure, the current value of the resistor is preferably measured in a state where charge current or discharge current is supplied to the secondary battery.

The power storage system of one embodiment of the present invention preferably includes a temperature sensor.

One embodiment of the present invention is a vehicle including a power storage system included in any one of the above structures.

One embodiment of the present invention is an electronic device including a power storage system included in any one of the above structures.

Effect of the Invention

According to one embodiment of the present invention, a novel power storage system, a novel secondary battery control system, a novel secondary battery measurement circuit, or the like can be provided. According to one embodiment of the present invention, a power storage system, a secondary battery control system, a secondary battery measurement circuit, or the like that consumes low power can be provided. According to one embodiment of the present invention, a power storage system, a secondary battery control system, a secondary battery measurement circuit, or the like that is highly integrated can be provided.

According to one embodiment of the present invention, a novel system, a novel measurement circuit, a novel battery control circuit, a novel battery protection circuit, a novel power storage device, a novel semiconductor device, a novel vehicle, a novel electronic device, or the like can be provided.

Note that the effects of one embodiment of the present invention are not limited to the effects listed above. The effects listed above do not preclude the existence of other effects. The other effects are effects that are not described in this section and will be described below. The effects that are not described in this section are derived from the description of the specification, the drawings, or the like and can be extracted as appropriate from the description by those skilled in the art. Note that one embodiment of the present invention has at least one of the effects listed above and the other effects. Accordingly, one embodiment of the present invention does not have the effects listed above in some cases.

BRIEF DESCRIPTION OF THE DRAWINGS

FIG. 1A to FIG. 1D are circuit diagrams illustrating power storage systems of one embodiment of the present invention. FIG. 1E is a circuit diagram illustrating an example of a secondary battery.

MODE FOR CARRYING OUT THE INVENTION

Figure 2A:
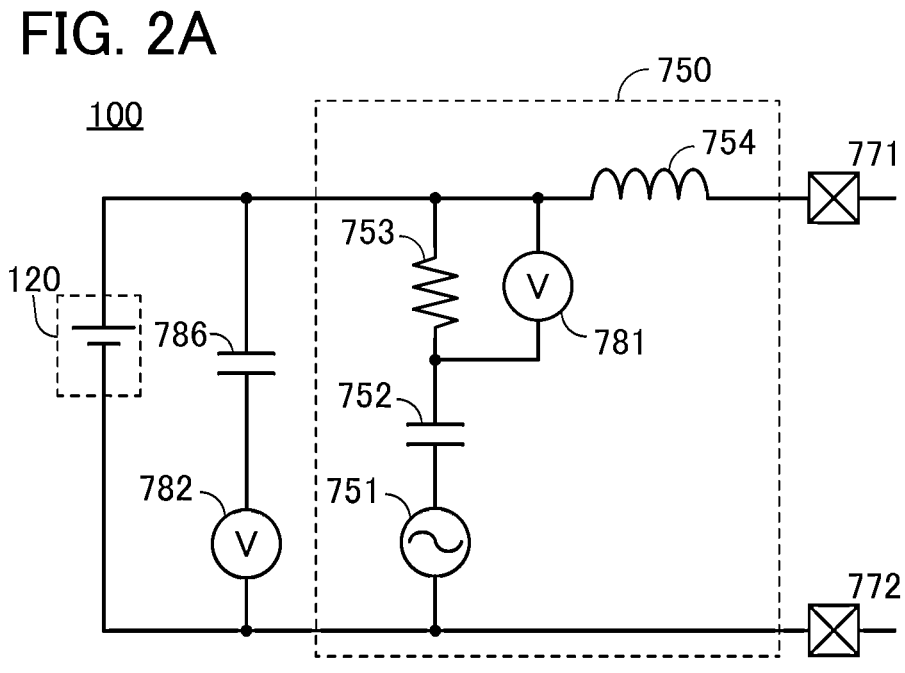
FIG. 2A and FIG. 2B are circuit diagrams illustrating power storage systems of one embodiment of the present invention.

Hereinafter, embodiments are described with reference to the drawings. Note that the embodiments can be implemented with many different modes, and it is readily understood by those skilled in the art that modes and details thereof can be changed in various ways without departing from the spirit and scope thereof. Thus, the present invention should not be construed as being limited to the following description of the embodiments.

Note that ordinal numbers such as "first", "second", and "third" in this specification and the like are used in order to avoid confusion among components. Thus, the ordinal numbers do not limit the number of components. In addition, the ordinal numbers do not limit the order of components. Furthermore, in this specification and the like, for example, a "first" component in one embodiment can be referred to as a "second" component in other embodiments or claims. Moreover, in this specification and the like, for example, a "first" component in one embodiment can be omitted in other embodiments or claims.

Note that in the drawings, the same elements, elements having similar functions, elements formed of the same material, elements formed at the same time, or the like are sometimes denoted by the same reference numerals, and repeated description thereof is omitted in some cases.

The position, size, range, and the like of each component illustrated in the drawings and the like are not accurately represented in some cases to facilitate understanding of the invention. Therefore, the disclosed invention is not necessarily limited to the position, size, range, and the like disclosed in the drawings and the like. For example, in the actual fabrication process, a resist mask or the like might be unintentionally reduced in size by treatment such as etching, which is not illustrated in some cases for easy understanding.

In a top view (also referred to as a plan view), a perspective view, and the like, some components might not be illustrated for easy understanding of the drawings.

In addition, in this specification and the like, the terms "electrode" and "wiring" do not functionally limit these components. For example, an "electrode" is used as part of a "wiring" in some cases, and vice versa. Furthermore, the terms "electrode" and "wiring" also include the case where a plurality of "electrodes" and a plurality of "wirings" are formed in an integrated manner, for example.

Furthermore, in this specification and the like, a "terminal" refers to a wiring or an electrode connected to a wiring in some cases, for example. Moreover, in this specification and the like, part of a "wiring" is referred to as a "terminal" in some cases.

Note that each of the terms "over" and "under" in this specification and the like does not necessarily mean that a component is placed directly over and in contact with or directly under and in contact with another component. For example, the expression "electrode B over insulating layer A" does not necessarily mean that the electrode B is formed on and in direct contact with the insulating layer A, and does not exclude the case where another component is provided between the insulating layer A and the electrode B.

Furthermore, functions of a source and a drain might be switched depending on operation conditions, e.g., when a transistor of opposite polarity is employed or a direction of current flow is changed in circuit operation. Therefore, it is difficult to define which is a source or a drain. Thus, the terms "source" and "drain" can be interchanged with each other in this specification.

In this specification and the like, the expression "electrically connected" includes the case where components are directly connected to each other and the case where components are connected through an "object having any electric function". Here, there is no particular limitation on the "object having any electric function" as long as electric signals can be transmitted and received between components that are connected through the object. Thus, even when the expression "electrically connected" is used, there is a case where no physical connection is made and a wiring just extends in an actual circuit.

In this specification and the like, "parallel" indicates a state where two straight lines are placed at an angle of greater than or equal to −10° and less than or equal to 10°, for example. Accordingly, the case where the angle is greater than or equal to −5° and less than or equal to 5° is also included. Moreover, "perpendicular" and "orthogonal" indicate a state where two straight lines are placed at an angle of greater than or equal to 80° and less than or equal to 100°, for example. Accordingly, the case where the angle is greater than or equal to 85° and less than or equal to 95° is also included.

In this specification and the like, the terms "identical", "the same", "equal", "uniform", and the like used in describing calculation values and actual measurement values allow for a margin of error of ±20% unless otherwise specified.

Furthermore, in this specification, in the case where an etching treatment is performed after a resist mask is formed, the resist mask is removed after the etching treatment, unless otherwise specified.

Note that voltage refers to a potential difference between a given potential and a reference potential (e.g., a ground potential or a source potential) in many cases. Therefore, the terms voltage and potential can be replaced with each other in many cases.

Note that a "semiconductor" has characteristics of an "insulator" when the conductivity is sufficiently low, for example. Thus, a "semiconductor" and an "insulator" can be replaced with each other. In that case, a "semiconductor" and an "insulator" cannot be strictly distinguished from each other because a border therebetween is not clear. Accordingly, a "semiconductor" and an "insulator" in this specification can be replaced with each other in some cases.

Furthermore, a "semiconductor" has characteristics of a "conductor" when the conductivity is sufficiently high, for example. Thus, a "semiconductor" and a "conductor" can be replaced with each other. In that case, a "semiconductor" and a "conductor" cannot be strictly distinguished from each other because a border therebetween is not clear. Accordingly, a "semiconductor" and a "conductor" in this specification can be replaced with each other in some cases.

Note that in this specification and the like, an "on state" of a transistor refers to a state in which a source and a drain of the transistor are regarded as being electrically short-circuited (also referred to as a "conduction state"). Furthermore, an "off state" of a transistor refers to a state in which a source and a drain of the transistor are regarded as being electrically disconnected (also referred to as a "non-conduction state").

In addition, in this specification and the like, an "on-state current" sometimes refers to a current that flows between a source and a drain when a transistor is in an on state. Furthermore, an "off-state current" sometimes refers to a current that flows between a source and a drain when a transistor is in an off state.

In this specification and the like, a high power supply potential VDD (hereinafter also simply referred to as "VDD" or an "H potential") is a power supply potential higher than a low power supply potential VSS. The low power supply potential VSS (hereinafter also simply referred to as "VSS" or an "L potential") is a power supply potential lower than the high power supply potential VDD. In addition, a ground potential can be used as VDD or VSS. For example, in the case where VDD is the ground potential, VSS is a potential lower than the ground potential, and in the case where VSS is the ground potential, VDD is a potential higher than the ground potential.

In this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or the whole of a source region, a source electrode, and a source wiring. A source region refers to a region in a semiconductor layer where the resistivity is lower than or equal to a given value. A source electrode refers to part of a conductive layer which is connected to a source region. A source wiring refers to a wiring for electrically connecting at least one source electrode of a transistor to another electrode or another wiring.

Moreover, in this specification and the like, a drain refers to part or all of a drain region, a drain electrode, or a drain wiring. A drain region refers to a region in a semiconductor layer where the resistivity is lower than or equal to a given value. A drain electrode refers to part of a conductive layer which is connected to a drain region. A drain wiring refers to a wiring for electrically connecting at least one drain electrode of a transistor to another electrode or another wiring.

Embodiment 1

In this embodiment, a measurement circuit, a control system, and a power storage system of one embodiment of the present invention will be described.

Figures 1A, 1B, 1C, 1D, 1E:
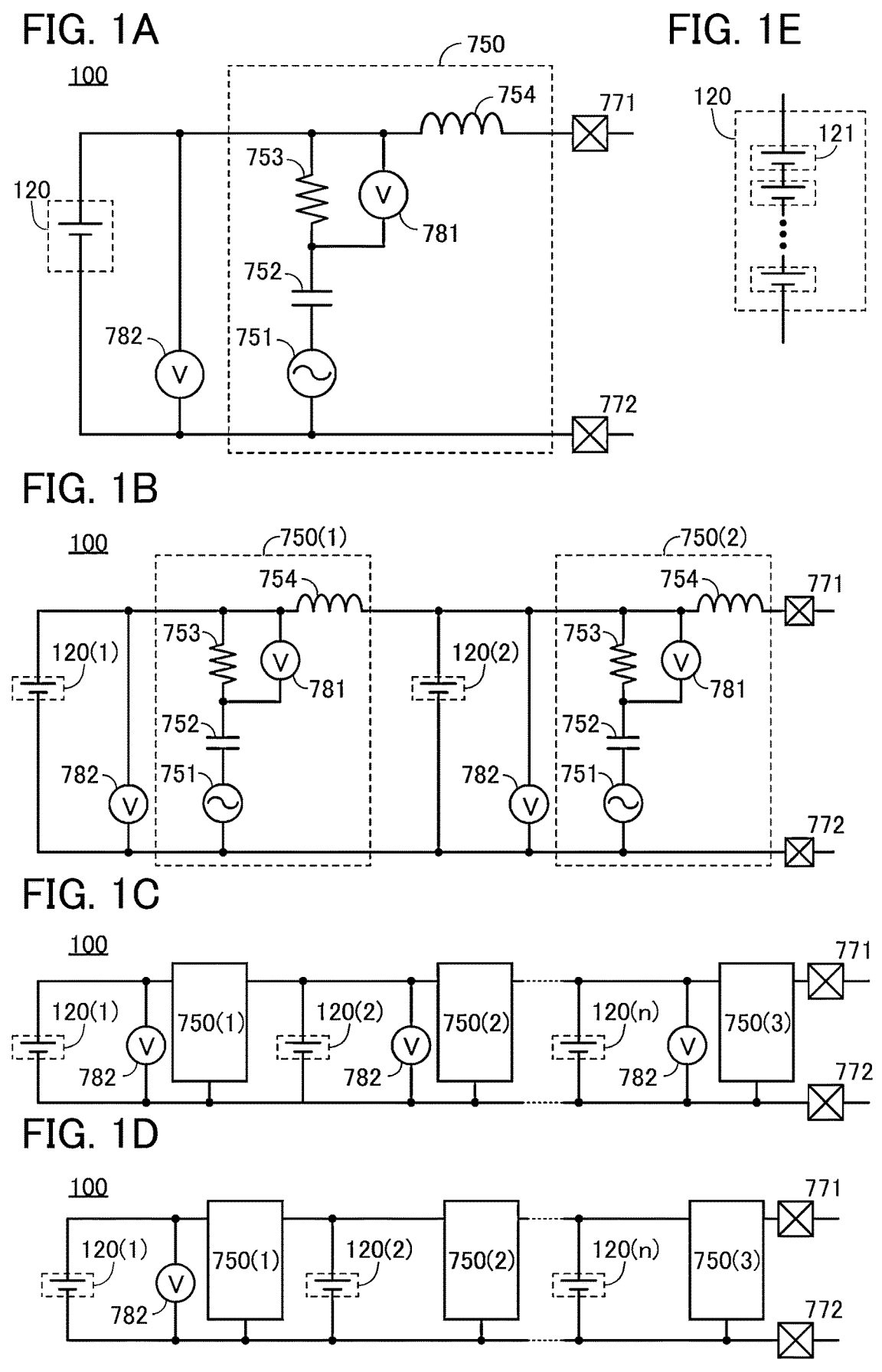

FIG. 1A illustrates an example of the power storage system of one embodiment of the present invention including the measurement circuit.

A power storage system 100 illustrated in FIG. 1A includes a measurement circuit 750 and a secondary battery 120 electrically connected to the measurement circuit 750. In FIG. 1A, the measurement circuit 750 is electrically connected to a terminal 771 and a terminal 772. In FIG. 1A, the secondary battery 120 is electrically connected to a voltmeter 782. The voltmeter 782 is connected in parallel to the secondary battery 120, and has a function of measuring the voltage of the secondary battery 120.

A variety of power storage devices can be used as the secondary battery 120. For example, a lithium-ion secondary battery can be used as the secondary battery 120.

Alternatively, an assembled battery in which a plurality of battery cells 121 are connected in series can be used as the secondary battery 120, as illustrated in FIG. 1E. The plurality of battery cells connected in series are made as one assembled battery and the measurement circuit 750 is connected to both ends of the assembled battery, whereby measurement can be performed by the measurement circuit 750. Note that the measurement circuit 750 may be connected to ends of each of the plurality of battery cells 121 connected in series to perform measurement. A variety of power storage devices can be used as the battery cells 121. For example, lithium-ion secondary batteries can be used as the battery cells 121.

The measurement circuit 750 can measure parameters for estimating the state of the secondary battery 120. For example, the measurement circuit 750 can obtain the frequency characteristics of the secondary battery 120. Furthermore, the measurement circuit 750 can measure the impedance of the secondary battery 120, for example.

The measurement circuit 750 preferably supplies an alternating signal to the secondary battery 120 to obtain the relationship between the frequency of the alternating signal and current flowing in the secondary battery 120. It is preferred that the measurement circuit 750 can extract a component within a specific frequency range from the current flowing in the secondary battery 120.

The measurement circuit 750 includes an alternating signal source, a capacitor, a resistor, and the like. The measurement circuit 750 illustrated in FIG. 1A includes an alternating signal source 751, a capacitor 752, a resistor 753, an inductor 754, and a voltmeter 781. In FIG. 1A, a negative electrode of the secondary battery 120 is electrically connected to the terminal 772 and one terminal of the alternating signal source 751. The other terminal of the alternating signal source 751 is electrically connected to one terminal of the capacitor 752. The other terminal of the capacitor 752 is electrically connected to one terminal of the resistor 753. The other terminal of the resistor 753 is electrically connected to a positive electrode of the secondary battery 120 and one terminal of the inductor 754. The other terminal of the inductor 754 is electrically connected to the terminal 771.

The measurement circuit 750 has a function of changing the frequency of an alternating signal output from the alternating signal source 751 to analyze the dependence of current flowing in the resistor 753 on the frequency. The current flowing in the resistor 753 can be determined from the voltage of the voltmeter 781 connected in parallel to the resistor 753, for example.

The measurement circuit 750 has a function of supplying a signal having an alternating component to the secondary battery 120. For example, the measurement circuit 750 has a function of superimposing a low-amplitude alternating voltage signal on the voltage of the secondary battery. In the measurement circuit 750, the alternating signal source 751 can output a first alternating voltage signal. The measurement circuit 750 can superimpose a second alternating voltage signal, which is a low-amplitude alternating voltage signal having a varied frequency, on the voltage of the secondary battery by changing the frequency of the first alternating voltage signal. The frequency of the second alternating voltage signal corresponds to the frequency of the first alternating voltage signal, for example. The second alternating signal to be superimposed on the secondary battery preferably has a frequency higher than or equal to 0.01 Hz and lower than or equal to 1 MHz. For example, two or more frequencies within the range higher than or equal to 0.01 Hz and lower than or equal to 1 MHz are selected, and currents in the resistor 753 of the case where alternating signals with the selected frequencies are superimposed on the voltage of the secondary battery are determined. At least one of the frequencies of the alternating signals to be superimposed is preferably selected within the range higher than or equal to 0.01 Hz and lower than or equal to 0.5 Hz.

The current flowing in the resistor 753 changes in accordance with the internal impedance of the secondary battery 120. The measurement circuit 750 has a function of evaluating the internal impedance of the secondary battery 120 by measuring the current flowing in the resistor 753.

The amplitude of the low-amplitude alternating voltage signal which is superimposed by the measurement circuit 750 on the voltage of the secondary battery is preferably higher than or equal to 0.00025 times and lower than or equal to 0.0125 times the voltage at the ends of the secondary battery 120, for example. In the case where one lithium-ion secondary battery is used as the secondary battery 120, the amplitude of the alternating signal is preferably higher than or equal to 1 mV and lower than or equal to 50 mV, for example. Although it depends on the type and structure of the battery, the alternating current that can be obtained when an alternating voltage signal with 10 mV is input, for example, is approximately 10 μA. This current value is preferable because it can be measured.

The terminal 771 is electrically connected to the positive electrode of the secondary battery 120 via the inductor 754. In the case where the secondary battery 120 is formed of n battery cells 121 connected in series sequentially from a first battery cell 121 and a negative electrode of the first battery cell 121 is connected to a positive electrode of a second battery cell 121, the terminal 771 is electrically connected to a positive electrode of the first battery cell 121 via the inductor 754. The inductor is referred to as a coil, a reactor, or the like, in some cases.

The terminal 771 is electrically connected to a circuit, an electronic device, a moving object, or the like to which the output from the secondary battery is applied. The discharge current of the secondary battery 120 is output from the terminal 771 through the inductor 754. At least one of a discharge protection circuit 703, a selection circuit 704, an output control circuit 705, and an output protection circuit 706 described later is preferably provided between the terminal 771 and an object to which the output of the secondary battery is applied.

Charge current is supplied to the secondary battery from the terminal 771 through the inductor 754.

The terminal 772 is electrically connected to the negative electrode of the secondary battery. In the case where the secondary battery 120 is formed of n battery cells 121 connected in series sequentially from the first battery cell 121 and the negative electrode of the first battery cell 121 is connected to the positive electrode of the second battery cell 121, the terminal 772 is electrically connected to a negative electrode of an n-th battery cell 121.

In FIG. 1A, one electrode of the inductor 754 is electrically connected to the terminal 771 and the other electrode is electrically connected to the positive electrode of the secondary battery 120. The terminal 772 is electrically connected to the negative electrode of the secondary battery 120. The other electrode of the inductor 754 and the terminal 772 may each be connected to a potential obtained by resistive division of the potential between the positive electrode and the negative electrode of the secondary battery.

The capacitor 752 has a function of interrupting direct current supplied from the secondary battery 120 to the terminal 771 and direct current supplied from the terminal 771 to the secondary battery such that the direct current does not flow through the resistor 753. Furthermore, the capacitor 752 has a function of passing alternating current.

In the measurement circuit 750, the inductor 754 can function as a low-pass filter that interrupts a signal with a high frequency and passes a signal with a low frequency. Owing to the inductor 754 and the like included in the measurement circuit 750, the alternating signal output from the alternating signal source 751 can be inhibited from being output through the terminal 771, for example.

The measurement circuit of one embodiment of the present invention can obtain parameters for estimating the state of the secondary battery 120 without interrupting discharge current supplied from the secondary battery 120 to the terminal 771 or with an extremely small influence on the discharge current. With the use of the measurement circuit of one embodiment of the present invention, parameters for estimating the state of the secondary battery 120 can be obtained while discharge current is supplied from the secondary battery 120 to the terminal 771. Furthermore, the measurement circuit of one embodiment of the present invention can obtain parameters for estimating the state of the secondary battery 120 while charge current is supplied from the terminal 771 to the secondary battery 120.

Examples of the parameters for estimating the state of the secondary battery 120 include temperature, battery voltage or the state of charge (SOC), charge current, and discharge current. It is preferred that these parameters be linked to time to be obtained. When the parameters linked to time are obtained, the state of the secondary battery 120 can be estimated by comparison with the value before a certain time. As an arithmetic method for the estimation, any of a variety of machine learning methods can be used, for example. The machine learning can be performed using a neural network, for example.

In particular, the measurement circuit of one embodiment of the present invention can obtain a value corresponding to the internal impedance of the secondary battery by obtaining current characteristics with respect to the alternating signal.

The voltmeter 781 is electrically connected to both ends of the resistor 753, and has a function of measuring the voltage of the resistor 753. The measurement of the voltage of the resistor 753 allows detection of current flowing in the resistor 753.

Voltage determined by the alternating signal output from the alternating signal source 751, voltage corresponding to the difference between the potentials of the ends of the capacitor 752, and voltage corresponding to the difference between the potentials of the ends of the resistor 753 is applied to both ends of the secondary battery 120. The amount of current flowing in the secondary battery 120 corresponds to the amount of current flowing in the resistor 753 and the amount of current flowing in the inductor 754.

The inductor 754 can restrict the alternating component of a signal. For example, the inductor 754 can restrict an alternating signal or the like output from the alternating signal source 751. Accordingly, when the inductor 754 is provided, an alternating signal or the alternating component of the signal can be inhibited from being supplied to a circuit or the like connected to the terminal 771. Examples of the circuit or the like connected to the terminal 771 include a charging circuit and a load. Examples of the load include an electronic device and a moving object that are driven by electric power from the power storage system of one embodiment of the present invention. Accordingly, the measurement instrument of one embodiment of the present invention can perform a diagnosis of the secondary battery while driving by electric power from the power storage system and charging of the power storage system are performed.

When the capacitor 752 and the resistor 753 are connected in series, the direct-current component of the current flowing in the resistor 753 can be restricted. Thus, when the capacitor 752 is provided, the measurement instrument of one embodiment of the present invention can reduce the influences of the direct current output from the secondary battery 120 and the direct current input from the charging circuit. Accordingly, the measurement instrument of one embodiment of the present invention can perform a diagnosis of the secondary battery while driving by electric power from the power storage system and charging of the power storage system are performed.

In other words, the measurement instrument of one embodiment of the present invention can perform real-time measurement in a state where the power storage system is in operation.

The power storage system 100 illustrated in FIG. 1B includes two secondary batteries 120 (hereinafter referred to as a secondary battery 120(1) and a secondary battery 120(2)), two measurement circuits 750, and two voltmeters 782. The measurement circuit 750 provided between the secondary battery 120(1) and the secondary battery 120(2) is referred to as a measurement circuit 750(1) and the other is referred to as a measurement circuit 750(2).

One terminal of the inductor 754 included in the measurement circuit 750(1) is electrically connected to a positive electrode of the secondary battery 120(1), and the other terminal is electrically connected to a positive electrode of the secondary battery 120(2). The inductor 754 included in the measurement circuit 750(1) can inhibit an alternating signal output from the alternating signal source 751 included in the measurement circuit 750(1) from being supplied to the secondary battery 120(2). Accordingly, the measurement circuit 750(1) can perform a diagnosis of the secondary battery 120(1) with a reduced influence of the secondary battery 120(2). Furthermore, the measurement circuit 750(2) can perform a diagnosis of the secondary battery 120(2) with a reduced influence of the secondary battery 120(1).

In the power storage system 100 illustrated in FIG. 1B, a diagnosis of each of the two secondary batteries 120 connected in parallel to each other with the inductor of the measurement circuit 750 positioned therebetween can be performed using the corresponding measurement circuit 750.

The number of secondary batteries 120 connected in parallel to each other is not limited to two; n secondary batteries 120 may be connected in parallel to one another with the measurement circuits 750 positioned therebetween as illustrated in FIG. 1C and a diagnosis of each of the secondary batteries may be performed.

Alternatively, a structure illustrated in FIG. 1D may be employed in which the number of the voltmeters 782 having a function of measuring the voltages of the secondary batteries 120 is one and does not match the number of the secondary batteries 120.

As illustrated in FIG. 2A, the voltage of the secondary battery 120 measured by the voltmeter 782 may be measured via a capacitor 786 in the measurement circuit 750. In the structure illustrated in FIG. 2A, the capacitor 786 and the voltmeter 782 are connected in series between the positive electrode and the negative electrode of the secondary battery 120. One terminal of the capacitor 786 is electrically connected to the positive electrode of the secondary battery 120, and the other terminal is electrically connected to the voltmeter 782.

Figure 2B:
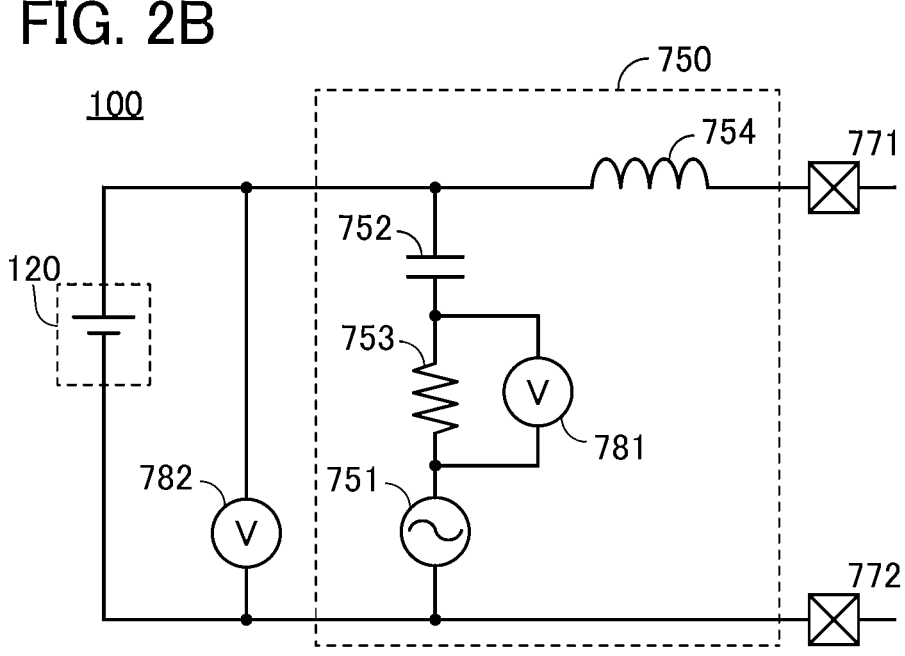

Alternatively, the resistor 753 may be provided between the alternating signal source 751 and the capacitor 752 as illustrated in FIG. 2B to detect current between the alternating signal source and the capacitor.

Figure 3A:
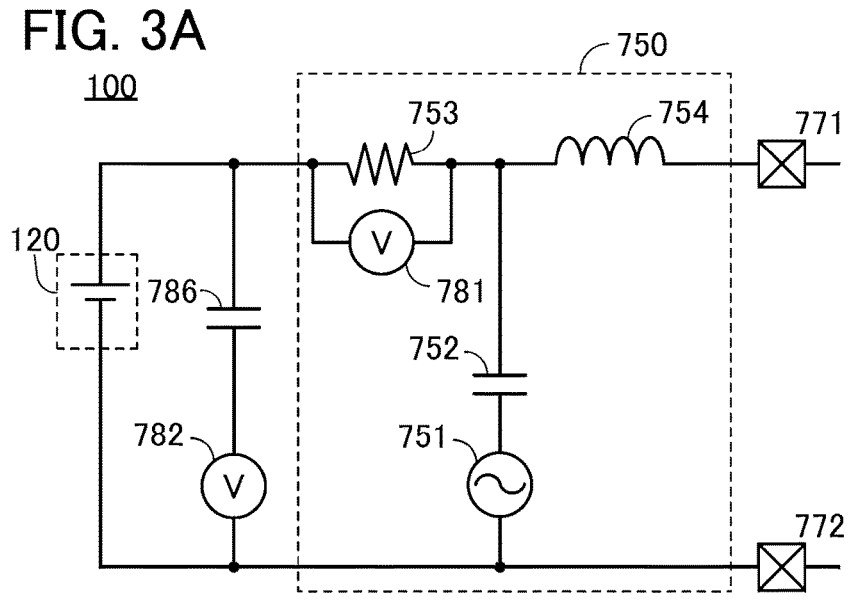
FIG. 3A to FIG. 3C are circuit diagrams illustrating power storage systems of one embodiment of the present invention.

Although FIG. 2A illustrates an example where the resistor 753 is provided between the positive electrode of the secondary battery 120 and the capacitor 752, a structure illustrated in FIG. 3A may be employed in which one terminal of the resistor 753 is electrically connected to the positive electrode of the secondary battery 120 and the other terminal is electrically connected to one terminal of the inductor 754. Such a structure enables measurement of the charge current and discharge current of the secondary battery 120 with the use of the resistor 753. Meanwhile, the accuracy of the diagnosis of the state of the secondary battery is higher in each of the structures illustrated in FIG. 1A, FIG. 2A, and FIG. 2B than in the structure illustrated in FIG. 3A.

Figure 3B:
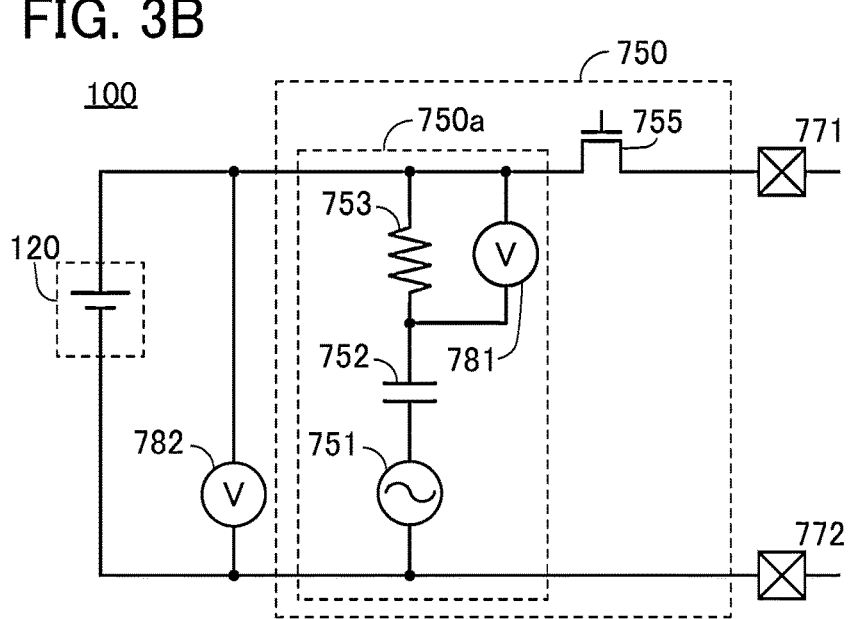

As illustrated in FIG. 3B, a structure in which a switch 755 is provided instead of the inductor 754 may be employed. FIG. 3B illustrates an example where a transistor is provided as the switch. In the measurement circuit 750 illustrated in FIG. 3B, a portion formed of the alternating signal source 751, the capacitor 752, the resistor 753, and the voltmeter 781 is referred to as a circuit 750a. The measurement circuit 750 illustrated in FIG. 3B includes the circuit 750a and the switch 755.

Figure 3C:
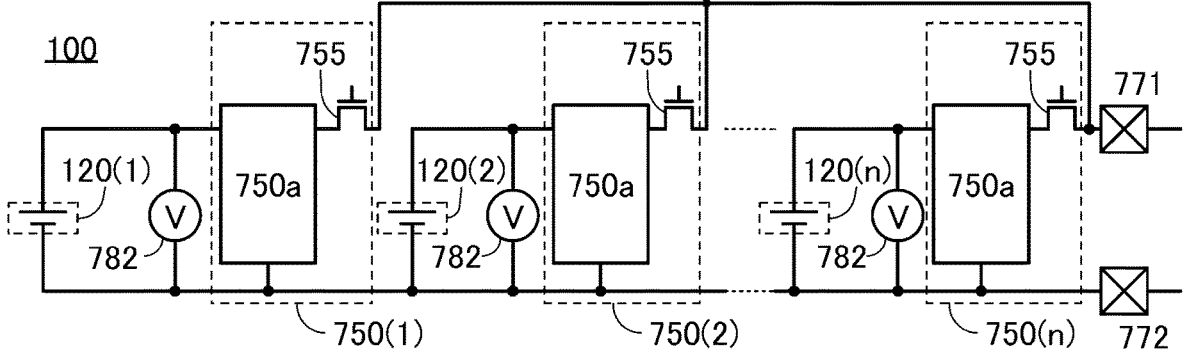

The power storage system 100 illustrated in FIG. 3C has a structure in which n measurement circuits 750 each of which is illustrated in FIG. 3B are provided and connected to their respective n secondary batteries 120. When the switches 755 in all of the measurement circuits 750 are brought into off states at the same time, power supply from the power storage system 100 is stopped. Thus, it is preferred that the switch 755 in at least one of the measurement circuits 750 be brought into an on state. When a wiring serving as a bypass is provided as illustrated in FIG. 3C, electric power can be supplied not from the secondary battery 120 connected to the measurement circuit 750 in which the switch 755 is in an off state but from the secondary battery 120 connected to another measurement circuit 750 via the bypass, in which case interruption of a current path between the terminal 771 and the positive electrode of the secondary battery 120 can be prevented.

Note that a structure in which the alternating signal source 751 is not provided in the power storage system 100 may be employed. In the case where the structure in which the alternating signal source 751 is not provided is employed, a switch or a circuit including a switch is provided instead of the alternating signal source; a step function with a rectangular wave or the like is generated by turning the switch on and off and current change over time is obtained, whereby step response characteristics can be examined. In the case of using a switch or a circuit including a switch instead of the alternating signal source, a voltage drop due to the internal resistance of the secondary battery occurs when the switch is brought into an off state at the time of charging of the secondary battery. Analysis using this voltage drop as a step function signal can be performed. The step function signal may be generated using a signal source. As the step function, a triangle wave, a sawtooth wave, or the like can be used. A transfer function can be obtained using the waveform of the input voltage and the waveform of the output current. The transfer function can be obtained as a function of a complex number s. By substitution of $j\omega$ as the complex number s, AC frequency characteristics can be obtained.

A signal used for charging of the secondary battery is not necessarily a continuous signal and may be an intermittent signal. For example, a pulse signal may be used for the charging. Alternatively, a pulse signal may be used in combination with continuous constant current. In the case of using a pulse signal for the charging, the inductor 754 is not provided.

When a pulse signal is used and current flowing in the secondary battery is analyzed in charging, the internal impedance of the secondary battery can be measured.

Figure 4A:
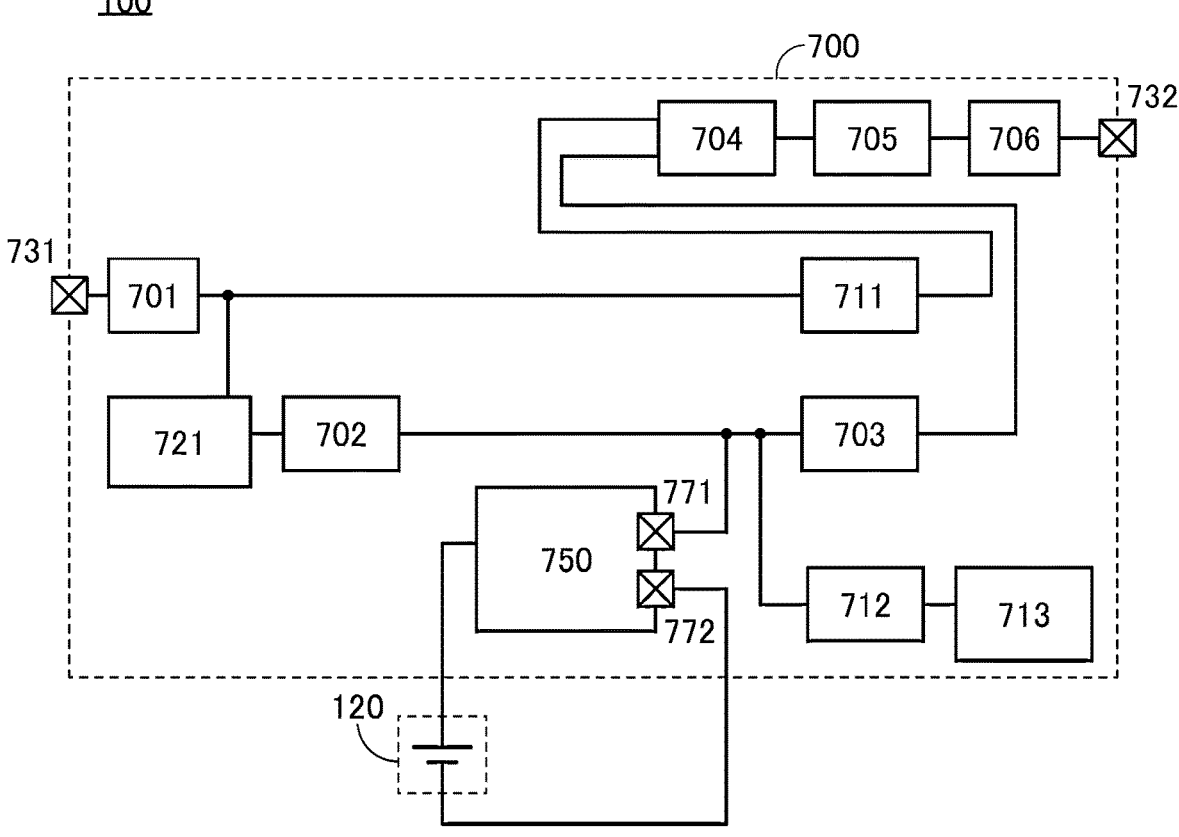
FIG. 4A and FIG. 4B are circuit diagrams illustrating power storage systems of one embodiment of the present invention.

FIG. 4A illustrates a power storage system of one embodiment of the present invention.

Figure 4B:
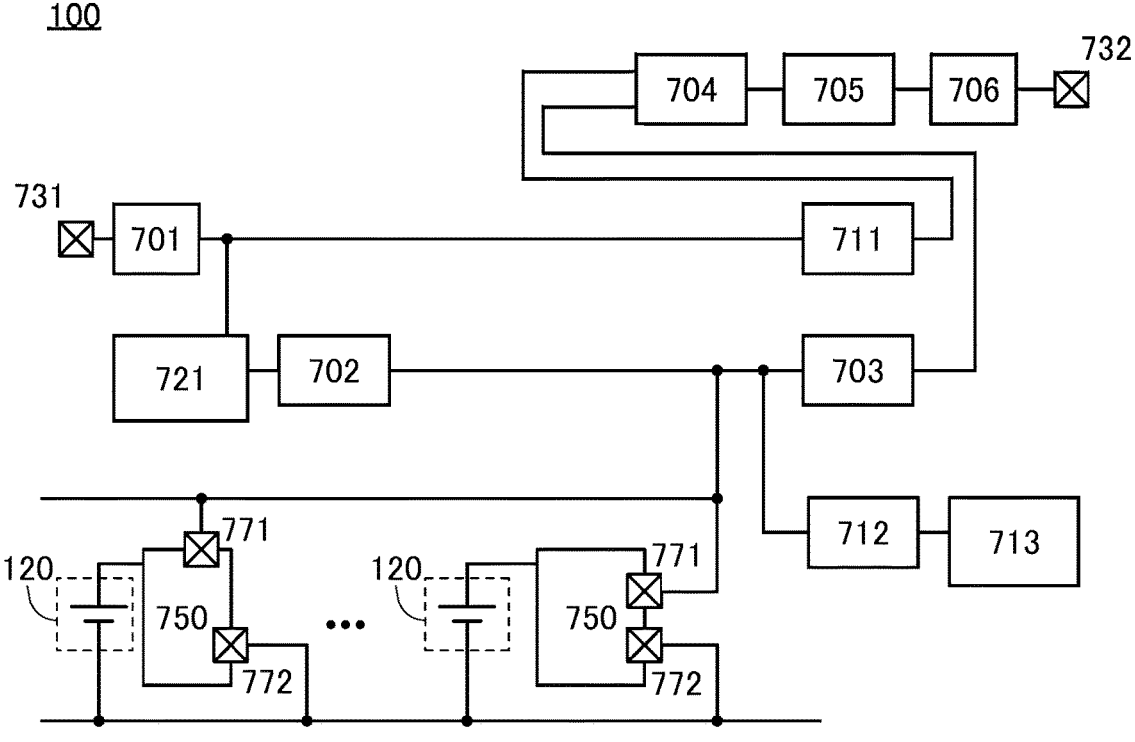

The power storage system 100 illustrated in FIG. 4A includes a control system 700 and the secondary battery 120. The control system 700 includes the measurement circuit 750. The control system 700 is electrically connected to the secondary battery 120. The control system 700 may include a plurality of the measurement circuits 750. The plurality of measurement circuits 750 included in the control system 700 have functions of estimating the states of their respective secondary batteries 120, for example. FIG. 4B illustrates an example where the plurality of measurement circuits 750 are electrically connected to their respective secondary batteries 120 in the power storage system 100.

The control system 700 includes an input terminal 731, an output terminal 732, an input protection circuit 701, a charge protection circuit 702, the discharge protection circuit 703, the selection circuit 704, the output control circuit 705, the output protection circuit 706, a potential adjustment circuit 711, a power supply generation circuit 712, and a control circuit 713. The control system 700 preferably includes a charge control circuit 721.

The power storage system 100 preferably includes a temperature sensor.

In FIG. 4A, the terminal 771 included in the measurement circuit 750 is connected to the charge protection circuit 702, the discharge protection circuit 703, and the power supply generation circuit 712. In FIG. 4B, the terminal 771 of each of the plurality of measurement circuits 750 is connected to the charge protection circuit 702, the discharge protection circuit 703, and the power supply generation circuit 712.

An input signal is supplied to the input terminal 731. The control system 700 may include a plurality of input terminals.

A direct signal and an alternating signal are supplied to the input terminal 731, for example. In the case where an alternating signal is supplied to the input terminal 731, a circuit having a function of converting the supplied alternating signal into a direct signal is preferably provided in the control system 700.

The input protection circuit 701 has a function of inhibiting breakdown of a circuit inside the control system 700 when static electricity, overvoltage, overcurrent, or the like is applied to the input terminal 731.

The output protection circuit 706 has a function of inhibiting overvoltage, overcurrent, or the like from being output from the output terminal 732 to a circuit or a device outside the control system 700.

Each of the input protection circuit 701 and the output protection circuit 706 is preferably formed using a nonlinear element.

The charge protection circuit 702 has a function of detecting overcharging of the secondary battery 120. Furthermore, the charge protection circuit 702 has a function of detecting charge overcurrent of the secondary battery 120.

The discharge protection circuit 703 has a function of detecting overdischarging of the secondary battery 120. Furthermore, the discharge protection circuit 703 has a function of detecting discharge overcurrent of the secondary battery 120.

The detection of overcharging, overdischarging, charge overcurrent, and discharge overcurrent can be performed using a comparator. A hysteresis comparator may be used as the comparator. The comparison results of the comparator are supplied to the control circuit 713, for example. The control circuit 713 generates, on the basis of the comparison results of the comparator, a signal for interrupting the charge current to the secondary battery 120, interrupting the discharge current from the secondary battery 120, or changing the charging conditions of the secondary battery 120, for example. The control circuit 713 can supply a signal for changing the charging conditions to the charge control circuit 721 on the basis of the comparison results of the comparator, for example.

The charge control circuit 721 has a function of changing the charging conditions on the basis of a value measured by the measurement circuit of one embodiment of the present invention. The charge control circuit 721 may have a function of stopping charging.

The charge control circuit 721 has a function of changing end-of-charge voltage in accordance with the internal resistance of the secondary battery 120 measured by the measurement circuit 750, for example.

In the case where deterioration of the secondary battery 120 is determined to be little from the result of the diagnosis using the internal impedance, for example, the charge control circuit 721 increases the end-of-charge voltage. The increased end-of-charge voltage can result in an increase in electric power supplied from the power storage system 100. When the end-of-charge voltage is increased, overcharging detection voltage is changed as necessary.

Furthermore, end-of-discharge voltage can be decreased in accordance with the result of the diagnosis using the internal impedance, for example. When the end-of-discharge voltage is decreased, overdischarging detection voltage is changed as necessary.

In the case where the result of the diagnosis using the internal resistance shows high internal resistance, which indicates the deterioration of the secondary battery 120, for example, the charge control circuit 721 decreases the end-of-charge voltage. When the end-of-charge voltage is decreased, the lifetime of the power storage system 100 can be increased. Alternatively, the safety can be improved. When the end-of-charge voltage is decreased, the overcharging detection voltage is preferably decreased.

Since the measurement circuit of one embodiment of the present invention can be formed with a simple circuit configuration, the state of the secondary battery can be easily obtained. Furthermore, the measurement circuit of one embodiment of the present invention can obtain the state of the secondary battery while the secondary battery is used, for example, while charging or discharging is performed. With the use of the measurement circuit of one embodiment of the present invention, the secondary battery can be used while being monitored; thus, deterioration or a sign of abnormality of the secondary battery can be detected quickly. When deterioration or a sign of abnormality of the secondary battery is detected, the power storage system of one embodiment of the present invention changes the charging conditions or discharging conditions of the secondary battery, so that deterioration of the secondary battery can be inhibited and the safety of the secondary battery can be increased.

The control system 700 preferably includes a current interruption element. A transistor can be used as the current interruption element; in particular, a power MOSFET can be suitably used. The control system 700 preferably interrupts the charge current to the secondary battery 120 and the discharge current from the secondary battery 120 using the current interruption element.

Figure 5A:
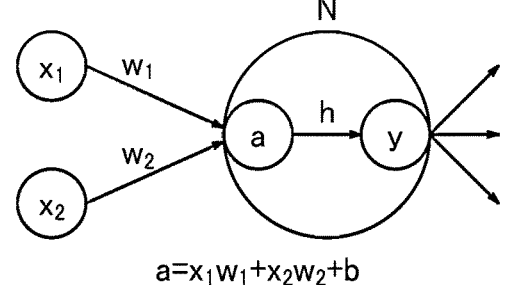
FIG. 5A and FIG. 5B are diagrams illustrating a structure example of a neural network.
Figure 5B:
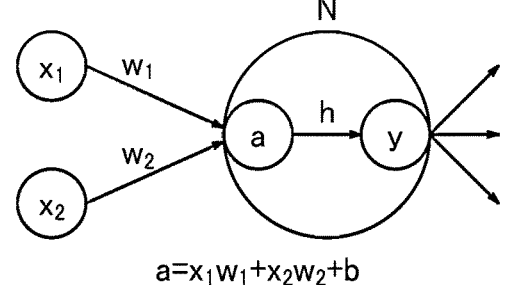
Figure 5D:
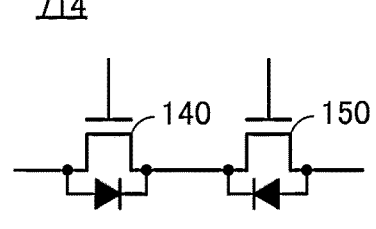
FIG. 5D is a diagram illustrating a configuration example of the switch portion.
Figure 5C:
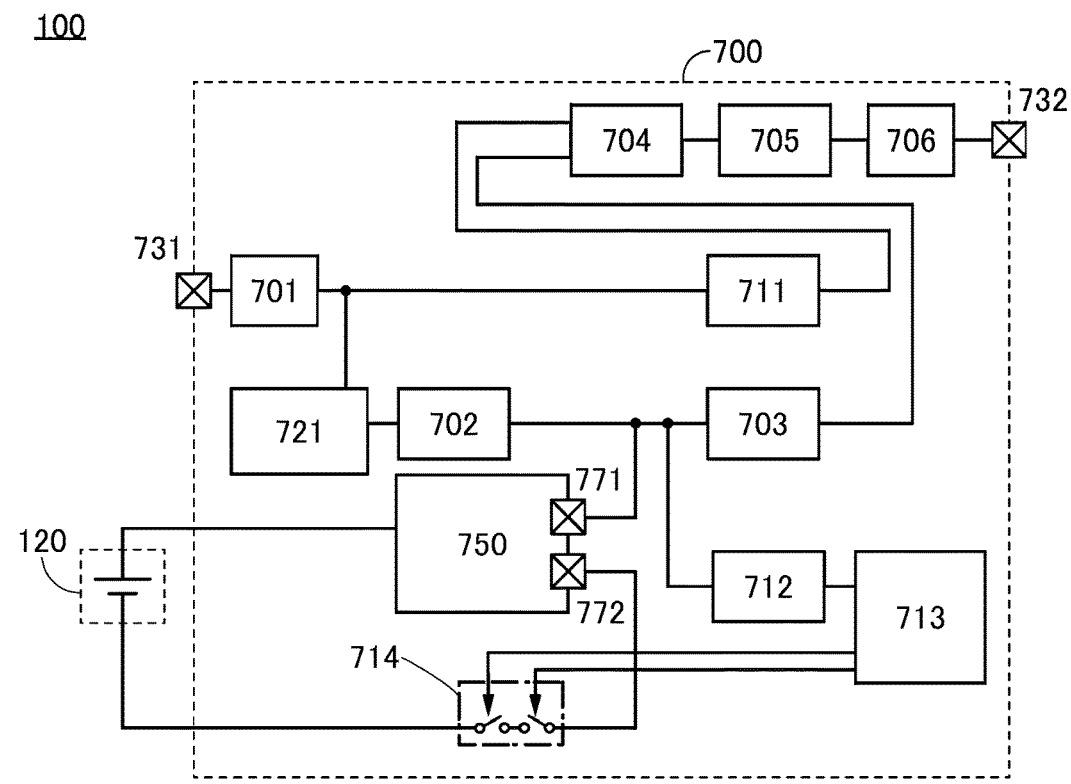
FIG. 5C is a diagram illustrating an example of a structure in which a control system includes a switch portion.

FIG. 5C illustrates an example of a structure in which the control system 700 includes a switch portion 714. A current interruption element can be used for the switch portion 714. The switch portion 714 can be composed of a combination of a plurality of current interruption elements. A transistor can be used as the current interruption element. As the transistor, each of an n-channel transistor and a p-channel transistor can be used. The switch portion 714 may be composed of a combination of a plurality of transistors, for example. For example, a plurality of n-channel transistors can be used in combination. Alternatively, a plurality of p-channel transistors can be used in combination. Alternatively, an n-channel transistor and a p-channel transistor can be used in combination.

As the current interruption element, a Si transistor containing single crystal silicon can be used. As the current interruption element, a power transistor containing Ge (germanium), SiGe (silicon germanium), GaAs (gallium arsenic), GaAlAs (gallium aluminum arsenic), InP (indium phosphide), SiC (silicon carbide), ZnSe (zinc selenide), GaN (gallium nitride), GaOx (gallium oxide, where x is a real number greater than 0), or the like can be used.

FIG. 5D illustrates a configuration example of the switch portion 714. The switch portion 714 illustrated in FIG. 5D includes a transistor 140 and a transistor 150. The transistor 140 and the transistor 150 are connected in series. A power transistor can be used as each of the transistor 140 and the transistor 150. The transistor 140 and the transistor 150 each include a parasitic diode. A signal from the control circuit 713 is supplied to each of a gate of the transistor 140 and a gate of the transistor 150. The directions of the parasitic diodes in the transistor 140 and the transistor 150 are different from each other.

The potential adjustment circuit 711 has a function of converting the voltage, the amplification, the frequency, and the like of a signal. For example, the potential adjustment circuit 711 can step down or boost a power supply potential supplied from the input terminal 731. A signal is supplied from the input terminal 731 through the input protection circuit 701 to the potential adjustment circuit 711, for example.

In the case where power from the outside of the power storage system 100 is supplied to the input terminal 731, for example, the potential adjustment circuit 711 adjusts the voltage of the supplied power such that the voltage becomes higher than voltage applied to the selection circuit 704 from the discharge protection circuit 703. The selection circuit 704 selects one signal with a higher voltage among a signal from the potential adjustment circuit 711 and a signal from the discharge protection circuit 703 and outputs the signal.

In the case where no power is supplied to the input terminal 731, the signal output from the potential adjustment circuit 711 is adjusted such that the signal becomes lower than the signal from the discharge protection circuit 703.

The selection circuit 704 has a function of selecting one of the signal supplied from the input terminal 731 through the potential adjustment circuit 711 and the signal supplied from the secondary battery 120 through the discharge protection circuit 703.

The output control circuit 705 can monitor a signal supplied from the selection circuit 704 to the output control circuit 705 and interrupt the output from the control system 700. The upper limit voltage, the lower limit voltage, the upper limit current, the lower limit current, or the like of the signal can be provided for the monitoring of the signal, for example. The output control circuit 705 may have a function of converting the voltage, the amplification, the frequency, and the like of the signal, for example.

Electric power is supplied from the output terminal 732 to a circuit, electronic device, and the like outside the power storage system 100. The power storage system 100 may include a plurality of output terminals.

The control circuit 713 has a function of supplying a signal to each of the circuits included in the power storage system 100. It is preferred that the control circuit 713 have a function of receiving measurement data of the measurement circuit 750, a function of analyzing the received data, and a function of supplying a signal to each of the circuits included in the power storage system 100 on the basis of the received data.

It is preferred that the control circuit 713 have a function of receiving measurement data such as the voltage, the current, or the like of a battery cell included in the secondary battery 120, a function of analyzing the received data, and a function of supplying a signal to each of the circuits included in the power storage system 100 on the basis of the received data.

The control circuit 713 preferably includes a CPU (Central Processing Unit), an MPU (Micro-processing Unit), or the like. The control circuit 713 may include a PLD (Programmable Logic Device) such as an FPGA (Field Programmable Gate Array).

The power supply generation circuit 712 has a function of generating a high potential signal, a constant potential signal, a ground signal, or the like to be supplied to the control circuit 713. The power supply generation circuit 712 has a function of generating a clock signal. The power supply generation circuit 712 has a function of generating an alternating signal.

The power supply generation circuit 712 has a function of supplying the generated alternating signal to the measurement circuit 750.

Alternatively, an alternating signal may be supplied to the measurement circuit 750 from a circuit outside the control system 700 through the input terminal 731.

The control system 700 preferably includes a memory unit. The memory unit can include a volatile memory, a nonvolatile memory, or the like. The memory unit preferably includes a nonvolatile memory.

The memory unit in the control system 700 may include a memory circuit including a transistor using an oxide semiconductor (an OS transistor).

A metal oxide functioning as an oxide semiconductor is preferably used. For example, as the metal oxide, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is used. In particular, the In-M-Zn oxide that can be used as the metal oxide is preferably a CAAC-OS (C-Axis Aligned Crystal Oxide Semiconductor) or a CAC-OS (Cloud-Aligned Composite Oxide Semiconductor). An In—Ga oxide or an In—Zn oxide may be used as the metal oxide. The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. Note that when an atomic arrangement is regarded as a lattice arrangement, the crystal region also refers to a region with a uniform lattice arrangement.

Note that the "CAC-OS" has a composition in which materials are separated into first regions and second regions to form a mosaic pattern, and the first regions are distributed in the film (this composition is hereinafter also referred to as a cloud-like composition). That is, the CAC-OS is a composite metal oxide having a composition in which the first regions and the second regions are mixed. Note that a clear boundary between the first region and the second region is not easily observed in some cases.

For example, energy dispersive X-ray spectroscopy (EDX) is used to obtain EDX mapping, and according to the EDX mapping, the CAC-OS in the In—Ga—Zn oxide can be found to have a structure in which the region containing In as its main component (the first region) and the region containing Ga as its main component (the second region) are unevenly distributed and mixed.

In the case where the CAC-OS is used for a transistor, a switching function (On/Off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility ($\mu$) and excellent switching operation can be achieved.

An oxide semiconductor has various structures with different properties. Two or more kinds among an amorphous oxide semiconductor, a polycrystalline oxide semiconductor, an a-like OS, a CAC-OS, an nc-OS, and a CAAC-OS may be included in an oxide semiconductor of one embodiment of the present invention.

The control system 700 preferably includes a transistor using an oxide semiconductor because it can be used in a high-temperature environment. For the process simplicity, the control system 700 may be formed using transistors of the same conductivity type. A transistor using an oxide semiconductor in its semiconductor layer has an operating ambient temperature range higher than or equal to −40° C. and lower than or equal to 150° C., which is wider than that of a single crystal Si transistor, and thus shows a smaller change in characteristics than the single crystal Si transistor when the secondary battery is heated. The off-state current of the transistor using an oxide semiconductor is lower than or equal to the lower measurement limit even at 150° C. independently of the temperature; meanwhile, the off-state current characteristics of the single crystal Si transistor largely depend on the temperature. For example, at 150° C., the off-state current of the single crystal Si transistor increases, and a sufficiently high current on/off ratio cannot be obtained. The control system 700 can improve the safety.

A memory element using an OS transistor can be freely placed by being stacked over a circuit using a Si transistor, for example; hence, integration can be easy. Furthermore, an OS transistor can be fabricated with a manufacturing apparatus similar to that for a Si transistor and thus can be fabricated at low cost. That is, in the case where the control circuit 713 or the like includes a circuit using a Si transistor in the control system 700, for example, a memory unit using an OS transistor can be stacked over the circuit. Alternatively, the memory unit using an OS transistor can be stacked over the switch portion 714 so that they are integrated into one chip. Since the volume occupied by the control system 700 can be reduced, a reduction in size is possible.

The memory unit has a function of storing the parameters for estimation of the secondary battery. The power storage system 100 has a function of estimating the state of the secondary battery 120 using the parameters stored in the memory unit.

The power storage system 100 has a function of comparing the parameters stored in the memory unit and the data measured by the measurement circuit 750 to determine the charging conditions or discharging conditions of the secondary battery.

Examples of the parameters stored in the memory unit include the ambient temperature of the secondary battery, the charge voltage of the secondary battery, the discharge voltage of the secondary battery, the frequency dependence of current of the secondary battery.

The control system 700 may include a neural network. The neural network can estimate the state of the secondary battery using the parameters stored in the memory unit. The memory unit may store a weight coefficient of the neural network.

FIG. 5A illustrates an example of a neural network of one embodiment of the present invention. A neural network NN illustrated in FIG. 5A includes an input layer IL, an output layer OL, and a hidden layer (middle layer) HL. The neural network NN can be formed of a neural network including a plurality of hidden layers HL, that is, a deep neural network. Note that learning in a deep neural network is referred to as deep learning in some cases. The output layer OL, the input layer IL, and the hidden layers HL each include a plurality of neuron circuits, and the neuron circuits provided in the different layers are connected to each other through a synapse circuit.

A function of analyzing an operation of a storage battery is added to the neural network NN by learning. Then, calculation processing is performed in each layer when the parameter of the measured storage battery is input to the neural network NN. The calculation processing in each layer is executed through the product-sum operation or the like of an output from a neuron circuit in the previous layer and a weight coefficient.

Note that the connection between layers may be a full connection where all of the neuron circuits are connected or may be a partial connection where some of the neuron circuits are connected. For example, a convolutional neural network (CNN), which includes a convolutional layer and a pooling layer in which only specific units in adjacent layers have connection, may be used. The CNN is used for image processing, for example. In the convolutional layer, a product-sum operation of image data and a filter is performed, for example. The pooling layer is preferably placed directly after the convolutional layer.

FIG. 5B illustrates an example of an arithmetic operation with the neurons. Here, a neuron N and two neurons in the previous layer which output signals to the neuron N are illustrated. An output $x_1$ of a neuron in the previous layer and an output $x_2$ of a neuron in the previous layer are input to the neuron N. Then, in the neuron N, a total sum $x_1w_1+x_2w_2$ of a multiplication result $(x_1w_1)$ of the output $x_1$ and a weight $w_1$ and a multiplication result $(x_2w_2)$ of the output $x_2$ and a weight $w_2$ is calculated, and then a bias b is added as necessary, so that the value $a=x_1w_1+x_2w_2+b$ is obtained. Subsequently, the value a is converted with an activation function h, and an output signal $y=h(a)$ is output from the neuron N.

In this manner, the arithmetic operation with the neurons includes the arithmetic operation that sums the products of the outputs and the weights of the neurons in the previous layer, that is, the product-sum operation $(x_1w_1+x_2w_2$ described above). This product-sum operation may be performed using a program on software or may be performed using hardware. In the case where the product-sum operation is performed using hardware, a product-sum operation circuit can be used. Either a digital circuit or an analog circuit can be used as this product-sum operation circuit. In the case where an analog circuit is used as the product-sum operation circuit, the circuit scale of the product-sum operation circuit can be reduced, or higher processing speed and lower power consumption can be achieved by reduced frequency of access to a memory.

The product-sum operation circuit may be formed using a transistor containing silicon (such as single crystal silicon) in a channel formation region (hereinafter, also referred to as a Si transistor) or may be formed using a transistor including an oxide semiconductor in a channel formation region (hereinafter, also referred to as an OS transistor). An OS transistor is particularly suitable for a transistor included in a memory of the product-sum operation circuit because of its extremely low off-state current. Note that the product-sum operation circuit may be formed using both a Si transistor and an OS transistor.

The input layer of the neural network is supplied with, for example, the current value of the resistor 753 and the voltage of the secondary battery measured by the measurement circuit 750. The input layer may be supplied with a temperature obtained by the temperature sensor. Furthermore, the frequency of the alternating signal source is input to the input layer, for example.

The input layer of the neural network may be supplied with the state of charge (SOC), the charge current, the discharge current, or the like. Alternatively, the neural network may estimate the state of charge (SOC) using data supplied to the input layer and output data corresponding to the SOC from the output layer.

The neural network has learned data on deterioration of the secondary battery in advance, for example. The neural network performs estimation of the secondary battery and outputs information on deterioration of the secondary battery from the output layer, for example. The SOH (State Of Health, also referred to as soundness) of the secondary battery may be output from the output layer of the neural network, for example.

The parameters relating to the secondary battery before a certain time and the current parameters obtained by the power storage system of one embodiment of the present invention may be input to the input layer of the neural network.

The neural network may learn parameters relating to the secondary battery with the passage of time in advance. The learning of such parameters enables estimation of change in the parameters relating to the storage battery over time at the subsequent time not by input of complicated data with the passage of time, but only by supply of data at a certain time or data at and near a certain time to the neural network, in some cases.

The charging conditions or discharging conditions of the secondary battery may be determined using the neural network. For example, when the input layer of the neural network is supplied with a temperature obtained by the temperature sensor and the parameters relating to the secondary battery, such as the resistance value of the resistor 753, obtained by the power storage system of one embodiment of the present invention, the neural network can output suitable charging conditions or discharging conditions that increase the energy density of the secondary battery and ensure the safety of the secondary battery on the basis of the state and the environment of the secondary battery.

This embodiment can be used in appropriate combination with the other embodiments.

Embodiment 2

Figure 8A:
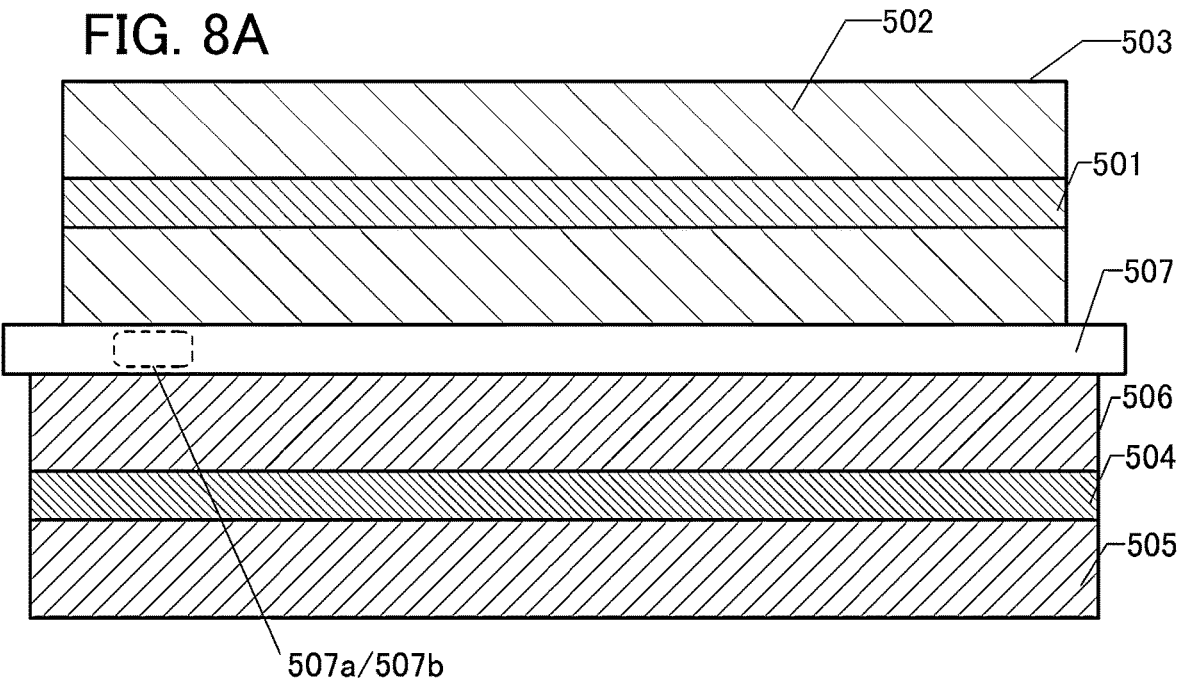
FIG. 8A and FIG. 8B illustrate examples of cross-sectional views of a secondary battery.

In this embodiment, a lithium-ion secondary battery is described as an example having a structure applicable to the secondary battery of one embodiment of the present invention with reference to FIG. 8A. The secondary battery includes an exterior body (not illustrated), a positive electrode 503, a negative electrode 506, a separator 507, and an electrolyte 508 in which a lithium salt or the like is dissolved. The separator 507 is provided between the positive electrode 503 and the negative electrode 506.

The positive electrode 503 contains a positive electrode active material. The positive electrode 503 includes a positive electrode active material layer 502 provided over a positive electrode current collector 501. The positive electrode active material layer 502 contains, for example, a positive electrode active material, a conductive agent, and a binder.

The negative electrode 506 contains a negative electrode active material. The negative electrode 506 includes a negative electrode active material layer 505 provided on a negative electrode current collector 504. The negative electrode active material layer 505 contains, for example, a negative electrode active material, a conductive agent, and a binder.

For the positive electrode current collector 501 or the negative electrode current collector 504, it is possible to use a material which has high conductivity and is not alloyed with carrier ions such as lithium, e.g., a metal such as stainless steel, gold, platinum, zinc, iron, copper, aluminum, or titanium, an alloy thereof, or the like. It is also possible to use an aluminum alloy to which an element that improves heat resistance, such as silicon, titanium, neodymium, scandium, or molybdenum, is added. A metal element that forms silicide by reacting with silicon may be used. Examples of the metal element that forms silicide by reacting with silicon include zirconium, titanium, hafnium, vanadium, niobium, tantalum, chromium, molybdenum, tungsten, cobalt, and nickel. The positive electrode current collector 501 or the negative electrode current collector 504 can have a sheet-like shape, a net-like shape, a punching-metal shape, an expanded-metal shape, or the like as appropriate. The positive electrode current collector 501 or the negative electrode current collector 504 preferably has a thickness greater than or equal to 10 lam and less than or equal to 30 μm.

Note that a material that is not alloyed with carrier ions such as lithium is preferably used for the negative electrode current collector 504.

As the conductive agent, a carbon-based material such as graphene, carbon black, graphite, carbon fiber, or fullerene can be used. As the carbon black, acetylene black (AB) can be used, for example. As the graphite, natural graphite or artificial graphite such as mesocarbon microbeads can be used, for example. These carbon-based materials have high conductivity and can function as a conductive agent in the active material layer. Note that these carbon-based materials may each function as an active material.

Graphene in this specification and the like includes, for example, graphene, multilayer graphene, multi graphene, graphene oxide, multilayer graphene oxide, multi graphene oxide, reduced graphene oxide, reduced multilayer graphene oxide, reduced multi graphene oxide, graphene quantum dots, and the like, in some cases. The graphene contains carbon, has a plate-like shape, a sheet-like shape, or the like, and has a two-dimensional structure formed of a six-membered ring composed of carbon atoms. The two-dimensional structure formed of the six-membered ring composed of carbon atoms may be referred to as a carbon sheet. The graphene compound may include a functional group. The graphene preferably has a bent shape. The graphene may be rounded like carbon nanofiber.

As carbon fiber, mesophase pitch-based carbon fiber, isotropic pitch-based carbon fiber, or the like can be used, for example. As the carbon fiber, carbon nanofiber, carbon nanotube, or the like can be used. Carbon nanotube can be formed by, for example, a vapor deposition method.

The active material layer may include, as a conductive agent, one or more selected from metal powder and metal fiber of copper, nickel, aluminum, silver, gold, and the like, a conductive ceramic material, and the like.

As the binder, it is preferred to use a material such as polystyrene, poly(methyl acrylate), poly(methyl methacrylate) (PMMA), sodium polyacrylate, polyvinyl alcohol (PVA), polyethylene oxide (PEO), polypropylene oxide, polyimide, polyvinyl chloride, polytetrafluoroethylene, polyethylene, polypropylene, polyisobutylene, polyethylene terephthalate, nylon, polyvinylidene fluoride (PVDF), polyacrylonitrile (PAN), ethylene-propylene-diene polymer, polyvinyl acetate, or nitrocellulose.

Polyimide has extremely excellent thermal, mechanical, and chemical stability. In the case of using polyimide as a binder, a dehydration reaction and a cyclization (imidizing) reaction are performed. These reactions can be performed by heat treatment, for example. In an electrode of one embodiment of the present invention, when graphene including a functional group containing oxygen and polyimide are used as the graphene and the binder, respectively, the graphene can also be reduced by the heat treatment, leading to simplification of the process. Because of high heat-resistance, heat treatment can be performed at a heat temperature of 200° C. or higher. The heat treatment at a heat temperature of 200° C. or higher allows the graphene to be reduced sufficiently and the conductivity of the electrode to increase.

A fluorine polymer which is a high molecular material containing fluorine, specifically, polyvinylidene fluoride (PVDF) can be used, for example. PVDF is a resin having a melting point in the range higher than or equal to 134° C. and lower than or equal to 169° C., and is a material with excellent thermal stability.

As the binder, a rubber material such as styrene-butadiene rubber (SBR), styrene-isoprene-styrene rubber, acrylonitrile-butadiene rubber, butadiene rubber, or an ethylene-propylene-diene copolymer is preferably used. Alternatively, fluororubber can be used as the binder.

As the binder, for example, water-soluble polymers are preferably used. As the water-soluble polymers, a polysaccharide or the like can be used, for example. As the polysaccharide, one or more selected from starch, cellulose derivatives such as carboxymethyl cellulose (CMC), methyl cellulose, ethyl cellulose, hydroxypropyl cellulose, diacetyl cellulose, and regenerated cellulose, and the like can be used. It is further preferred that such water-soluble polymers be used in combination with any of the above-described rubber materials.

A plurality of the above-described materials may be used in combination for the binder.

<Negative Electrode Active Material>

As the negative electrode active material, a material that can react with carrier ions of the secondary battery, a material into and from which carrier ions can be inserted and extracted, a material that enables an alloying reaction with a metal serving as a carrier ion, a material that enables melting and precipitation of a metal serving as a carrier ion, or the like is preferably used.

Silicon can be used as the negative electrode active material.

In addition, a metal or a compound containing one or more elements selected from tin, gallium, aluminum, germanium, lead, antimony, bismuth, silver, zinc, cadmium, and indium, can be used as the negative electrode active material. Examples of an alloy-based compound containing such elements include $Mg_2Si$, $Mg_2Ge$, $Mg_2Sn$, $Sn_{S2}$, $V_2Sn_3$, $FeSn_2$, $CoSn_2$, $Ni_3Sn_2$, $Cu_6Sn_5$, $Ag_3Sn$, $Ag_3Sb$, $Ni_2MnSb$, $CeSb_3$, $LaSn_3$, $La_3Co_2Sn_7$, $CoSb_3$, InSb, and SbSn.

A material whose resistance is lowered by addition of an impurity element such as phosphorus, arsenic, boron, aluminum, or gallium to silicon may be used. Furthermore, a silicon material pre-doped with lithium may be used. Examples of a pre-doping method include annealing of a mixture of silicon with lithium fluoride, lithium carbonate, or the like and mechanical alloying of a lithium metal and silicon. A secondary battery may be fabricated in the following manner: an electrode is formed; lithium doping is performed through charge and discharge reaction with a combination of the formed electrode and an electrode of a lithium metal or the like; and then the electrode subjected to doping is combined with a counter electrode (e.g., a positive electrode for a negative electrode subjected to pre-doping).

For example, silicon nanoparticles can be used as the negative electrode active material. The average diameter of silicon nanoparticles is, for example, preferably greater than or equal to nm and less than 1 μm, further preferably greater than or equal to 10 nm and less than or equal to 300 nm, still further preferably greater than or equal to 10 nm and less than or equal to 100 nm.

The silicon nanoparticles may have crystallinity. The silicon particles may include a region with crystallinity and an amorphous region.

As a material containing silicon, a material represented by $SiO_x$ (x is preferably less than 2, further preferably greater than or equal to 0.5 and less than or equal to 1.6) can be used, for example.

A material containing silicon, which has a plurality of crystal grains in a single particle, for example, can be used. For example, a configuration where a single particle includes one or more silicon crystal grains can be used. The single particle may also include silicon oxide around the silicon crystal grain(s). The silicon oxide may be amorphous. A particle in which graphene cling to a secondary particle of silicon may be used.

As a compound containing silicon, $Li_2SiO_3$ and $Li_4SiO_4$ can be used, for example. Each of $Li_2SiO_3$ and $Li_4SiO_4$ may have crystallinity, or may be amorphous.

The analysis of the compound containing silicon can be performed by NMR, XRD, Raman spectroscopy, SEM, TEM, EDX, or the like.

As the negative electrode active material, it is possible to use, for example, a carbon-based material such as graphite, graphitizing carbon, non-graphitizing carbon, carbon nanotube, carbon black, or graphene.

Furthermore, as the negative electrode active material, an oxide containing one or more elements selected from titanium, niobium, tungsten, and molybdenum can be used, for example.

As the negative electrode active material, a plurality of the above-described metals, materials, compounds, and the like can be used in combination.

As the negative electrode active material, an oxide such as SnO, $SnO_2$, titanium dioxide ($TiO_2$), lithium titanium oxide ($Li_4Ti_5O_{12}$), a lithium-graphite intercalation compound ($Li_xC_6$), niobium pentoxide ($Nb_2O_5$), tungsten oxide ($WO_2$), or molybdenum oxide ($MoO_2$) can be used, for example.

Alternatively, as the negative electrode active material, $Li_{3-x}M_xN$ (M=Co, Ni, or Cu) with a $Li_3N$ structure, which is a composite nitride of lithium and a transition metal, can be used. For example, $Li_{2.6}Co_{0.4}N_3$ is preferable because of high charge and discharge capacity (900 mAh/g).

A composite nitride of lithium and a transition metal is preferably used as the negative electrode material, in which case the negative electrode material can be used in combination with a material for a positive electrode material that does not contain lithium ions, such as $V_2O_5$ or $Cr_3O_8$. Note that in the case of using a material containing lithium ions as a positive electrode material, the composite nitride of lithium and a transition metal can be used as the negative electrode material by extracting the lithium ions contained in the positive electrode material in advance.

Alternatively, a material that causes a conversion reaction can be used as the negative electrode active material. For example, a transition metal oxide that does not cause an alloying reaction with lithium, such as cobalt oxide (CoO), nickel oxide (NiO), and iron oxide (FeO), may be used as the negative electrode active material. Other examples of the material that causes a conversion reaction include oxides such as $Fe_2O_3$, CuO, $Cu_2O$, $RuO_2$, and $Cr_2O_3$, sulfides such as $CoS_{0.89}$, NiS, and CuS, nitrides such as $Zn_3N_2$, $Cu_3N$, and $Ge_3N_4$, phosphides such as $NiP_2$, $FeP_2$, and $CoP_3$, and fluorides such as $FeF_3$ and $BiF_3$. Note that any of the fluorides may be used as the positive electrode material because of its high potential.

The volume of an active material particle sometimes changes in charging and discharging; however, an electrolyte containing fluorine placed between a plurality of active material particles in an electrode maintains smoothness and suppresses a crack even when the volume changes in charging and discharging, so that an effect of dramatically increasing cycle performance is obtained. It is important that an organic compound containing fluorine exists between a plurality of active materials included in the electrode.

<Positive Electrode Active Material>

Examples of the positive electrode active material include a composite oxide with an olivine crystal structure, a composite oxide with a layered rock-salt crystal structure, and a composite oxide with a spinel crystal structure. For example, a compound such as $LiFePO_4$, $LiFeO_2$, $LiNiO_2$, $LiMn_2O_4$, $V_2O_5$, $Cr_2O_5$, or $MnO_2$ can be used.

As the positive electrode active material, it is preferred to add lithium nickel oxide ($LiNiO_2$ or $LiN_{1-x}M_xO_2$ ($0<x<1$) (M=Co, Al, or the like)) to a lithium-containing material with a spinel crystal structure which contains manganese, such as $LiMn_2O_4$, because the characteristics of the secondary battery including such a material can be improved.

As the positive electrode active material, a lithium-manganese composite oxide that can be represented by a composition formula $Li_aMn_bM_cO_d$ can be used. Here, the element M is preferably silicon, phosphorus, or a metal element other than lithium and manganese, further preferably nickel. In the case where the whole particles of a lithium-manganese composite oxide are measured, it is preferred to satisfy the following at the time of discharging: $0<a/(b+c)<2$; $c>0$; and $0.26$ $(b+c)/d<0.5$. Note that the proportions of metals, silicon, phosphorus, and other elements in the whole particles of a lithium-manganese composite oxide can be measured with, for example, an ICP-MS (inductively coupled plasma mass spectrometer). The proportion of oxygen in the whole particles of a lithium-manganese composite oxide can be measured by, for example, EDX (energy dispersive X-ray spectroscopy). Alternatively, the proportion of oxygen can be measured by ICPMS combined with fusion gas analysis and valence evaluation of XAFS (X-ray absorption fine structure) analysis. Note that the lithium-manganese composite oxide is an oxide containing at least lithium and manganese, and may contain at least one selected from chromium, cobalt, aluminum, nickel, iron, magnesium, molybdenum, zinc, indium, gallium, copper, titanium, niobium, silicon, phosphorus, and the like.

As the positive electrode active material, a particle containing a plurality of the above-described positive electrode active materials may be used. For example, with the use of one of the above-described positive electrode active materials as a first material and another one of the above-described positive electrode active materials as a second material, a particle in which the second material covers at least part of the first material may be used. Such a particle in which the second material covers at least part of the first material is referred to as a positive electrode active material composite in some cases. As the composite-making process, any one or more of composite-making processes utilizing mechanical energy such as a mechanochemical method, a mechanofusion method, and a ball mill method; composite-making processes utilizing a liquid phase reaction such as a coprecipitation method, a hydrothermal method, and a sol-gel method; and composite-making processes utilizing a gas phase reaction such as a barrel sputtering method, an ALD (Atomic Layer Deposition) method, an evaporation method, and a CVD (Chemical Vapor Deposition) method can be used, for example. Heat treatment is preferably performed after the composite-making process. Note that the composite-making process is also referred to as a surface coating process or a coating process in some cases.

<Structure of Positive Electrode Active Material>

A material with the layered rock-salt crystal structure, such as lithium cobalt oxide ($LiCoO_2$), is known to have a high discharge capacity and excel as a positive electrode active material of a secondary battery. As an example of the material with the layered rock-salt crystal structure, a composite oxide represented by $LiMO_2$ is given. The metal M contains a metal Mel. The metal Mel is one or more kinds of metals containing cobalt. The metal M can contain a metal X in addition to the metal Mel. The metal X is one or more metals selected from magnesium, calcium, zirconium, lanthanum, barium, copper, potassium, sodium, and zinc.

It is known that the Jahn-Teller effect in a transition metal compound varies in degree according to the number of electrons in the d orbital of the transition metal.

In a compound containing nickel, distortion is likely to be caused because of the Jahn-Teller effect in some cases. Accordingly, when charging and discharging at a high voltage are performed on $LiNiO_2$, the crystal structure might be lost because of the distortion. The influence of the Jahn-Teller effect is suggested to be small in $LiCoO_2$; hence, $LiCoO_2$ is preferable because the resistance to high-voltage charging and discharging is higher in some cases.

Here, the composition of the lithium composite oxide represented by $LiMO_2$ is not limited to Li:M:O=1:1:2. As the lithium composite oxide represented by $LiMO_2$, lithium cobalt oxide, lithium nickel-cobalt-manganese oxide, lithium nickel-cobalt-aluminum oxide, lithium nickel-cobalt-manganese-aluminum oxide, and the like can be given.

Using cobalt at greater than or equal to 75 atomic %, preferably greater than or equal to atomic %, further preferably greater than or equal to 95 atomic % as the element M brings many advantages such as relatively easy synthesis, easy handling, and excellent cycle performance.

Using nickel at greater than or equal to 33 atomic %, preferably greater than or equal to atomic %, further preferably greater than or equal to 80 atomic % as the element M is preferable because in that case, the cost of the raw materials might be lower than that of the case of using a large amount of cobalt and charge and discharge capacity per weight might be increased.

When nickel at greater than or equal to 33 atomic %, preferably greater than or equal to atomic %, further preferably greater than or equal to 80 atomic % is used as the element M, the particle diameter is reduced in some cases. Therefore, the above-described third particle preferably includes nickel as the element M at greater than or equal to 33 atomic %, preferably greater than or equal to 60 atomic %, further preferably greater than or equal to 80 atomic %, for example.

Moreover, when nickel is partly included as the element M together with cobalt, a shift in a layered structure formed of octahedrons of cobalt and oxygen is sometimes inhibited. The inhibition of the shift enables higher stability of the crystal structure particularly in a high-temperature charged state in some cases, which is preferable. This is presumably because nickel is easily diffused into the inner portion of lithium cobalt oxide and exists in a cobalt site at the time of discharging but can be positioned in a lithium site owing to cation mixing at the time of charging. Nickel existing in the lithium site at the time of charging functions as a pillar supporting the layered structure formed of octahedrons of cobalt and oxygen and presumably contributes to stabilization of the crystal structure.

Note that manganese is not necessarily included as the element M In addition, nickel is not necessarily included. Furthermore, cobalt is not necessarily included.

At the time of charging, lithium is extracted from the particle surface; accordingly, the surface portion of the particle has a lower lithium concentration than the inner portion and tends to suffer loss of the crystal structure.

The particles of one embodiment of the present invention include lithium, the element M, and oxygen. The particles of one embodiment of the present invention include the lithium composite oxide represented by $LiMO_2$ (M is one or more metals including cobalt). The particles of one embodiment of the present invention include one or more selected from magnesium, fluorine, aluminum, and nickel in their surface portions. When the particles of one embodiment of the present invention include one or more of these elements in the surface portions, a structure change owing to charging and discharging is reduced and generation of a crack can be inhibited in the surface portions of the particles. Furthermore, an irreversible structure change in the surface portions of the particles can be inhibited, whereby capacity reduction due to the repetitive charging and discharging can be inhibited. The concentrations of these elements in the surface portion are preferably higher than the concentrations of these elements in the whole particle. In the surface portions of the particles of one embodiment of the present invention, the lithium composite oxide may have a structure in which one or more selected from magnesium, fluorine, aluminum, and nickel is substituted for some atoms, for example.

The positive electrode active material will be described with reference to FIG. 6 and FIG. 7.

Figure 6:
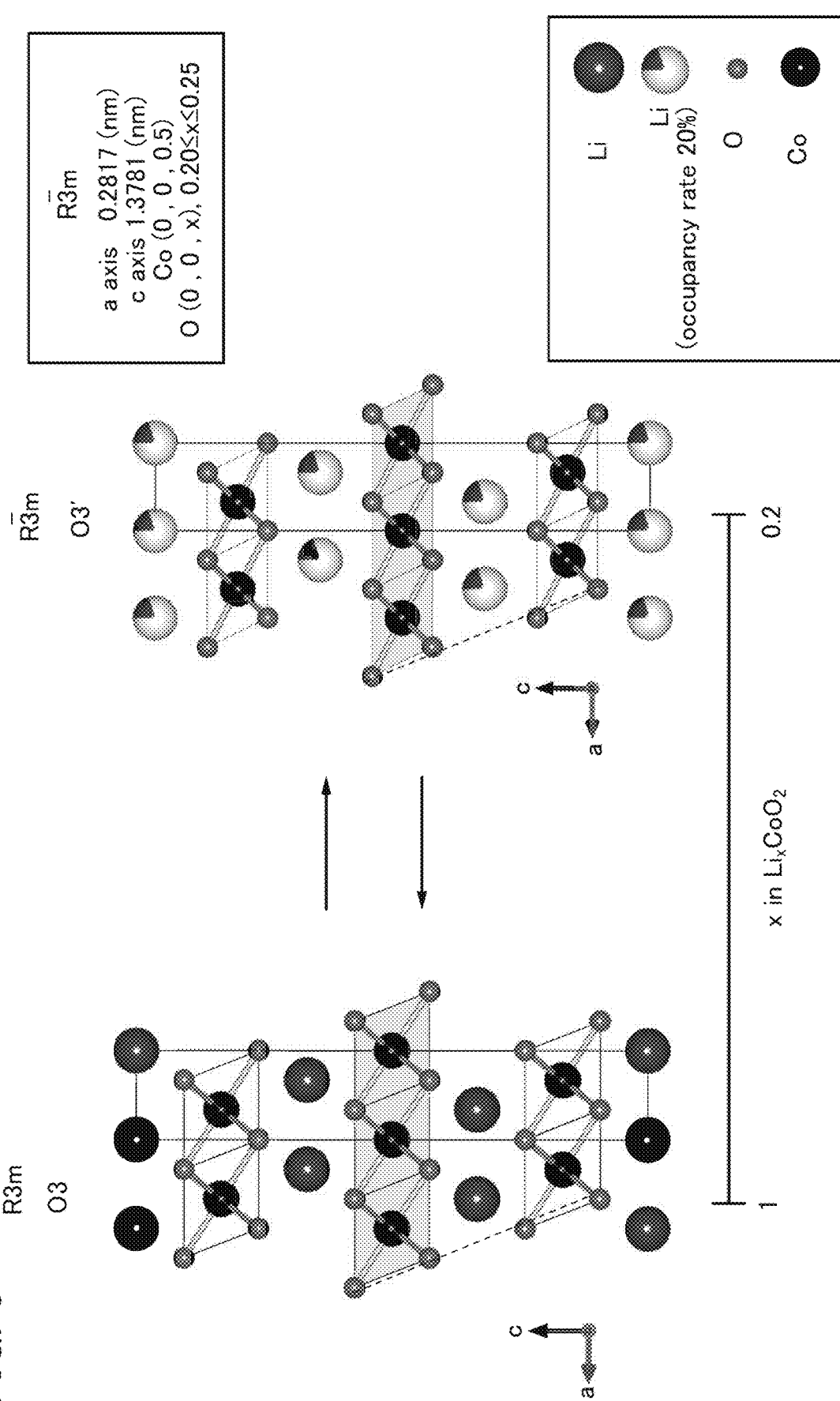
FIG. 6 is a diagram illustrating crystal structures of a positive electrode active material.

In a positive electrode active material illustrated in FIG. 6, a deviation in the $CoO_2$ layers can be small in repeated charging and discharging at a high voltage. Furthermore, the change in the volume can be small. Thus, the positive electrode active material illustrated in FIG. 6 can have excellent cycle performance. In addition, the positive electrode active material can have a stable crystal structure in a high-voltage charged state. Thus, in the positive electrode active material, sometimes a short circuit is less likely to occur while the high-voltage charged state is maintained. This is preferable because the safety is further improved.

The positive electrode active material illustrated in FIG. 6 has a small change in the crystal structure and a small difference in volume per the same number of transition metal atoms between a sufficiently discharged state and a high-voltage charged state.

The positive electrode active material illustrated in FIG. 6 can be represented by a layered rock-salt crystal structure. FIG. 6 illustrates examples of the crystal structures of one embodiment of the positive electrode active material before and after charging and discharging. In one embodiment of the positive electrode active material, the surface portion may include a crystal which contains titanium, magnesium, and oxygen, in addition to or instead of a region represented by a layered rock-salt crystal structure described below with reference to FIG. 6 and the like, and is represented by a structure different from a layered rock-salt crystal structure. For example, a crystal containing titanium, magnesium, and oxygen and is represented by a spinel structure may be included.

Figure 7:
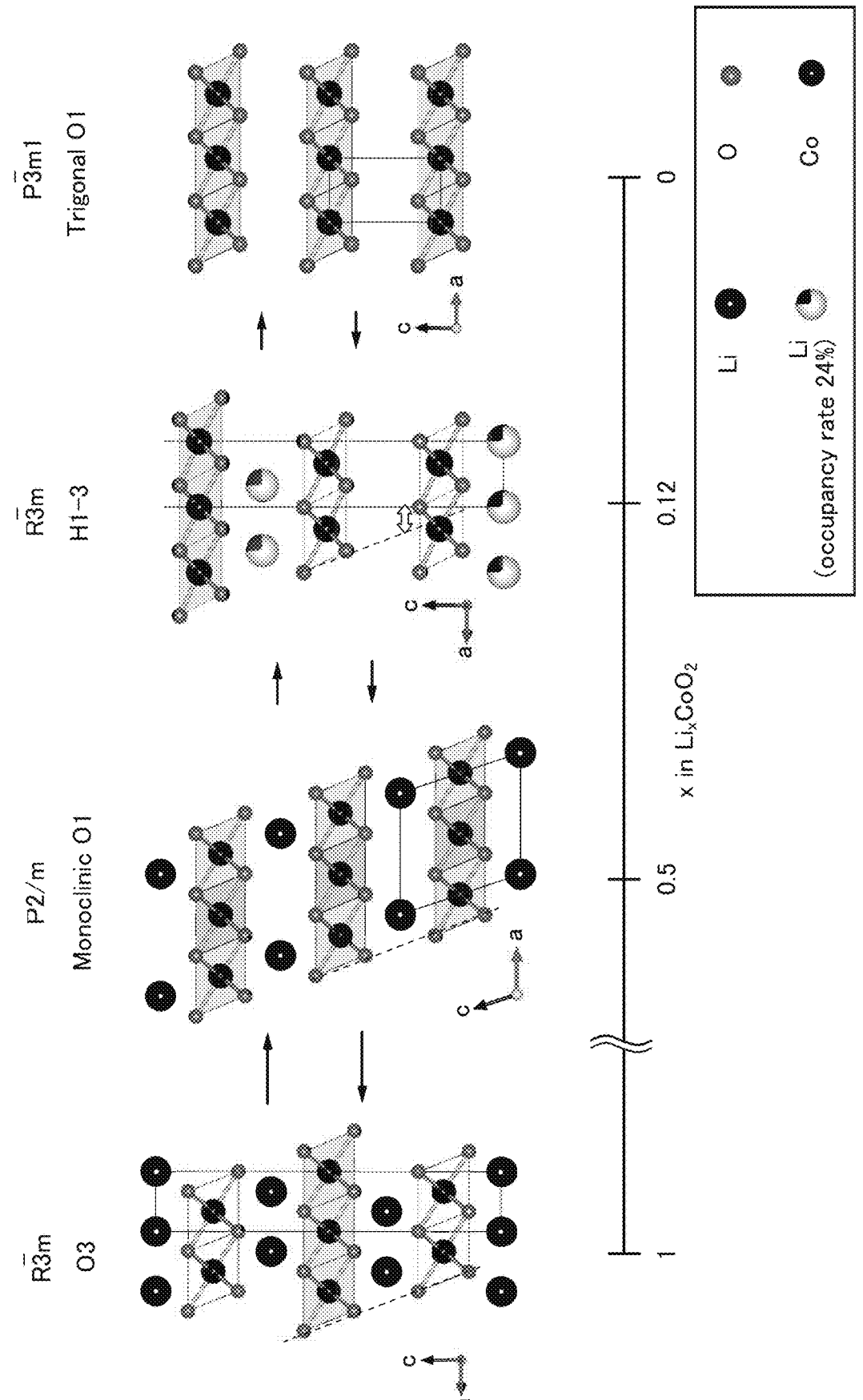
FIG. 7 is a diagram illustrating crystal structures of a positive electrode active material.

The crystal structure with a charge depth of 0 (in a discharged state) in FIG. 6 is R-3m (O3) as in FIG. 7. Meanwhile, the positive electrode active material, illustrated in FIG. 6, with a charge depth in a sufficiently charged state includes a crystal whose structure is different from the H1-3 type crystal structure. This structure has a crystal structure belonging to the space group R-3m, and the symmetry of the $CoO_2$ layer is the same as that in the O3 type structure. Accordingly, this structure is referred to as an O3' type crystal structure. Note that although lithium exists in any of lithium sites at an approximately 20% probability in the diagram of the O3' type crystal structure illustrated in FIG. 6, the structure is not limited thereto. Lithium may exist in only some certain lithium sites. In addition, in both the O3 type crystal structure and the O3' type crystal structure, a slight amount of magnesium preferably exists between the $CoO_2$ layers, i.e., in lithium sites. In addition, a slight amount of halogen such as fluorine may exist in oxygen sites at random.

Note that in the O3' type crystal structure, an ion of cobalt, magnesium, or the like occupies a site coordinated to six atoms. Note that a light element such as lithium sometimes occupies a site coordinated to four oxygen atoms.

The O3' type crystal structure can also be regarded as a crystal structure that contains Li between layers at random but is similar to a $CdCl_2$ crystal structure. The crystal structure similar to the $CdCl_2$ crystal structure is close to a crystal structure of lithium nickel oxide ($Li_{0.06}NiO_2$) charged to a charge depth of 0.94; however, pure lithium cobalt oxide or a layered rock-salt positive electrode active material containing a large amount of cobalt is known not to have the $CdCl_2$ crystal structure generally.

Anions of a layered rock-salt crystal and anions of a rock-salt crystal have cubic closest packed structures (face-centered cubic lattice structures). Anions of an O3' type crystal are also presumed to have cubic closest packed structures. When these crystals are in contact with each other, there is a crystal plane at which orientations of cubic closest packed structures composed of anions are aligned. Note that a space group of the layered rock-salt crystal and the O3' type crystal is R-3m, which is different from the space group Fm-3m of a rock-salt crystal (a space group of a general rock-salt crystal); thus, the Miller index of the crystal plane satisfying the above conditions in the layered rock-salt crystal and the O3' type crystal is different from that in the rock-salt crystal. In this specification, a state where the orientations of the cubic close-packed structures composed of anions in the layered rock-salt crystal, the O3' type crystal, and the rock-salt crystal are aligned is sometimes referred to as a state where crystal orientations are substantially aligned.

In the positive electrode active material illustrated in FIG. 6, a change in crystal structure between the R-3m (O3) structure in a discharged state and the O3' type crystal structure is inhibited as compared with a change in crystal structure in a positive electrode active material illustrated in FIG. 7. For example, as denoted by the dotted lines in FIG. 6, the $CoO_2$ layers hardly shift between the R-3m (O3) structure in a discharged state and the O3' type crystal structure.

More specifically, the structure of the positive electrode active material illustrated in FIG. 6 is highly stable even when a charge voltage is high. For example, the positive electrode active material illustrated in FIG. 6 can maintain the R-3m (O3) crystal structure even at a charge voltage that makes a positive electrode active material illustrated in FIG. 7 have the H1-3 type crystal structure, e.g., a voltage of approximately 4.6 V with the potential of a lithium metal as the reference. Even at higher charge voltages, e.g., a voltage of approximately 4.65 V to 4.7 V with the potential of a lithium metal as the reference, a region that may have the O3' type crystal structure exists. When the charge voltage is increased to higher than 4.7 V, a H1-3 type crystal is eventually observed in some cases. In addition, the positive electrode active material illustrated in FIG. 6 can have the O3' type crystal structure even at a lower charge voltage (e.g., a charge voltage higher than or equal to 4.5 V and lower than 4.6 V with the potential of a lithium metal as the reference), in some cases. Note that in the case where graphite is used as the negative electrode active material in the secondary battery, for example, the voltage of the secondary battery is lower than the above-mentioned voltages by the potential of graphite. The potential of graphite is approximately 0.05 V to 0.2 V with the potential of a lithium metal as the reference. Thus, even when the voltage of the secondary battery including graphite as the negative electrode active material is higher than or equal to 4.3 V and lower than or equal to 4.5 V, for example, the positive electrode active material illustrated in FIG. 6 can maintain the R-3m (O3) crystal structure and moreover, includes a region that can have the O3' type crystal structure at higher voltages, e.g., at a voltage of the secondary battery higher than 4.5 V and lower than or equal to 4.6 V. In addition, the positive electrode active material of one embodiment of the present invention can have the O3' type crystal structure at lower charge voltages, e.g., at a voltage of the secondary battery higher than or equal to 4.2 V and lower than 4.3 V, in some cases.

Thus, in the positive electrode active material illustrated in FIG. 6, the crystal structure is less likely to be lost even when charging and discharging are repeated at a high voltage.

In the positive electrode active material illustrated in FIG. 6, the R-3m (O3) in a discharged state and the O3' type crystal structure which contain the same number of cobalt atoms have a difference in volume of 2.5% or less, specifically 2.2% or less, typically 1.8%.

Note that in the unit cell of the O3' type crystal structure, the coordinates of cobalt and oxygen can be represented by Co (0, 0, 0.5) and O (0, 0, x) within the range of $0.20 \leq x \leq 0.25$. In the unit cell, the lattice constant of the a-axis is preferably $0.2797 \leq a \leq 0.2837$ (nm), further preferably $0.2807 \leq a \leq 0.2827$ (nm), typically $a=0.2817$ (nm). The lattice constant of the c-axis is preferably $1.3681 \leq c \leq 1.3881$ (nm), further preferably $1.3751 \leq c \leq 1.3811$ (nm), typically, $c=1.3781$ (nm).

A slight amount of magnesium existing between the $CoO_2$ layers, i.e., in lithium sites at random, has an effect of inhibiting a deviation in the $CoO_2$ layers in high-voltage charging. Thus, the existence of magnesium between the $CoO_2$ layers makes it easier to obtain the O3' type crystal structure.

However, cation mixing occurs when the heat treatment temperature is excessively high; thus, magnesium is highly likely to enter cobalt sites. Magnesium in the cobalt sites might be less effective in maintaining the R-3m structure when x in $Li_xCoO_2$ is small. Furthermore, heat treatment at an excessively high temperature might have an adverse effect; for example, cobalt might be reduced to have a valence of two or lithium might be evaporated.

In view of the above, a halogen compound such as a fluorine compound is preferably added to lithium cobalt oxide before the heat treatment for distributing magnesium throughout the particle. The addition of the halogen compound decreases the melting point of the lithium cobalt oxide. The decreased melting point makes it easier to distribute magnesium throughout the particle at a temperature at which the cation mixing is unlikely to occur. Furthermore, it is expected that the existence of the fluorine compound can improve corrosion resistance to hydrofluoric acid generated by decomposition of an electrolyte.

When the magnesium concentration is higher than or equal to a desired value, the effect of stabilizing a crystal structure becomes small in some cases. This is probably because magnesium enters the cobalt sites in addition to the lithium sites. The number of magnesium atoms in the positive electrode active material fabricated according to one embodiment of the present invention is preferably more than or equal to 0.001 times and less than or equal to 0.1 times, further preferably more than 0.01 times and less than 0.04 times, still further preferably approximately 0.02 times the number of cobalt atoms. The magnesium concentration described here may be a value obtained by element analysis on the whole particles of the positive electrode active material using ICP-MS or the like, or may be a value based on the ratio of the raw materials mixed in the process of fabricating the positive electrode active material, for example.

The number of nickel atoms in the positive electrode active material is preferably 7.5% or lower, preferably 0.05% or higher and 4% or lower, further preferably 0.1% or higher and 2% or lower the number of cobalt atoms. The nickel concentration described here may be a value obtained by element analysis on the whole particles of the positive electrode active material using ICP-MS or the like, or may be a value based on the ratio of the raw materials mixed in the process of fabricating the positive electrode active material, for example.

The positive electrode active material illustrated in FIG. 6 can inhibit loss of the crystal structure even at an extremely high charge voltage, and thus enables repeated charging with an extremely high end-of-charge voltage. An increase in end-of-charge voltage can increase the energy density of the secondary battery, leading to effective extraction of the energy of the secondary battery. The power storage system of one embodiment of the present invention can easily estimate the state of the secondary battery and can control the secondary battery in accordance with the estimated state even in the case where the secondary battery is used with a high end-of-charge voltage; thus, the power storage system can be operated safely. When the power storage system of one embodiment of the present invention includes the positive electrode active material of one embodiment of the present invention, the secondary battery can be operated safely within a wide range of charge and discharge voltage.

<Particle Diameter>

Too large a particle diameter of the positive electrode active material causes problems such as difficulty in lithium diffusion and too much surface roughness of an active material layer in application on a current collector. By contrast, too small a particle diameter causes problems such as difficulty in loading of the active material layer in application on the current collector and overreaction with the electrolyte. Therefore, an average particle diameter (D50, also referred to as median diameter) is preferably greater than or equal to 1 μm and less than or equal to 100 μm, further preferably greater than or equal to 2 μm and less than or equal to 40 μm, still further preferably greater than or equal to 5 μm and less than or equal to 30 μm.

<Analysis Method>

Whether or not a positive electrode active material is the positive electrode active material having the O3' type crystal structure when charged at a high voltage can be determined by analyzing a high-voltage charged positive electrode using XRD, electron diffraction, neutron diffraction, electron spin resonance (ESR), nuclear magnetic resonance (NMR), or the like. XRD is particularly preferable because the symmetry of a transition metal such as cobalt contained in the positive electrode active material can be analyzed with high resolution, the degrees of crystallinity and the crystal orientations can be compared, the distortion of lattice periodicity and the crystallite size can be analyzed, and a positive electrode itself obtained by disassembling a secondary battery can be measured with sufficient accuracy, for example.

As described so far, the positive electrode active material has a feature of a small change in the crystal structure between a high-voltage charged state and a discharged state. A material in which 50 wt % or more of the crystal structure largely changes between a high-voltage charged state and a discharged state is not preferable because the material cannot withstand charging and discharging at a high voltage. In addition, it should be noted that an objective crystal structure is not obtained in some cases only by addition of impurity elements. For example, although the positive electrode active material that is lithium cobalt oxide containing magnesium and fluorine is a commonality, the positive electrode active material has 60 wt % or more of the O3' type crystal structure in some cases, and has 50 wt % or more of the H1-3 type crystal structure in other cases, when charged at a high voltage. Furthermore, at a predetermined voltage, the positive electrode active material has almost 100 wt % of the O3' type crystal structure, and with an increase in the predetermined voltage, the H1-3 type crystal structure is generated in some cases. Thus, the crystal structure of the positive electrode active material is preferably analyzed by XRD or the like. The combination with XRD measurement or the like enables more detailed analysis.

However, the crystal structure of a positive electrode active material in a high-voltage charged state or a discharged state may be changed by exposure to the air. For example, the O3' type crystal structure changes into the H1-3 type crystal structure in some cases. Thus, all samples are preferably handled in an inert atmosphere such as an atmosphere containing argon.

A positive electrode active material illustrated in FIG. 7 is lithium cobalt oxide ($LiCoO_2$) to which the metal X is not added. The crystal structure of the lithium cobalt oxide illustrated in FIG. 7 is changed depending on a charge depth.

As illustrated in FIG. 7, in lithium cobalt oxide with a charge depth of 0 (in a discharged state), there is a region having a crystal structure belonging to the space group R-3m, and a unit cell includes three $CoO_2$ layers. Thus, this crystal structure is referred to as an O3 type crystal structure in some cases. Note that here, the $CoO_2$ layer has a structure in which an octahedral structure with cobalt coordinated to six oxygen atoms continues on a plane in an edge-shared state.

Lithium cobalt oxide with a charge depth of 1 has the crystal structure belonging to the space group P-3m1 and includes one $CoO_2$ layer in a unit cell. Thus, this crystal structure is referred to as an O1 type crystal structure in some cases.

Lithium cobalt oxide with a charge depth of approximately 0.8 has the crystal structure belonging to the space group R-3m. This structure can also be regarded as a structure in which $CoO_2$ structures such as a structure belonging to P-3m1 (O1) and $LiCoO_2$ structures such as a structure belonging to R-3m (O3) are alternately stacked. Thus, this crystal structure is referred to as an H1-3 type crystal structure in some cases. Note that the number of cobalt atoms per unit cell in the actual H1-3 type crystal structure is twice that in other structures. However, in this specification, FIG. 7, and other drawings, the c-axis of the H1-3 type crystal structure is half that of the unit cell for easy comparison with the other structures.

For the H1-3 type crystal structure, the coordinates of cobalt and oxygen in the unit cell can be expressed as follows, for example: Co (0, 0, 0.42150±0.00016), $O_1$ (0, 0, 0.27671±0.00045), and $O_2$ (0, 0, 0.11535±0.00045). $O_1$ and $O_2$ are each an oxygen atom. In this manner, the H1-3 type crystal structure is represented by a unit cell containing one cobalt and two oxygen. Meanwhile, the O3' type crystal structure of one embodiment of the present invention is preferably represented by a unit cell including one cobalt and one oxygen. This means that the symmetry of cobalt and oxygen differs between the O3' type crystal structure and the H1-3 type structure, and the amount of change from the O3 structure is smaller in the O3' type crystal structure than in the H1-3 type structure. A preferred unit cell for representing a crystal structure in a positive electrode active material can be selected such that the value of GOF (good of fitness) is smaller in Rietveld analysis of XRD, for example.

When charging at a high voltage of 4.6 V or higher based on the redox potential of a lithium metal or charging at a large charge depth of 0.8 or more and discharging are repeated, a change in the crystal structure of lithium cobalt oxide between the H1-3 type crystal structure and the R-3m (O3) structure in a discharged state (i.e., an unbalanced phase change) occurs repeatedly.

However, there is a large shift in the $CoO_2$ layers between these two crystal structures. As denoted by the dotted lines and the arrow in FIG. 7, the $CoO_2$ layer in the H1-3 type crystal structure largely shifts from that in R-3m (O3). Such a dynamic structural change can adversely affect the stability of the crystal structure.

A difference in volume is also large. The H1-3 type crystal structure and the O3 type crystal structure in a discharged state that contain the same number of cobalt atoms have a difference in volume of 3.0% or more.

In addition, a structure in which $CoO_2$ layers are arranged continuously, such as P-3m1 (O1), included in the H1-3 type crystal structure is highly likely to be unstable. Thus, the repeated high-voltage charging and discharging causes loss of the crystal structure of lithium cobalt oxide. The loss of the crystal structure triggers degradation of the cycle performance. This is probably because the loss of the crystal structure reduces sites where lithium can stably exist and makes it difficult to insert and extract lithium.

<Electrolyte>

The electrolyte preferably contains a solvent and a metal salt serving as a carrier ion. As the solvent of the electrolyte, an aprotic organic solvent is preferably used; for example, one of ethylene carbonate (EC), propylene carbonate (PC), butyl ene carbonate, chloroethylene carbonate, vinylene carbonate, γ-butyrolactone, γ-valerolactone, dimethyl carbonate (DMC), diethyl carbonate (DEC), ethyl methyl carbonate (EMC), methyl formate, methyl acetate, ethyl acetate, methyl propionate, ethyl propionate, propyl propionate, methyl butyrate, 1,3-dioxane, 1,4-dioxane, dimethoxyethane (DME), dimethyl sulfoxide, diethyl ether, methyl diglyme, acetonitrile, benzonitrile, tetrahydrofuran, sulfolane, and sultone can be used, or two or more of them can be used in an appropriate combination at an appropriate ratio.

One or more ionic liquids (room temperature molten salts) that are less likely to burn and volatize can be used as the solvent of the electrolyte to prevent the secondary battery from exploding or catching fire, for example, even when the secondary battery internally shorts out or the internal temperature increases owing to overcharging or the like. An ionic liquid contains a cation and an anion, specifically, an organic cation and an anion. Examples of the organic cation used for the electrolyte include aliphatic onium cations such as a quaternary ammonium cation, a tertiary sulfonium cation, and a quaternary phosphonium cation, and aromatic cations such as an imidazolium cation and a pyridinium cation. Examples of the anion used for the electrolyte include a monovalent amide-based anion, a monovalent methide-based anion, a fluorosulfonate anion, a perfluoro-alkylsulfonate anion, a tetrafluoroborate anion, a perfluoro-alkylborate anion, a hexafluorophosphate anion, and a per-fluoroalkylphosphate anion.

As the salt dissolved in the above-described solvent, one of lithium salts such as $LiPF_6$, $LiClO_4$, $LiAsF_6$, $LiBF_4$, $LiAlCl_4$, LiSCN, LiBr, LiI, $Li_2SO_4$, $Li_2B_{10}Cl_{10}$, $Li_2B_{12}Cl_{12}$, $LiCF_3SO_3$, $LiC_4F_9SO_3$, $LiC(CF_3SO_2)_3$, $LiC(C_2F_5SO_2)_3$, $LiN(CF_3SO_2)_2$, $LiN(C_4F_9SO_2)(CF_3SO_2)$, and $LiN$ $(C_2F_5SO_2)_2$ can be used, or two or more of these lithium salts can be used in an appropriate combination at an appropriate ratio.

The electrolyte used for the secondary battery is prefer-ably highly purified and contains a small number of dust particles or elements other than the constituent elements of the electrolyte (hereinafter, also simply referred to as impu-rities). Specifically, the weight ratio of impurities to the electrolyte is preferably less than or equal to 1%, further preferably less than or equal to 0.1%, still further preferably less than or equal to 0.01%.

Furthermore, an additive agent such as vinylene carbon-ate, propane sultone (PS), tert-butylbenzene (TBB), fluoro-ethylene carbonate (FEC), lithium bis(oxalate)borate (Li-BOB), or a dinitrile compound such as succinonitrile or adiponitrile may be added to the electrolyte. The concen-tration of the material to be added in the whole solvent is, for example, higher than or equal to 0.1 wt % and lower than or equal to 5 wt %. VC and LiBOB are particularly preferable because they facilitate formation of a favorable coating film.

A solution containing a solvent and a salt serving as a carrier ion is referred to as an electrolyte solution in some cases.

A polymer gel electrolyte obtained in such a manner that a polymer is swelled with an electrolyte solution may be used.

When a polymer gel electrolyte is used, safety against liquid leakage and the like is improved. Moreover, the secondary battery can be thinner and more lightweight.

As a polymer that undergoes gelation, a silicone gel, an acrylic gel, an acrylonitrile gel, a polyethylene oxide-based gel, a polypropylene oxide-based gel, a fluorine-based poly-mer gel, or the like can be used.

Examples of the polymer include a polymer having a polyalkylene oxide structure, such as polyethylene oxide (PEO); PVDF; polyacrylonitrile; and a copolymer contain-ing any of them. For example, PVDF-HFP, which is a copolymer of PVDF and hexafluoropropylene (HFP), can be used. The formed polymer may be porous.

As the electrolyte, a solid electrolyte containing an inor-ganic material such as a sulfide-based or oxide-based inor-ganic material or a solid electrolyte containing a polymer material such as a PEO (polyethylene oxide)-based polymer material can be used. When the solid electrolyte is used, at least one of a separator and a spacer does not need to be provided. Furthermore, the battery can be entirely solidified;

therefore, there is no possibility of liquid leakage and thus the safety of the battery is dramatically improved.

<Separator>

As the separator 507, for example, a separator formed using paper, nonwoven fabric, glass fibers, ceramics, or the like can be used. Alternatively, a separator formed using nylon (polyamide), vinylon (polyvinyl alcohol-based fibers), polyester, acrylic, polyolefin, polyurethane, polypropylene, polyethylene, or the like can be used. The separator is preferably processed to have an envelope-like shape to wrap one of the positive electrode and the negative electrode.

As the separator 507, for example, a polymer film con-taining polypropylene, polyethylene, polyimide, or the like can be used. Polyimide is further preferably used as the material of the separator 507 in some cases because of its high wettability to an ion liquid.

The polymer film containing polypropylene, polyethyl-ene, or the like can be formed by a dry process or a wet process. The dry process is a process in which the polymer film containing polypropylene, polyethylene, polyimide, or the like is drawn while heated so that spaces are formed between crystals to make minute holes. The wet process is a process in which a resin and a solvent mixed in advance are formed into a film shape and then the solvent is extracted to make holes.

Figure 8B:
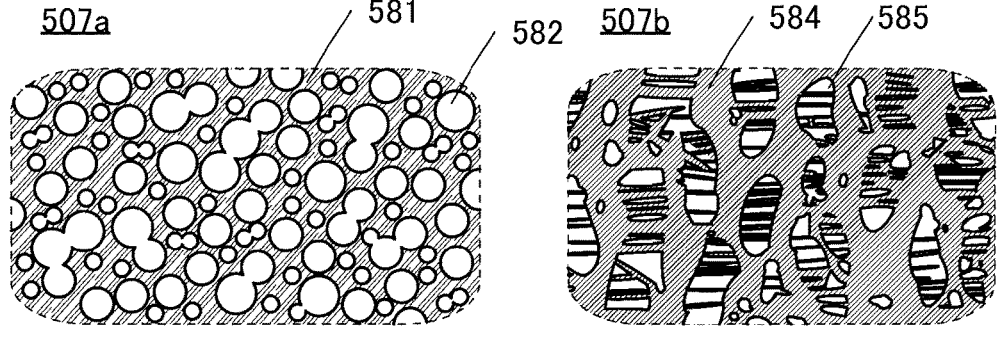

The left view of FIG. 8B is an enlarged view of a region 507a, which shows an example of the separator 507 (formed by the wet process). This example shows a structure in which a polymer film 581 has a plurality of holes 582. The right view of FIG. 8B is an enlarged view of a region 507b, which shows another example of the separator 507 (formed by the dry process). This example shows a structure in which a polymer film 584 has a plurality of holes 585.

The diameters of the holes in the separator may vary between a surface portion of a surface that faces the positive electrode and a surface portion of a surface that faces the negative electrode after charging and discharging. In this specification and the like, the surface portion of the separator is preferably a region that is less than or equal to 5 μm, further preferably less than or equal to 3 μm from the surface, for example.

The separator may have a multilayer structure. For example, a structure in which two types of polymer mate-rials are stacked may be employed.

Alternatively, a structure in which the polymer film con-taining polypropylene, polyethylene, polyimide, or the like is coated with a ceramic-based material, a fluorine-based material, a polyamide-based material, a mixture thereof, or the like can be employed, for example. Alternatively, a structure in which nonwoven fabric is coated with a ceramic-based material, a fluorine-based material, a poly-amide-based material, a mixture thereof, or the like can be employed, for example. Polyimide is further preferably used as the material used for coating in some cases because of its high wettability to an ion liquid.

Examples of the fluorine-based material include PVdF and polytetrafluoroethylene.

Examples of the polyamide-based material include nylon and aramid (meta-based aramid and para-based aramid).

<Exterior Body>

For an exterior body included in the secondary battery, one or more selected from a metal material such as alumi-num and a resin material can be used, for example. A film-like exterior body can also be used. As the film, for example, it is possible to use a film having a three-layer structure in which a highly flexible metal thin film of aluminum, stainless steel, copper, nickel, or the like is provided over a film formed of a material such as polyethylene, polypropylene, polycarbonate, ionomer, or polyamide, and an insulating synthetic resin film of a polyamide-based resin, a polyester-based resin, or the like is provided over the metal thin film as the outer surface of the exterior body.

This embodiment can be used in appropriate combination with the other embodiments.

Embodiment 3

In this embodiment, a method for fabricating a secondary battery will be described.

<Method 1 for Fabricating Laminated Secondary Battery>

Figure 9A:
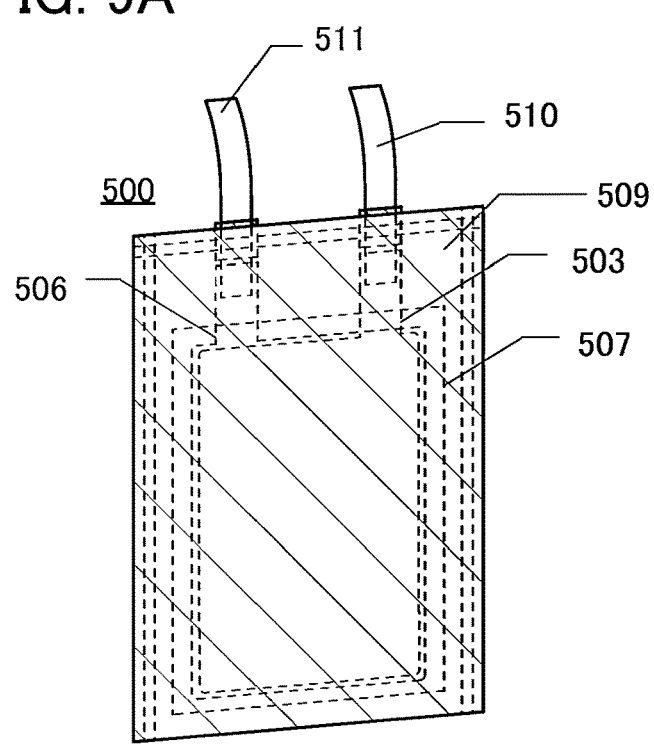
FIG. 9A and FIG. 9B are diagrams illustrating examples of the appearance of a secondary battery.
Figure 9B:
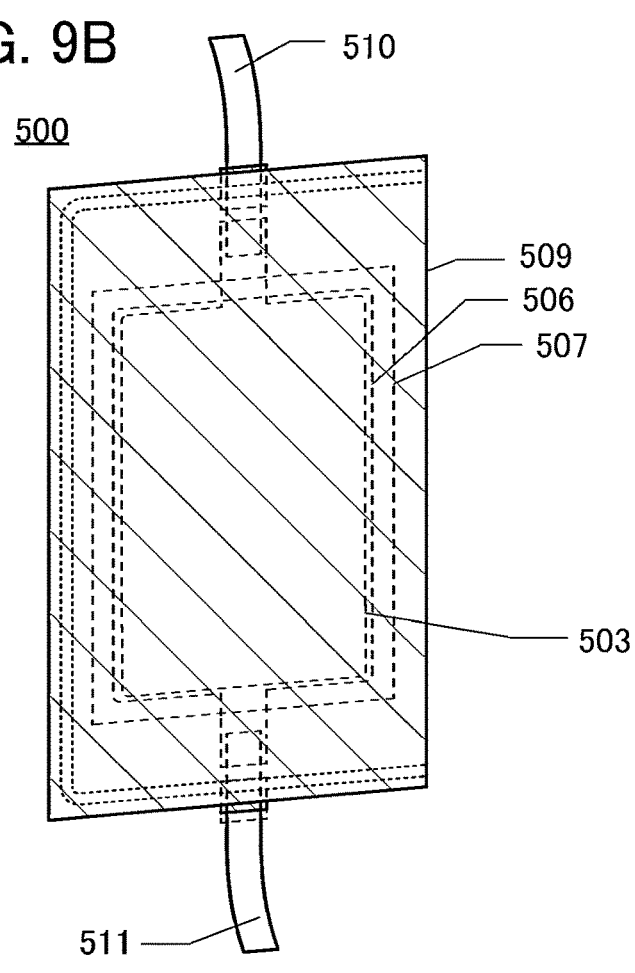

Here, an example of a method for fabricating laminated secondary batteries whose external views are illustrated in FIG. 9A, FIG. 9B, and FIG. 9C are described with reference to FIG. 10A, FIG. 10B, FIG. 11A, and FIG. 11B. Secondary batteries 500 illustrated in FIG. 9A and FIG. 9B each include the positive electrode 503, the negative electrode 506, the separator 507, an exterior body 509, a positive electrode lead electrode 510, and a negative electrode lead electrode 511. For a cross-sectional view of the laminated secondary battery illustrated in FIG. 9A or the like, a structure described later with reference to FIG. 19 can be employed in which a positive electrode, a separator, and a negative electrode are stacked and surrounded by an exterior body, for example.

Figure 10A:
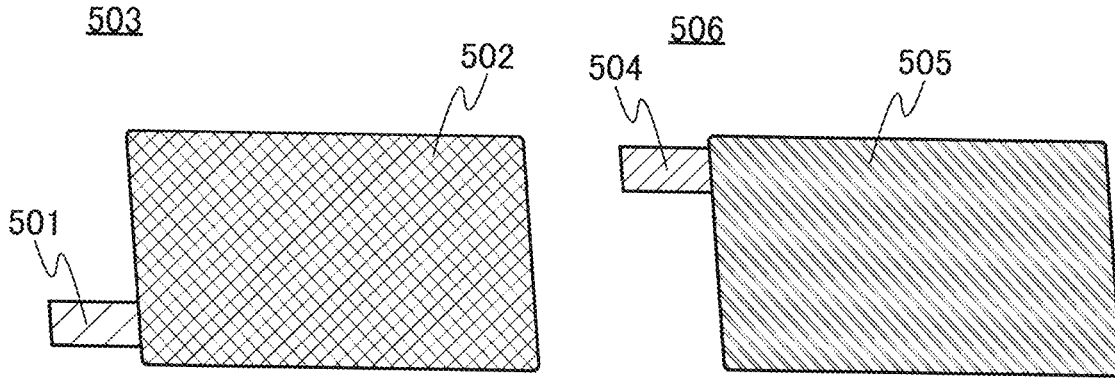
FIG. 10A and FIG. 10B are diagrams illustrating a method for fabricating a secondary battery.

First, the positive electrode 503, the negative electrode 506, and the separator 507 are prepared. FIG. 10A illustrates examples of the positive electrode 503 and the negative electrode 506. The positive electrode 503 includes the positive electrode active material layer 502 over the positive electrode current collector 501. The positive electrode 503 preferably includes a tab region where the positive electrode current collector 501 is exposed. The negative electrode 506 includes the negative electrode active material layer 505 over the negative electrode current collector 504. The negative electrode 506 preferably includes a tab region where the negative electrode current collector 504 is exposed.

Figure 10B:
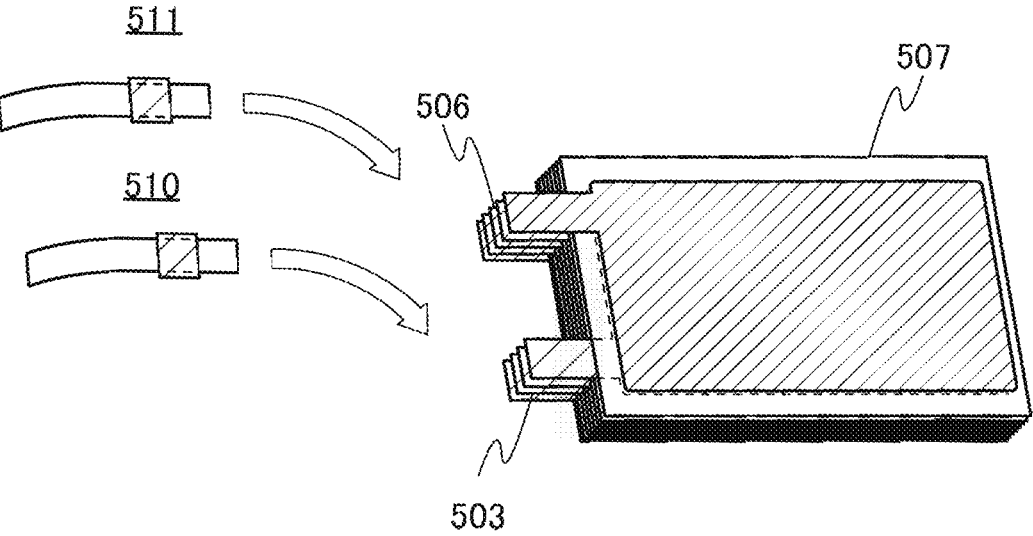

Next, the negative electrode 506, the separator 507, and the positive electrode 503 are stacked. FIG. 10B illustrates the negative electrodes 506, the separators 507, and the positive electrodes 503 that are stacked. Here, an example in which five negative electrodes and four positive electrodes are used is described. The component can also be referred to as a stack including the negative electrodes, the separators, and the positive electrodes.

Then, the tab regions of the positive electrodes 503 are bonded to one another, and the positive electrode lead electrode 510 is bonded to the tab region of the positive electrode on the outermost surface. The bonding is performed by ultrasonic welding, for example. In a similar manner, the tab regions of the negative electrodes 506 are bonded to one another, and the negative electrode lead electrode 511 is bonded to the tab region of the negative electrode on the outermost surface.

Next, the negative electrodes 506, the separators 507, and the positive electrodes 503 are placed over the exterior body 509.

Figure 11A:
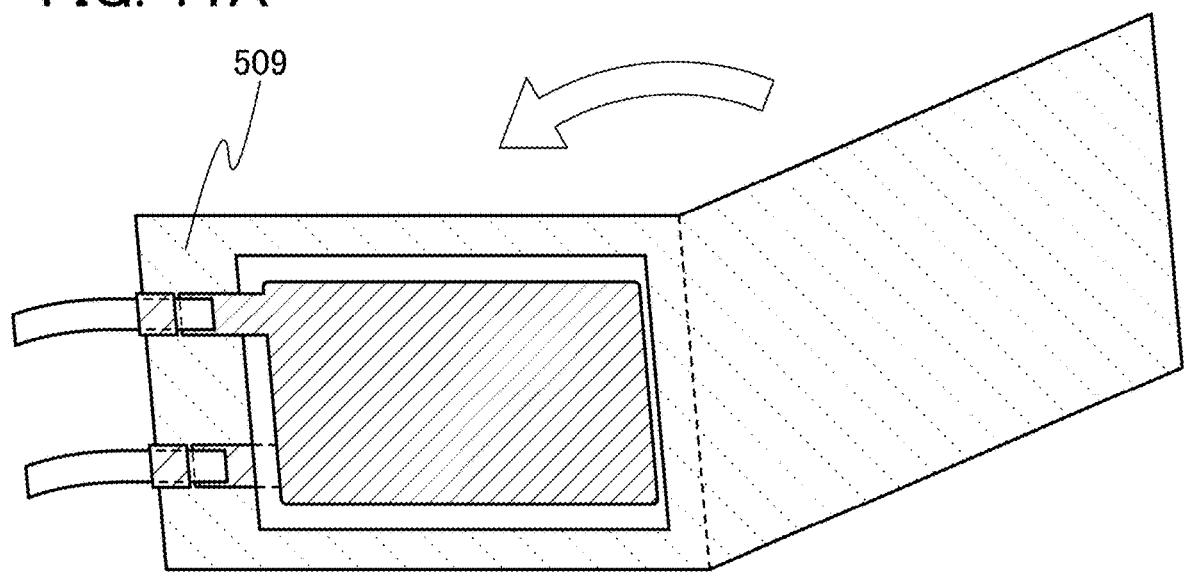
FIG. 11A and FIG. 11B are diagrams illustrating a method for fabricating a secondary battery.

Subsequently, the exterior body 509 is folded along a portion shown by a dashed line as illustrated in FIG. 11A. Then, the outer edges of the exterior body 509 are bonded to each other. The bonding is performed by thermocompression bonding, for example. At this time, an unbonded region (hereinafter referred to as an inlet 516) is provided for part (or one side) of the exterior body 509 so that an electrolyte 508 can be introduced later.

Figure 11B:
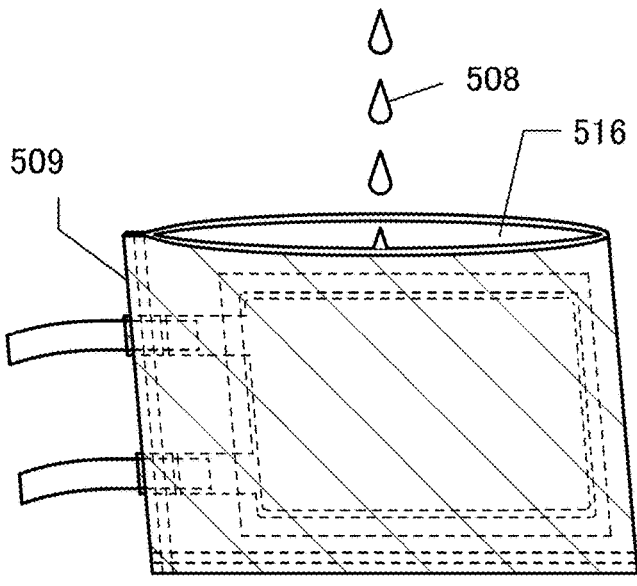

Next, as illustrated in FIG. 11B, the electrolyte 508 is introduced into the exterior body 509 from the inlet 516 of the exterior body 509. The electrolyte 508 is preferably introduced in a reduced-pressure atmosphere or in an inert atmosphere. Lastly, the inlet 516 is bonded. In the above manner, the laminated secondary battery 500 can be fabricated.

In the above, the positive electrode lead electrode 510 and the negative electrode lead electrode 511 on the same side are led out to the outside of the exterior body, whereby the secondary battery 500 illustrated in FIG. 9A is fabricated. The positive electrode lead electrode 510 and the negative electrode lead electrode 511 on opposite sides are led out to the outside of the exterior body, whereby the secondary battery 500 illustrated in FIG. 9B can be fabricated.

<Cylindrical Secondary Battery>

Figure 12A:
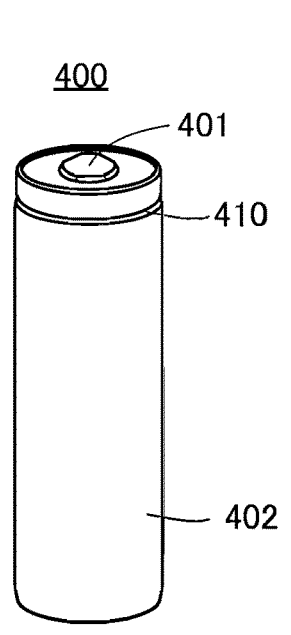
FIG. 12A and FIG. 12B are diagrams illustrating an example of a secondary battery.

An example of a cylindrical secondary battery is described with reference to FIG. 12A. A cylindrical secondary battery 400 includes, as illustrated in FIG. 12A, a positive electrode cap (battery lid) 401 on a top surface and a battery can (outer can) 402 on a side surface and a bottom surface. The positive electrode cap 401 and the battery can (outer can) 402 are insulated from each other by a gasket (insulating packing) 410.

Figure 12B:
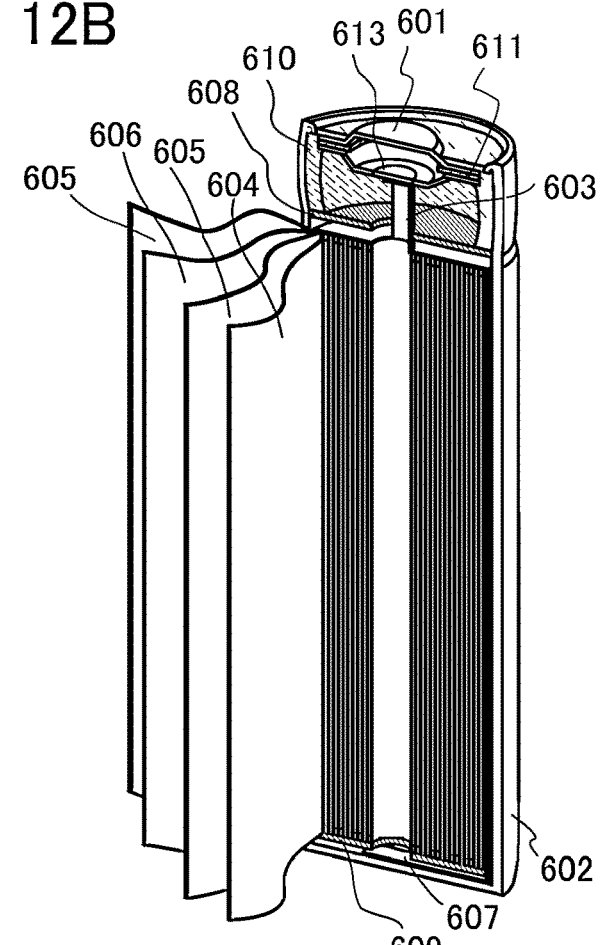

FIG. 12B is a schematic cross-sectional diagram of a cylindrical secondary battery. The cylindrical secondary battery illustrated in FIG. 12B includes a positive electrode cap (battery lid) 601 on a top surface and a battery can (outer can) 602 on a side surface and a bottom surface. The positive electrode cap and the battery can (outer can) 602 are insulated from each other by a gasket (insulating gasket) 610.

Inside the battery can 602 having a hollow cylindrical shape, a battery element in which a strip-like positive electrode 604 and a strip-like negative electrode 606 are wound with a separator 605 located therebetween is provided. Although not illustrated, the battery element is wound around a center pin. One end of the battery can 602 is close and the other end thereof is open. For the battery can 602, a metal having corrosion resistance to an electrolyte solution, such as nickel, aluminum, or titanium, an alloy of such a metal, or an alloy of such a metal and another metal (e.g., stainless steel) can be used. The battery can 602 is preferably covered with nickel, aluminum, or the like in order to prevent corrosion due to the electrolyte solution. Inside the battery can 602, the battery element in which the positive electrode, the negative electrode, and the separator are wound is provided between a pair of insulating plates 608 and 609 that face each other. Furthermore, a nonaqueous electrolyte solution (not illustrated) is injected inside the battery can 602 provided with the battery element. As the nonaqueous electrolyte, a nonaqueous electrolyte that is similar to that for a coin-type secondary battery can be used.

Since a positive electrode and a negative electrode that are used for a cylindrical storage battery are wound, active materials are preferably formed on both surfaces of a current collector. A positive electrode terminal (positive electrode current collecting lead) 603 is connected to the positive electrode 604, and a negative electrode terminal (negative electrode current collecting lead) 607 is connected to the negative electrode 606. Both the positive electrode terminal 603 and the negative electrode terminal 607 can be formed using a metal material such as aluminum. The positive electrode terminal 603 and the negative electrode terminal 607 are resistance-welded to a safety valve mechanism 613 and the bottom of the battery can 602, respectively. The safety valve mechanism 613 is electrically connected to the positive electrode cap 601 through a PTC element (Positive Temperature Coefficient) 611. The safety valve mechanism 613 cuts off electrical connection between the positive electrode cap 601 and the positive electrode 604 when the internal pressure of the battery exceeds a predetermined threshold. In addition, the PTC element 611 is a thermally sensitive resistor whose resistance increases as temperature rises, and limits the amount of current by increasing the resistance to prevent abnormal heat generation. Barium titanate ($BaTiO_3$)-based semiconductor ceramics or the like can be used for the PTC element.

Figure 12C:
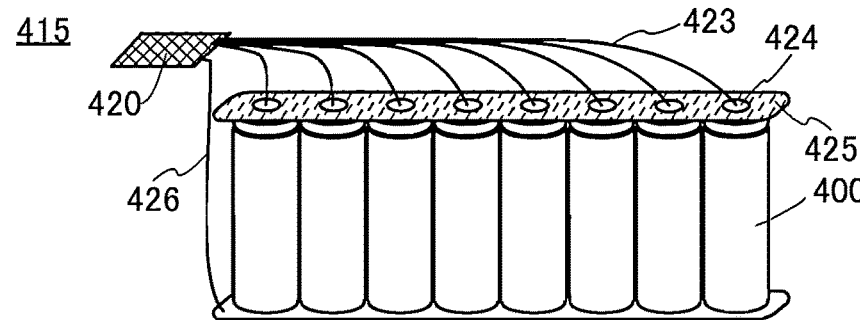
FIG. 12C and FIG. 12D are diagrams illustrating examples of a power storage system.

FIG. 12C illustrates an example of a power storage system 415. The power storage system 415 includes a plurality of the secondary batteries 400. Positive electrodes of the secondary batteries are each in contact with and electrically connected to a conductor 424 isolated by an insulator 425. The conductor 424 is electrically connected to a control system 420 through a wiring 423. Negative electrodes of the secondary batteries are each electrically connected to the control system 420 through a wiring 426. The control system described in the above embodiment can be used as the control system 420. The control system 420 includes the measurement circuit described in the above embodiment. In the power storage system 415, estimation of the states of the secondary batteries 400 can be performed using the measurement circuit of one embodiment of the present invention. The power storage system 415 has a function of determining the charging conditions or discharging conditions of the secondary batteries 400 on the basis of the states estimated by the measurement circuit of one embodiment of the present invention.

Figure 12D:
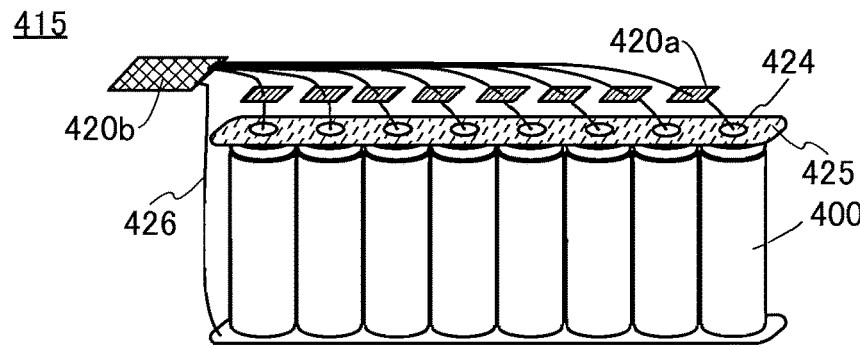

As illustrated in FIG. 12D, some components of the control system 420 included in the power storage system 415 may be provided as circuits 420*a*, each of which is a chip for each of the secondary batteries 400, and the other components may be provided as a circuit 420*b* as one chip. For example, among the components of the control system 420, the measurement circuit of one embodiment of the present invention may be included in each of the circuits 420*a*.

A temperature control device may be provided between the plurality of secondary batteries 400. When the secondary batteries 400 are heated excessively, the temperature control device can cool them, and when the secondary batteries 400 get too cold, the temperature control device can heat them. Thus, the performance of the power storage system 415 is not easily influenced by the outside temperature.

Although FIG. 12A or the like illustrates an example where the wound body including the positive electrode, the negative electrode, and the separator wound in accordance with the shape of the cylindrical can is included, a rectangular secondary battery can be obtained by making the wound body to fit the shape of a rectangular can, for example.

<Secondary Battery Pack>

Next, examples of the power storage system of one embodiment of the present invention will be described with reference to FIG. 13A to FIG. 13C.

Figure 13A:
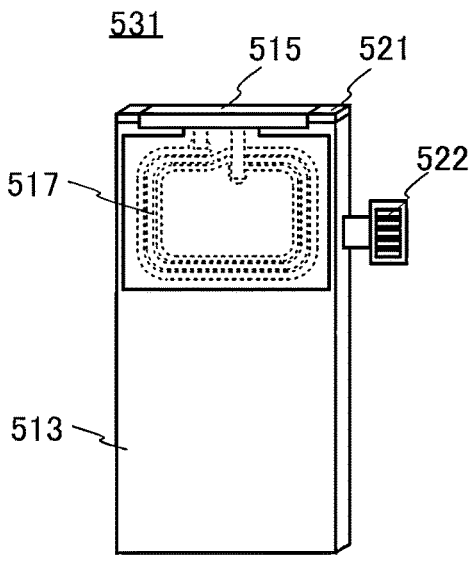
FIG. 13A to FIG. 13C are diagrams illustrating examples of a battery pack.
Figure 13B:
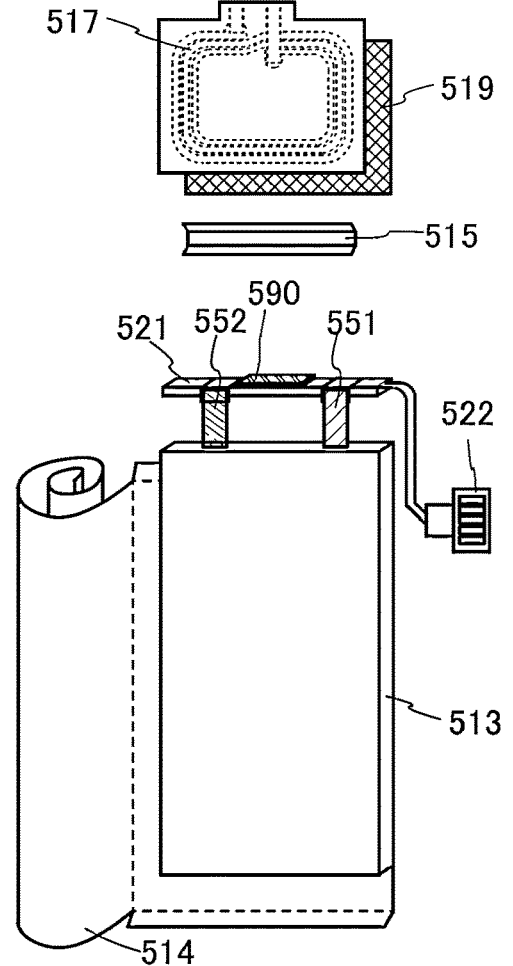

FIG. 13A is a diagram illustrating an external appearance of a secondary battery pack 531. FIG. 13B is a diagram illustrating a structure of the secondary battery pack 531. The secondary battery pack 531 includes a circuit board 521 and a secondary battery 513. The secondary battery 513 includes one 551 of a positive electrode lead and a negative electrode lead and the other 552 of the positive electrode lead and the negative electrode lead, and is covered with a label 514. The circuit board 521 is fixed by a sealant 515. The secondary battery pack 531 also includes an antenna 517.

The circuit board 521 is provided with a control system 590. The control system included in the power storage system described in the above embodiment can be used as the control system 590, and the control system 590 includes the measurement circuit described in the above embodiment. In the secondary battery pack 531, estimation of the state of the secondary battery 513 can be performed using the measurement circuit of one embodiment of the present invention. The secondary battery pack 531 has a function of determining the charging conditions or discharging conditions of the secondary battery 513 on the basis of the state estimated by the measurement circuit of one embodiment of the present invention. For example, the control system 590 is provided on the circuit board 521 as illustrated in FIG. 13B. The circuit board 521 is electrically connected to a terminal 522. The circuit board 521 is electrically connected to the antenna 517, the one 551 of the positive electrode lead and the negative electrode lead and the other 552 of the positive electrode lead and the negative electrode lead of the secondary battery 513.

Figure 13C:
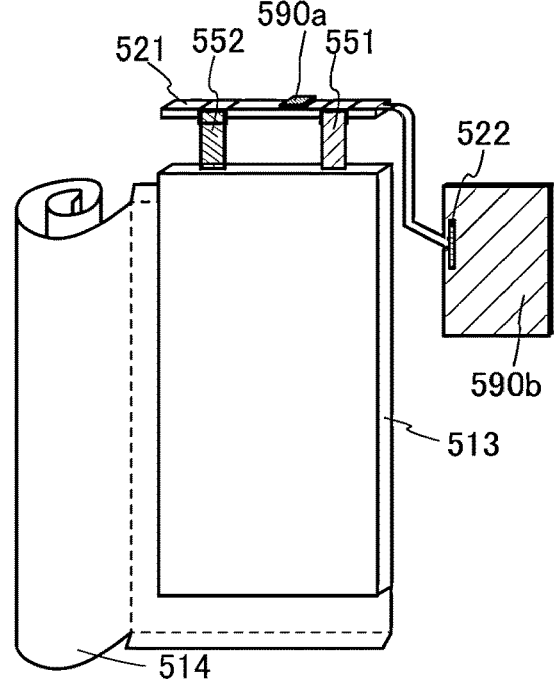

Alternatively, as illustrated in FIG. 13C, a circuit system 590*a* provided on the circuit board 521 and a circuit system 590*b* electrically connected to the circuit board 521 through the terminal 522 may be included. For example, a part of the control system of one embodiment of the present invention is provided in the circuit system 590*a*, and another part is provided in the circuit system 590*b*. The circuit system 590*a* preferably includes the measurement circuit of one embodiment of the present invention, for example.

The shape of the antenna 517 is not limited to a coil shape and may be a linear shape or a plate shape. An antenna such as a planar antenna, an aperture antenna, a traveling-wave antenna, an EH antenna, a magnetic-field antenna, or a dielectric antenna may be used. Alternatively, the antenna 517 may be a flat-plate conductor. This flat-plate conductor can serve as one of conductors for electric field coupling. That is, the antenna 517 may serve as one of two conductors of a capacitor. Thus, electric power can be transmitted and received not only by an electromagnetic field or a magnetic field but also by an electric field.

The secondary battery pack 531 includes a layer 519 between the antenna 517 and the secondary battery 513. The layer 519 has a function of blocking an electromagnetic field from the secondary battery 513, for example. For the layer 519, a magnetic material can be used, for instance.

The secondary battery 513 is obtained, for example, by winding a sheet of a stack in which the negative electrode and the positive electrode overlap each other with the separator positioned therebetween.

Examples of a variety of modes of secondary batteries will be described below.

<Another Secondary Battery and Fabrication Method Thereof 1>

Figure 14:
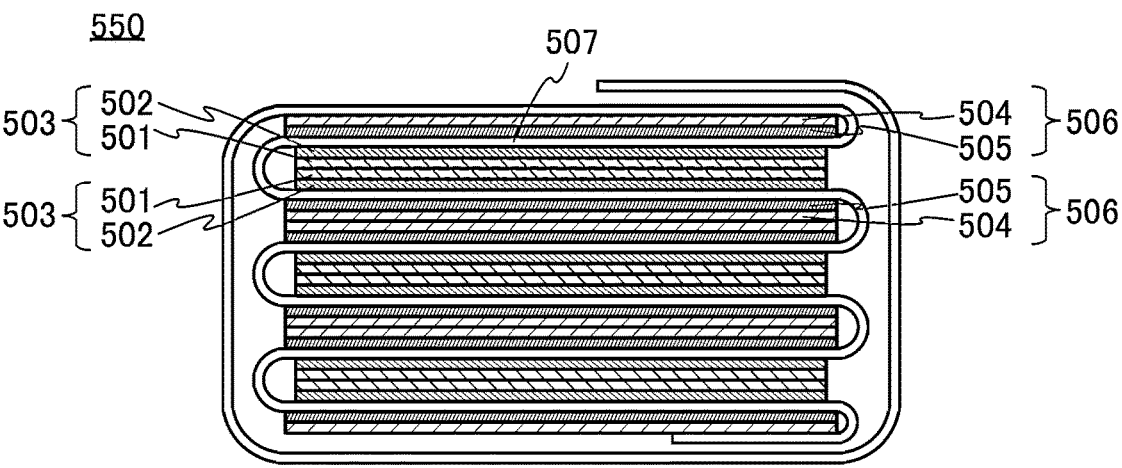
FIG. 14 is a cross-sectional view illustrating an example of a secondary battery.

FIG. 14 illustrates an example of a cross-sectional view of a stack of one embodiment of the present invention. A stack 550 illustrated in FIG. 14 is fabricated by placing one folded separator between the positive electrode and the negative electrode.

In the stack 550, one separator 507 is folded a plurality of times to be sandwiched between the positive electrode active material layer 502 and the negative electrode active material layer 505. Since six positive electrodes 503 and six negative electrodes 506 are stacked in FIG. 14, the separator 507 is folded at least five times. The separator 507 is provided to be sandwiched between the positive electrode active material layer 502 and the negative electrode active material layer 505 and to have an extending portion folded such that the plurality of positive electrodes 503 and the plurality of negative electrodes 506 may be bound together with a tape or the like.

After the positive electrode 503 is placed, an electrolyte can be dripped on the positive electrode 503 in the method for fabricating the secondary battery of one embodiment of the present invention. Similarly, after the negative electrode 506 is placed, an electrolyte can be dripped on the negative electrode 506. In the method for fabricating the secondary battery of one embodiment of the present invention, an electrolyte can be dripped on the separator 507 before the separator is folded or after the folded separator 507 overlaps with the negative electrode 506 or the positive electrode 503. When an electrolyte is dripped on at least one of the negative electrode 506, the separator 507, and the positive electrode 503, the negative electrode 506, the separator 507, or the positive electrode 503 can be impregnated with the electrolyte.

Figures 15A, 15B, 15C:
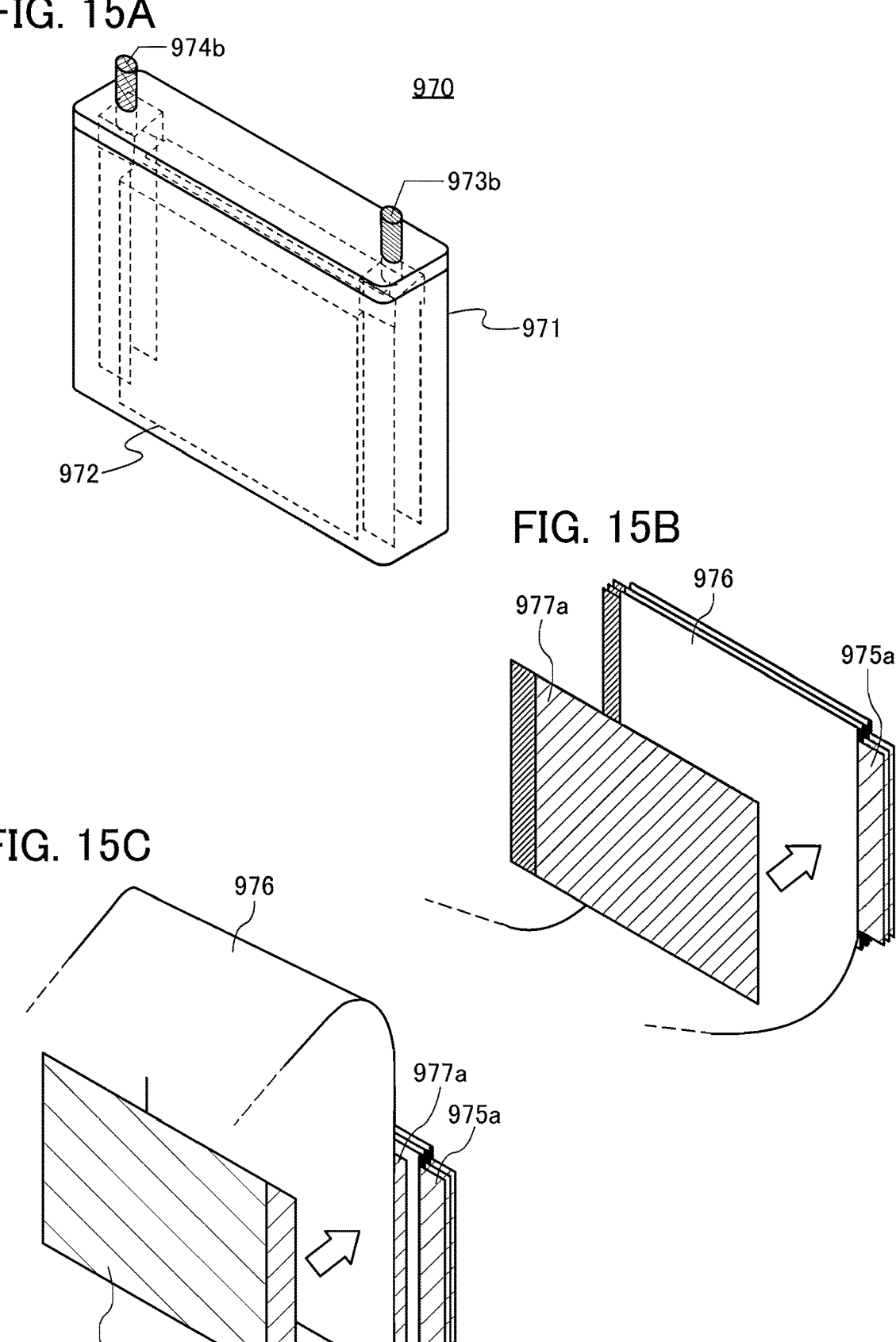
FIG. 15A is a diagram illustrating an example of a secondary battery.
FIG. 15B and FIG. 15C are diagrams illustrating an example of a method for fabricating a stack.

A secondary battery 970 illustrated in FIG. 15A includes a stack 972 inside a housing 971. A terminal 973b and a terminal 974b are electrically connected to the stack 972. At least part of the terminal 973b and at least part of the terminal 974b are exposed to the outside of the housing 971.

The stack 972 can have a stacked-layer structure of a positive electrode, a negative electrode, and a separator. Alternatively, the stack 972 can have a structure in which a positive electrode, a negative electrode, and a separator are wound, for example.

As the stack 972, the stack having the structure illustrated in FIG. 14 in which the separator is folded can be used, for example.

An example of a method for fabricating the stack 972 will be described with reference to FIG. 15B and FIG. 15C.

First, as illustrated in FIG. 15B, a belt-like separator 976 overlaps with a positive electrode 975a, and a negative electrode 977a overlaps with the positive electrode 975a with the separator 976 therebetween. After that, the separator 976 is folded to overlap with the negative electrode 977a. Next, as illustrated in FIG. 15C, a positive electrode 975b overlaps with the negative electrode 977a with the separator 976 therebetween. In this manner, the positive electrodes and the negative electrodes are sequentially placed with the folded separator therebetween, whereby the stack 972 can be fabricated. A structure including the stack fabricated in the above manner is sometimes referred to as a "zigzag structure".

Next, an example of a method for fabricating the secondary battery 970 will be described with reference to FIG. 16A to FIG. 16C.

Figure 16A:
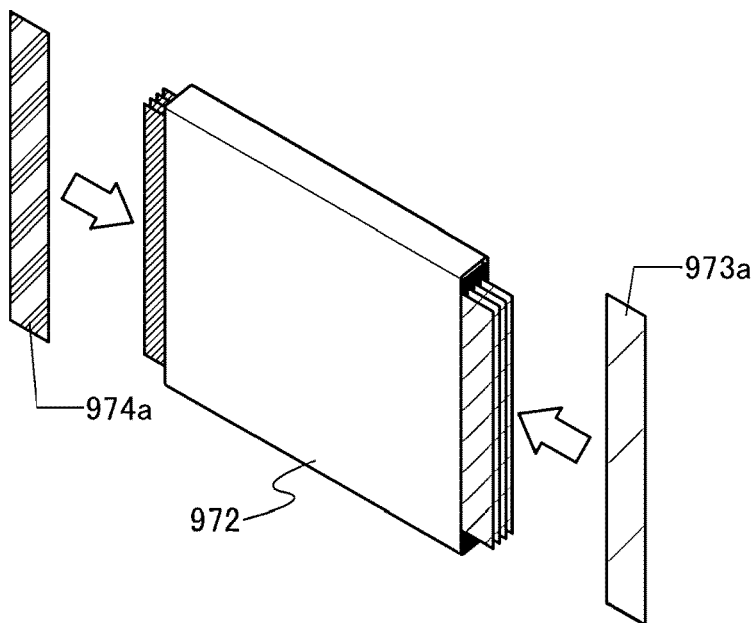
FIG. 16A to FIG. 16C are diagrams illustrating an example of a method for fabricating a secondary battery.
Figure 16B:
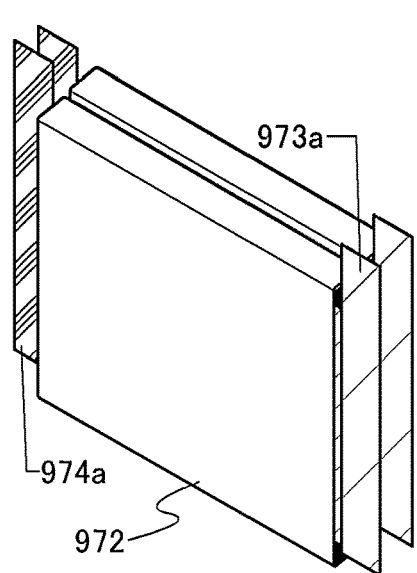

First, as illustrated in FIG. 16A, a positive electrode lead electrode 973a is electrically connected to the positive electrodes included in the stack 972. Specifically, for example, the positive electrodes included in the stack 972 are provided with tab regions, and the tab regions and the positive electrode lead electrode 973a can be electrically connected to each other by welding or the like. In addition, a negative electrode lead electrode 974a is electrically connected to the negative electrodes included in the stack 972.

One stack 972 may be placed inside the housing 971 or a plurality of stacks 972 may be placed inside the housing 971. FIG. 16B illustrates an example of preparing two stacks 972.

Figure 16C:
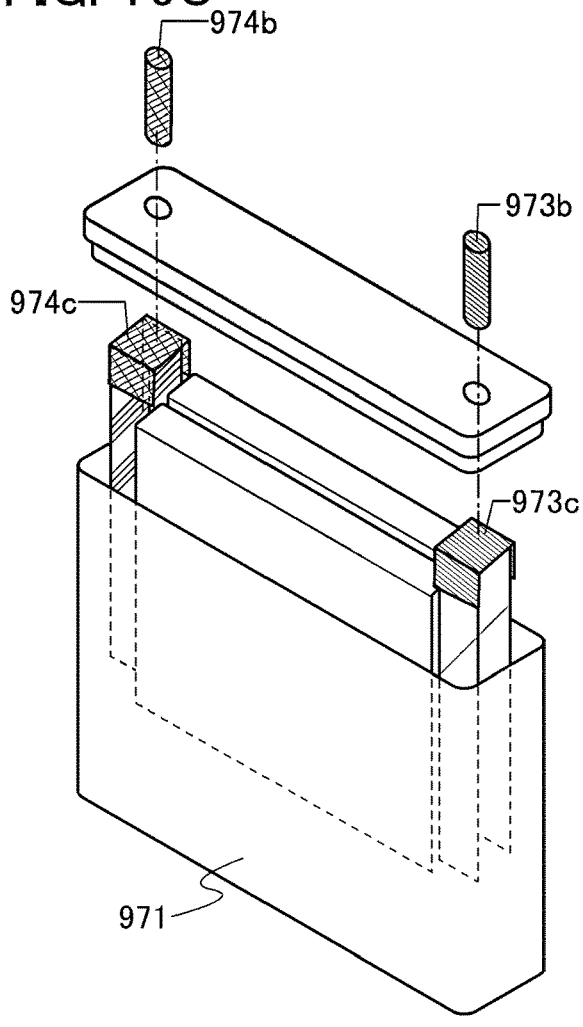

Next, as illustrated in FIG. 16C, the prepared stacks 972 are stored in the housing 971, and the terminal 973b and the terminal 974b are inserted to seal the housing 971. It is preferred to electrically connect a conductor 973c to each of the positive electrode lead electrodes 973a included in the plurality of stacks 972. In addition, it is preferred to electrically connect a conductor 974c to each of the negative electrode lead electrodes 974a included in the plurality of stacks 972. The terminal 973b and the terminal 974b are electrically connected to the conductor 973c and the conductor 974c, respectively. Note that the conductor 973c may include a conductive region and an insulating region. In addition, the conductor 974c may include a conductive region and an insulating region.

For the housing 971, a metal material (e.g., aluminum) can be used. In the case where a metal material is used for the housing 971, the surface is preferably coated with a resin or the like. Alternatively, a resin material can be used for the housing 971.

The housing 971 is preferably provided with a safety valve, an overcurrent protection element, or the like. A safety valve is a valve for releasing a gas, in order to prevent the battery from exploding, when the pressure inside the housing 971 reaches a predetermined pressure.

<Another Secondary Battery and Fabrication Method Thereof 2>

Figure 17A:
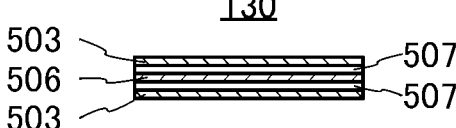
FIG. 17A and FIG. 17B are cross-sectional views illustrating examples of stacks.
Figure 17B:
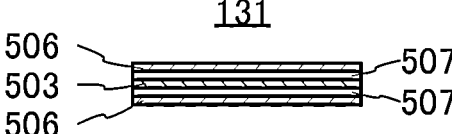
Figure 17C:
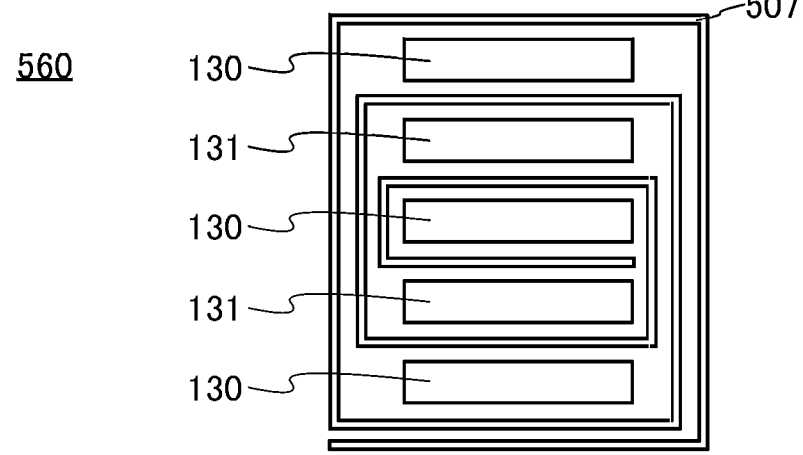
FIG. 17C is a cross-sectional view illustrating an example of a secondary battery.

FIG. 17C illustrates an example of a cross-sectional view of a secondary battery of another embodiment of the present invention. A secondary battery 560 illustrated in FIG. 17C is fabricated using a stack 130 illustrated in FIG. 17A and a stack 131 illustrated in FIG. 17B. In FIG. 17C, the stack 130, the stack 131, and the separator 507 are selectively illustrated for the sake of clarity of the drawing.

As illustrated in FIG. 17A, in the stack 130, the positive electrode 503 including the positive electrode active material layers on both surfaces of the positive electrode current collector, the separator 507, the negative electrode 506 including the negative electrode active material layers on both surfaces of the negative electrode current collector, the separator 507, and the positive electrode 503 including the positive electrode active material layers on both surfaces of the positive electrode current collector are stacked in this order.

As illustrated in FIG. 17B, in the stack 131, the negative electrode 506 including the negative electrode active material layers on both surfaces of the negative electrode current collector, the separator 507, the positive electrode 503 including the positive electrode active material layers on both surfaces of the positive electrode current collector, the separator 507, and the negative electrode 506 including the negative electrode active material layers on both surfaces of the negative electrode current collector are stacked in this order.

The method for fabricating the secondary battery of one embodiment of the present invention can be utilized for forming the stacks. Specifically, in order to form the stacks, an electrolyte is dripped on at least one of the negative electrode 506, the separator 507, and the positive electrode 503 at the time of stacking the negative electrode 506, the separator 507, and the positive electrode 503. Dripping a plurality of drops of the electrolyte enables the negative electrode 506, the separator 507, or the positive electrode 503 to be impregnated with the electrolyte.

As illustrated in FIG. 17C, a plurality of the stacks 130 and a plurality of the stacks 131 are covered with the wound separator 507.

After the stacks 130 are placed, an electrolyte can be dripped on the stacks 130 in the method for fabricating the secondary battery of one embodiment of the present invention. Similarly, after the stacks 131 are placed, an electrolyte can be dripped on the stacks 131. Moreover, an electrolyte can be dripped on the separator 507 before the separator 507 is folded or after the folded separator 507 overlaps with the stacks. Dripping a plurality of drops of the electrolyte enables the stacks 130, the stacks 131, or the separator 507 to be impregnated with the electrolyte.

<Another Secondary Battery and Fabrication Method Thereof 3>

A secondary battery of another embodiment of the present invention will be described with reference to FIG. 18A to FIG. 19C. The secondary battery described here can be referred to as a wound secondary battery or the like.

Figures 18A, 18B, 18C:
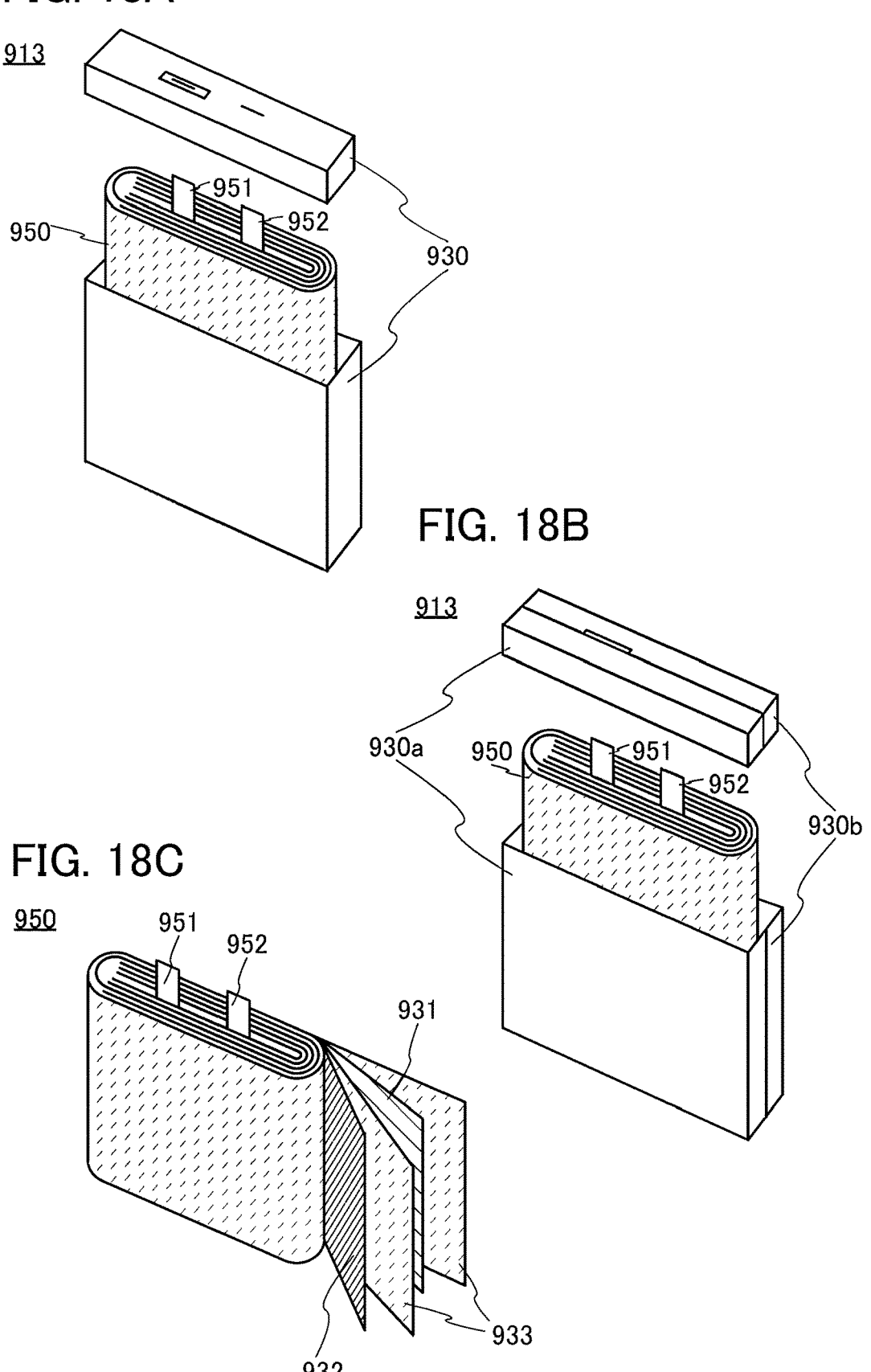
FIG. 18A and FIG. 18B are diagrams illustrating examples of a secondary battery.
FIG. 18C is a diagram illustrating an example of a wound body.

A secondary battery 913 illustrated in FIG. 18A includes a wound body 950 provided with a terminal 951 and a terminal 952 inside a housing 930. The wound body 950 is immersed in an electrolyte inside the housing 930. The terminal 952 is in contact with the housing 930. The use of an insulator or the like inhibits contact between the terminal 951 and the housing 930. Note that in FIG. 18A, the housing 930 divided into pieces is illustrated for convenience; however, in the actual structure, the wound body 950 is covered with the housing 930 and the terminal 951 and the terminal 952 extend to the outside of the housing 930. For the housing 930, a metal material (e.g., aluminum) or a resin material can be used.

Note that as illustrated in FIG. 18B, the housing 930 illustrated in FIG. 18A may be formed using a plurality of materials. For example, in the secondary battery 913 illustrated in FIG. 18B, a housing 930a and a housing 930b are bonded to each other, and the wound body 950 is provided in a region surrounded by the housing 930a and the housing 930b.

For the housing 930a, an insulating material such as an organic resin can be used. In particular, when a material such as an organic resin is used for the side on which an antenna is formed, blocking of an electric field by the secondary battery 913 can be inhibited. When an electric field is not significantly blocked by the housing 930a, an antenna may be provided inside the housing 930a. For the housing 930b, a metal material can be used, for example.

Furthermore, FIG. 18C illustrates the structure of the wound body 950. The wound body 950 includes a negative electrode 931, a positive electrode 932, and separators 933. The wound body 950 is a wound body obtained by winding a sheet of a stack in which the negative electrode 931 and the positive electrode 932 overlap with each other with the separator 933 therebetween. Note that a plurality of stacked layers each including the negative electrode 931, the positive electrode 932, and the separators 933 may be further stacked.

At the time of stacking the negative electrode 931, the separator 933, and the positive electrode 932 in the method for fabricating the secondary battery of one embodiment of the present invention, an electrolyte is dripped on at least one of the negative electrode 931, the separator 933, and the positive electrode 932. That is, an electrolyte is preferably dripped before the sheet of the stack is wound. Dripping a plurality of drops of the electrolyte enables the negative electrode 931, the separator 933, or the positive electrode 932 to be impregnated with the electrolyte.

Figure 19A:
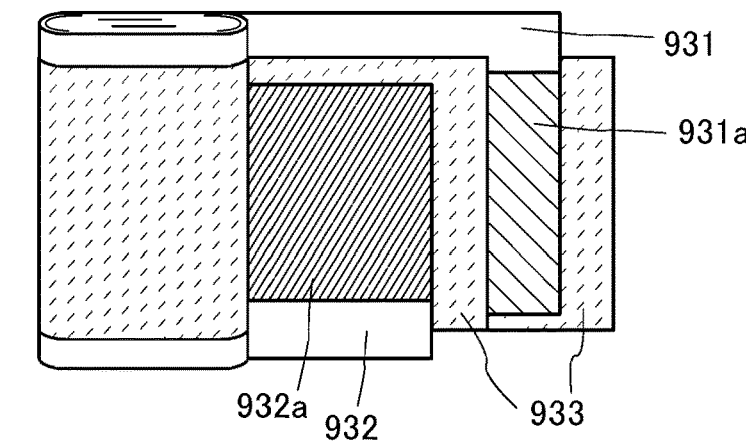
FIG. 19A is a diagram illustrating an example of a wound body of a secondary battery.

As illustrated in FIG. 19, the secondary battery 913 may include a wound body 950a. The wound body 950a illustrated in FIG. 19A includes the negative electrode 931, the positive electrode 932, and the separators 933. The negative electrode 931 includes a negative electrode active material layer 931a. The positive electrode 932 includes a positive electrode active material layer 932a.

The separator 933 has a larger width than the negative electrode active material layer 931a and the positive electrode active material layer 932a, and is wound to overlap with the negative electrode active material layer 931a and the positive electrode active material layer 932a. In terms of safety, the width of the negative electrode active material layer 931a is preferably larger than that of the positive electrode active material layer 932a. The wound body 950a having such a shape is preferable because of its high level of safety and high productivity.

Figure 19B:
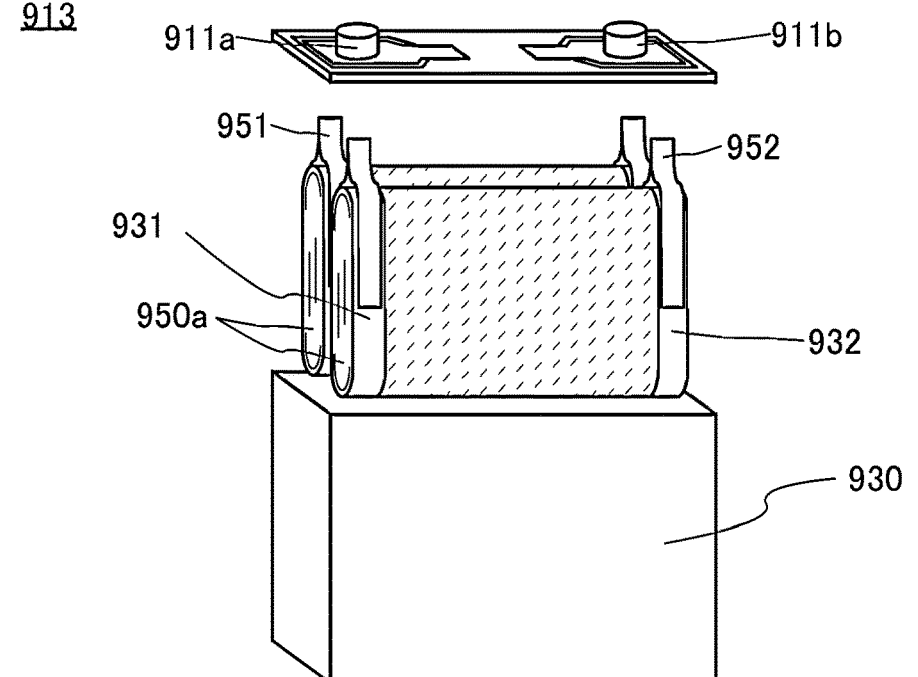
FIG. 19B is a diagram illustrating a structure example of the secondary battery.

As illustrated in FIG. 19B, the negative electrode 931 is electrically connected to the terminal 951. The terminal 951 is electrically connected to a terminal 911a. The positive electrode 932 is electrically connected to the terminal 952. The terminal 952 is electrically connected to a terminal 911b.

Figure 19C:
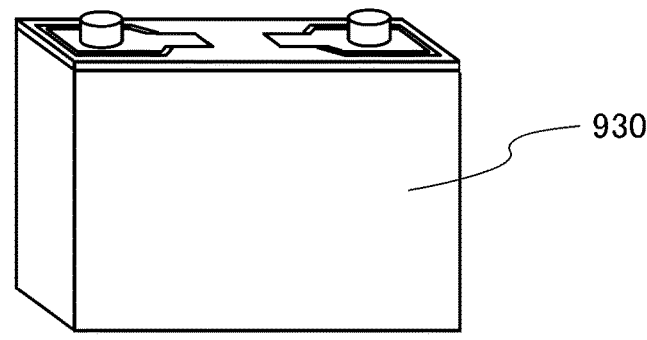
FIG. 19C is a diagram illustrating an example of the secondary battery.

As illustrated in FIG. 19C, the wound body 950a and an electrolyte are covered with the housing 930, whereby the secondary battery 913 is completed. The housing 930 is preferably provided with a safety valve, an overcurrent protection element, and the like. The safety valve is temporarily released, in order to prevent the battery from exploding, only when the internal pressure of the housing 930 exceeds a predetermined pressure.

As illustrated in FIG. 19B, the secondary battery 913 may include a plurality of wound bodies 950a. The use of the plurality of wound bodies 950a enables the secondary battery 913 to have higher charge and discharge capacity.

This embodiment can be combined with the other embodiments as appropriate.

Embodiment 4

In this embodiment, structure examples to which the power storage system of one embodiment of the present invention can be applied will be described with reference to FIG. 20A to FIG. 29C.

<Vehicle>

First, an example in which the power storage system of one embodiment of the present invention is used in an electric vehicle (EV) will be described.

Figures 20A, 20B, 20C:
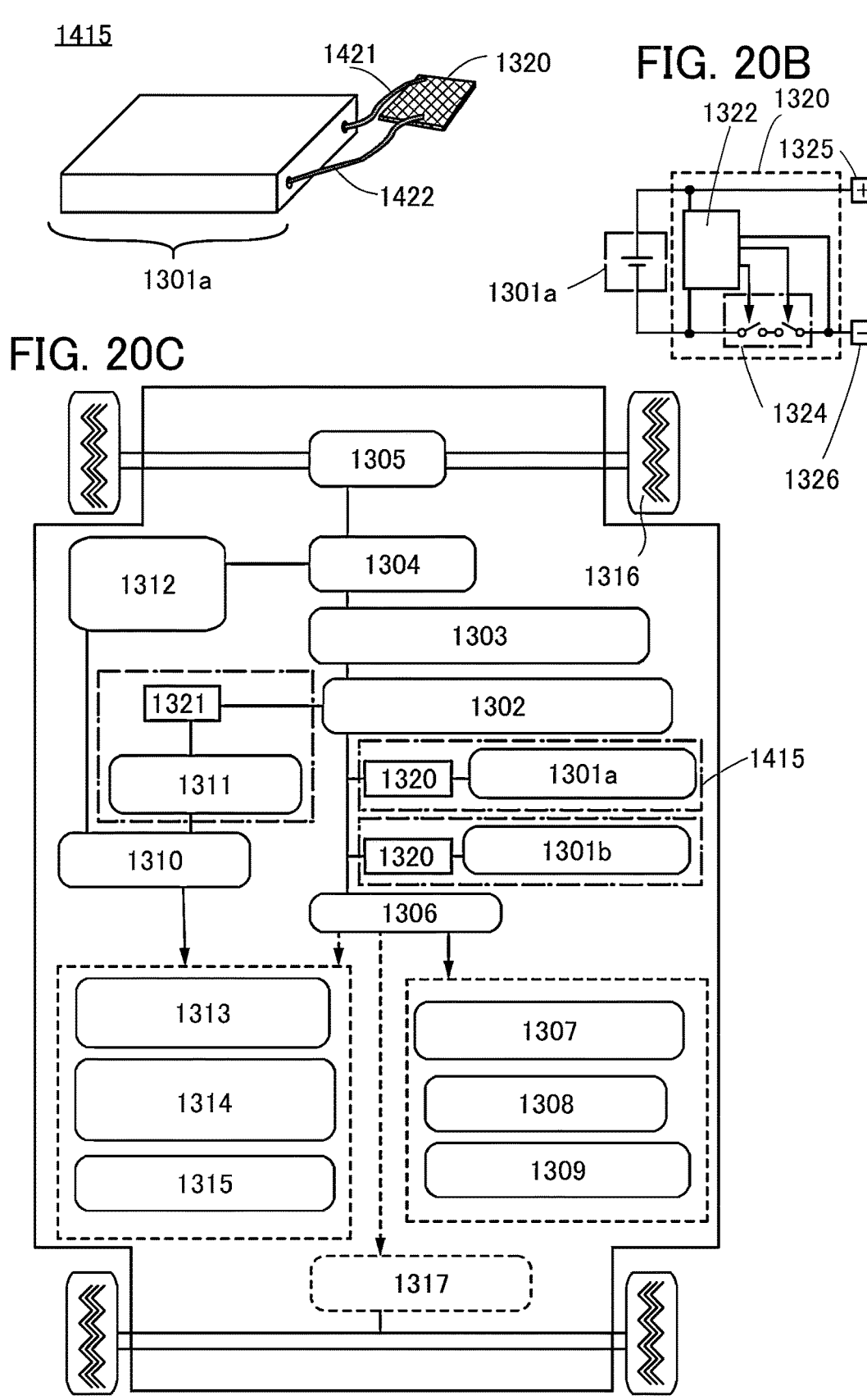
FIG. 20A is a perspective view illustrating an example of a battery pack.
FIG. 20B is a block diagram illustrating an example of the battery pack.
FIG. 20C is a block diagram illustrating an example of a vehicle including a motor.

FIG. 20C illustrates a block diagram of a vehicle including a motor. The electric vehicle is provided with a first battery 1301a and a first battery 1301b as main secondary batteries for driving and a second battery 1311 that supplies electric power to an inverter 1312 for starting a motor 1304. The second battery 1311 is also referred to as a cranking battery or a starter battery. The second battery 1311 only needs high output and high capacity is not so much needed; the capacity of the second battery 1311 is lower than that of the first battery 1301a and the first battery 1301b.

The secondary battery of one embodiment of the present invention can be used as one or both of the first battery 1301a and the first battery 1301b, for example.

Although an example in which two batteries, the first battery 1301a and the first battery 1301b, are connected in parallel is described in this embodiment, three or more batteries may be connected in parallel. In the case where the first battery 1301a can store sufficient electric power, the first battery 1301b may be omitted. With a battery pack including a plurality of secondary batteries, large electric power can be extracted. The plurality of secondary batteries may be connected in parallel, connected in series, or connected in series after being connected in parallel. The plurality of secondary batteries are also referred to as an assembled battery.

An in-vehicle secondary battery includes a service plug or a circuit breaker that can cut off high voltage without the use of equipment in order to cut off electric power from a plurality of secondary batteries. The first battery 1301a is provided with such a service plug or a circuit breaker.

Electric power from the first battery 1301a and the first battery 1301b is mainly used to rotate the motor 1304 and is also supplied to in-vehicle parts for 42 V (for a high-voltage system) (such as an electric power steering 1307, a heater 1308, and a defogger 1309) through a DCDC circuit 1306. In the case where there is a rear motor 1317 for the rear wheels, the first battery 1301a is used to rotate the rear motor 1317.

The second battery 1311 supplies electric power to in-vehicle parts for 14 V (for a low-voltage system) (such as an audio 1313, power windows 1314, and lamps 1315) through a DCDC circuit 1310.

The first battery 1301a will be described with reference to FIG. 20A.

FIG. 20A illustrates an example of a large battery pack 1415. One electrode of the battery pack 1415 is electrically connected to a control system 1320 through a wiring 1421. The other electrode is electrically connected to the control system 1320 through a wiring 1422. Note that the battery pack may have a structure in which a plurality of secondary batteries are connected in series.

The control system described in the above embodiment can be used as the control system 1320. The control system 1320 includes the measurement circuit described in the above embodiment. In the battery pack 1415 illustrated in FIG. 20A, estimation of the state of the first battery 1301a can be performed using the measurement circuit of one embodiment of the present invention. The battery pack 1415 has a function of determining the charging conditions or discharging conditions of the first battery 1301a on the basis of the state estimated by the measurement circuit of one embodiment of the present invention. Similarly, the second battery 1311 can perform control in accordance with the state estimated by the measurement circuit of one embodiment of the present invention.

The first batteries 1301a and 1301b mainly supply electric power to in-vehicle parts for 42 V (for a high-voltage system), and the second battery 1311 supplies electric power to in-vehicle parts for 14 V (for a low-voltage system). A lead storage battery is usually used for the second battery 1311 due to cost advantage. Lead storage batteries have disadvantages compared with lithium-ion batteries in that they have a larger amount of self-discharge and are more likely to deteriorate due to a phenomenon called sulfation. There is an advantage that the second battery 1311 can be maintenance-free when a lithium-ion battery is used; however, in the case of long-term use, for example three years or more, anomaly that is difficult to determine at the time of fabrication might occur. In particular, when the second battery 1311 that starts the inverter becomes inoperative, the motor cannot be started even when the first batteries 1301a and 1301b have remaining capacity; thus, in order to prevent this, in the case where the second battery 1311 is a lead storage battery, the second battery is supplied with electric power from the first battery to constantly maintain a fully-charged state.

In this embodiment, an example in which a lithium-ion battery is used as both the first battery 1301a and the second battery 1311 is described. As the second battery 1311, a lead storage battery, an all-solid-state battery, or an electric double layer capacitor may be used. The use of the all-solid-state battery as the second battery 1311 can achieve high capacity and reduction in size and weight.

Regenerative energy generated by rolling of tires 1316 is transmitted to the motor 1304 through a gear 1305, and is stored in the second battery 1311 from a motor controller 1303 or a battery controller 1302 through a control circuit portion 1321. Alternatively, the regenerative energy is stored in the first battery 1301a from the battery controller 1302 through the control system 1320. Alternatively, the regenerative energy is stored in the first battery 1301b from the battery controller 1302 through the control system 1320. For efficient charging with regenerative energy, the first batteries 1301a and 1301b are desirably capable of fast charging.

The battery controller 1302 can set the charge voltage, charge current, and the like of the first batteries 1301a and 1301b. The battery controller 1302 can set charging conditions in accordance with charging characteristics of a secondary battery to be used, so that fast charging can be performed.

Although not illustrated, in the case of connection to an external charger, a plug of the charger or a connection cable of the charger is electrically connected to the battery controller 1302. Electric power supplied from the external charger is stored in the first batteries 1301a and 1301b through the battery controller 1302. Some chargers are provided with a control circuit, in which case the function of the battery controller 1302 is not used; to prevent overcharging, the first batteries 1301a and 1301b are preferably charged through the control system 1320. In addition, a connection cable or a connection cable of the charger is sometimes provided with a control circuit. The control system 1320 is also referred to as an ECU (Electronic Control Unit). The ECU is connected to a CAN (Controller Area Network) provided in the electric vehicle. The CAN is a type of a serial communication standard used as an in-vehicle LAN. The ECU includes a microcomputer. Moreover, the ECU uses a CPU or a GPU.

External chargers installed at charging stations and the like have a 100 V outlet, a 200 V outlet, or a three-phase 200V outlet with 50 kW, for example. Furthermore, charging can be performed with electric power supplied from external charge equipment by a contactless power feeding method or the like.

FIG. 20B illustrates an example of the control system 1320. The control system 1320 illustrated in FIG. 20B includes a switch portion 1324 that includes at least a switch for preventing overcharging and a switch for preventing overdischarging, a control circuit 1322 for controlling the switch portion 1324, and a portion for measuring the voltage of the first battery 1301a. The control system 1320 is set to have the upper limit voltage and the lower limit voltage of the secondary battery to be used, and imposes the upper limit of current from the outside, the upper limit of output current to the outside, or the like. The range from the lower limit voltage to the upper limit voltage of the secondary battery is a recommended voltage range, and when a voltage falls outside the range, the switch portion 1324 operates and functions as a protection circuit. The control system 1320 can also be referred to as a protection circuit because it controls the switch portion 1324 to prevent overdischarging and/or overcharging. For example, when the control circuit 1322 detects a voltage that is likely to cause overcharging, current is interrupted by turning off the switch in the switch portion 1324. Furthermore, a function of interrupting current in accordance with a temperature rise may be set by providing a PTC element in the charging and discharging path. The control system 1320 includes an external terminal 1325 (+IN) and an external terminal 1326 (—IN).

Next, examples in which the secondary battery of one embodiment of the present invention is mounted on a vehicle, typically a transport vehicle, will be described. By mounting the secondary battery of one embodiment of the present invention on vehicles, next-generation clean energy vehicles such as hybrid vehicles (HVs), electric vehicles (EVs), and plug-in hybrid vehicles (PHVs) can be achieved. The secondary battery can also be mounted on transport vehicles such as agricultural machines such as electric tractors, motorized bicycles including motor-assisted bicycles, motorcycles, electric wheelchairs, electric carts, boats or ships, submarines, aircraft such as fixed-wing aircraft and rotary-wing aircraft, rockets, artificial satellites, space probes, planetary probes, and spacecraft. With the use of the secondary battery of one embodiment of the present invention, a large secondary battery can be obtained. Thus, the secondary battery of one embodiment of the present invention can be suitably used in transport vehicles.

Figure 21A:
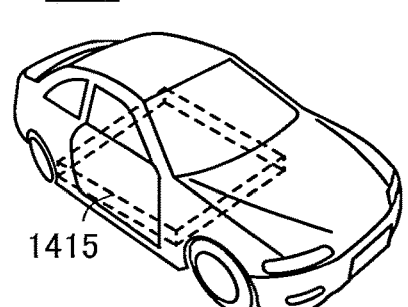
FIG. 21A to FIG. 21E are diagrams illustrating examples of transport vehicles.

FIG. 21A to FIG. 21E illustrate transport vehicles each using the secondary battery of one embodiment of the present invention. A motor vehicle 2001 illustrated in FIG. 21A is an electric vehicle that runs using an electric motor as a driving power source. Alternatively, the motor vehicle 2001 is a hybrid vehicle that can appropriately select an electric motor or an engine as a driving power source. In the case where the secondary battery is mounted on the vehicle, the secondary battery is provided at one position or several positions. The motor vehicle 2001 illustrated in FIG. 21A includes the battery pack 1415 illustrated in FIG. 20A. The battery pack 1415 includes a secondary battery module. The battery pack 1415 further includes a control system that is electrically connected to the secondary battery module. A control system including the measurement circuit described in the above embodiment can be used as the control system. The secondary battery module includes one or more secondary batteries.

The motor vehicle 2001 can be charged when the secondary battery included in the motor vehicle 2001 is supplied with electric power through external charging equipment by a plug-in system, a contactless power feeding system, or the like. In charging, a given method such as CHAdeMO (registered trademark) or Combined Charging System can be employed as a charging method, the standard of a connector, or the like as appropriate. A charging device may be a charging station provided in a commerce facility or a power source in a house. For example, with the use of the plug-in technique, a secondary battery mounted on the motor vehicle 2001 can be charged by being supplied with electric power from the outside. The charging can be performed by converting AC electric power into DC electric power through a converter such as an ACDC converter.

Although not illustrated, the vehicle may include a power receiving device so that it can be charged by being supplied with electric power from an above-ground power transmitting device in a contactless manner. In the case of the contactless power feeding system, by fitting a power transmitting device in a road or an exterior wall, charging can be performed not only when the vehicle is stopped but also when driven. In addition, the contactless power feeding system may be utilized to perform transmission and reception of electric power between two vehicles. Furthermore, a solar cell may be provided in the exterior of the vehicle to charge the secondary battery when the vehicle stops or moves. To supply electric power in such a contactless manner, an electromagnetic induction method or a magnetic resonance method can be used.

Figure 21B:
Figure 21B:
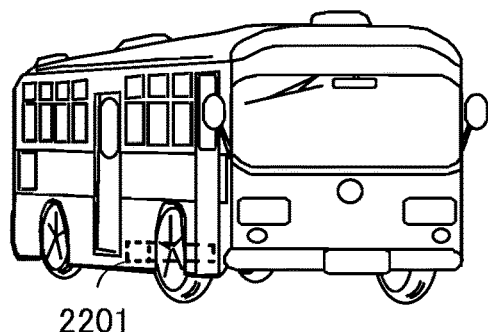

FIG. 21B illustrates a large transporter 2002 having a motor controlled by electricity as an example of a transport vehicle. A secondary battery module of the transporter 2002 includes a cell unit of four secondary batteries with 3.5 V or higher and 4.7 V or lower, for example, and 48 cells are connected in series to have a maximum voltage of 170 V. A battery pack 2201 has the same function as the battery pack in FIG. 21A except, for example, the number of secondary batteries configuring the secondary battery module; thus, the description is omitted.

Figure 21C:
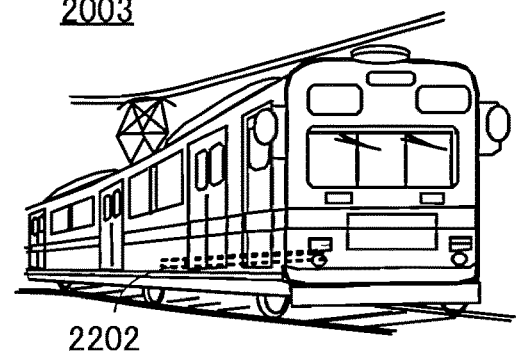

FIG. 21C illustrates a large transport vehicle 2003 having a motor controlled by electricity as an example. The secondary battery module of the transport vehicle 2003 has 100 or more secondary batteries with 3.5 V or higher and 4.7 V or lower connected in series, and the maximum voltage is 600 V, for example. Thus, the secondary batteries are required to have a small variation in the characteristics. With the use of the method for fabricating the secondary battery of one embodiment of the present invention, a secondary battery with stable battery performance can be fabricated, and mass production at low cost is possible in view of the yield. A battery pack 2202 has the same function as the battery pack in FIG. 21A except, for example, the number of secondary batteries configuring the secondary battery module; thus, the description is omitted.

Figure 21D:
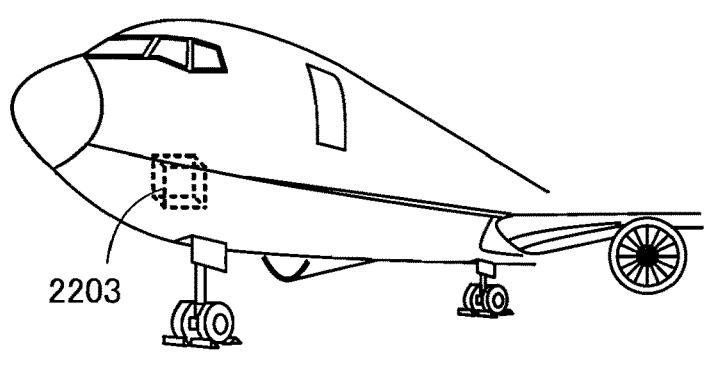

FIG. 21D illustrates an aircraft 2004 having a combustion engine as an example. The aircraft 2004 illustrated in FIG. 21D is regarded as a kind of transport vehicles because it has wheels for takeoff and landing, and includes a battery pack 2203 that includes a charging control device and a secondary battery module configured by connecting a plurality of secondary batteries.

The secondary battery module of the aircraft 2004 has eight 4 V secondary batteries connected in series and has a maximum voltage of 32 V, for example. The battery pack 2203 has the same function as the battery pack in FIG. 21A except, for example, the number of secondary batteries configuring the secondary battery module; thus, the description is omitted.

Figure 21E:
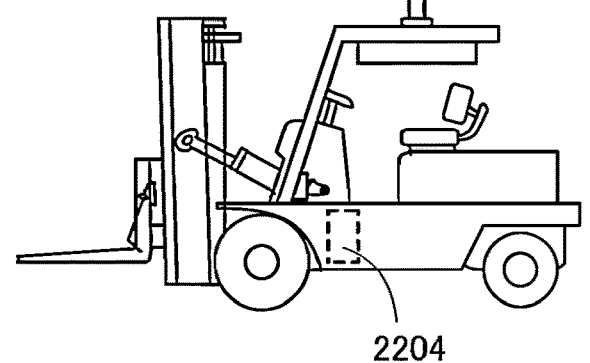

FIG. 21E illustrates, as an example, a transport vehicle 2005 that transports freight. The transport vehicle includes a motor controlled by electricity; a variety of operations are performed by electric power supplied from a secondary battery included in a secondary battery module of a battery pack 2204. The transport vehicle 2005 is not limited to be operated by a person riding thereon as a driver and can be operated unattended with the use of CAN communication or the like. Although FIG. 21E illustrates a forklift as an example, there is no particular limitation and a battery pack including the secondary battery of one embodiment of the present invention can be mounted on an industrial machine capable of being operated by CAN communication or the like, e.g., an automatic transport machine, a working robot, or small construction equipment.

Figure 22A:
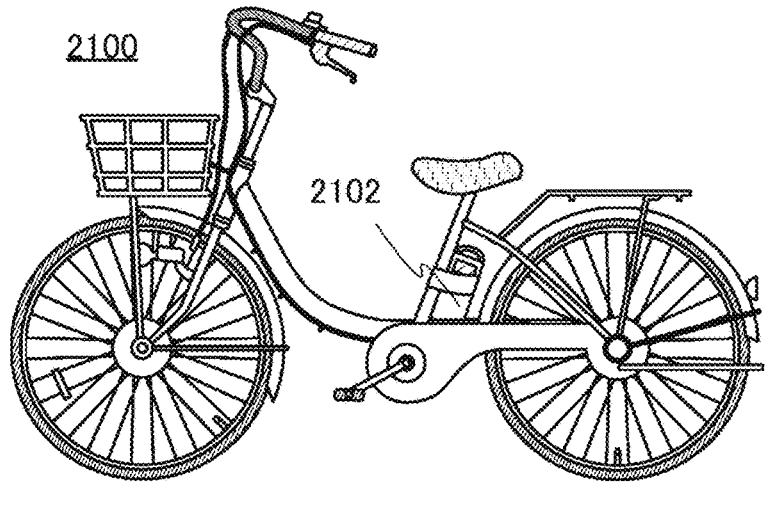
FIG. 22A is a diagram illustrating an electric bicycle.

FIG. 22A illustrates an example of an electric bicycle using the secondary battery of one embodiment of the present invention. The secondary battery of one embodiment of the present invention can be used for an electric bicycle 2100 illustrated in FIG. 22A. A power storage device 2102 illustrated in FIG. 22B includes, for example, a plurality of secondary batteries and a control system. As the control system, the control system of one embodiment of the present invention can be used.

Figure 22B:
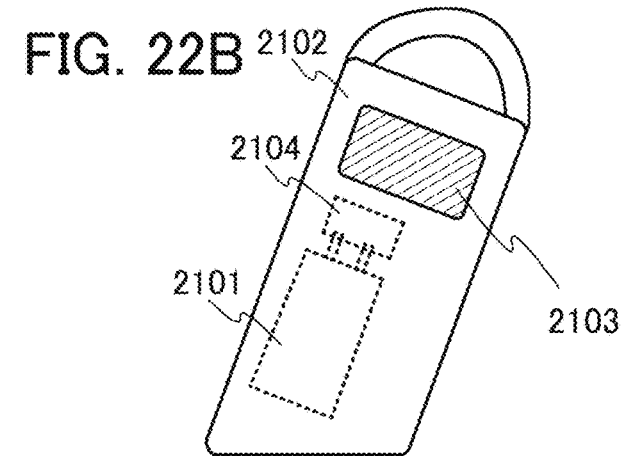
FIG. 22B is a diagram illustrating a secondary battery of the electric bicycle.

The electric bicycle 2100 includes the power storage device 2102. The power storage device 2102 can supply electricity to a motor that assists a rider. The power storage device 2102 is portable, and FIG. 22B illustrates the state where the power storage device 2102 is detached from the bicycle. A plurality of secondary batteries 2101 of one embodiment of the present invention are incorporated in the power storage device 2102, and the remaining battery capacity and the like can be displayed on a display portion 2103. The power storage device 2102 includes a control system 2104 that capable of estimating and controlling the state of a secondary battery, which is exemplified in one embodiment of the present invention. The control system 2104 preferably includes the measurement circuit described in the above embodiment. The control system 2104 is electrically connected to a positive electrode and a negative electrode of each of the secondary batteries 2101. The control system 2104 may be provided with a small solid-state secondary battery. When the control system 2104 is provided with the small solid-state secondary battery, electric power can be supplied to retain data in a memory circuit included in the control system 2104 for a long time. When the control system 2104 is used in combination with a secondary battery including a positive electrode using the positive electrode active material of one embodiment of the present invention, the synergy on safety can be obtained. The secondary battery including the positive electrode using the positive electrode active material of one embodiment of the present invention and the control system 2104 can greatly contribute to elimination of accidents due to secondary batteries, such as fires.

Figure 22C:
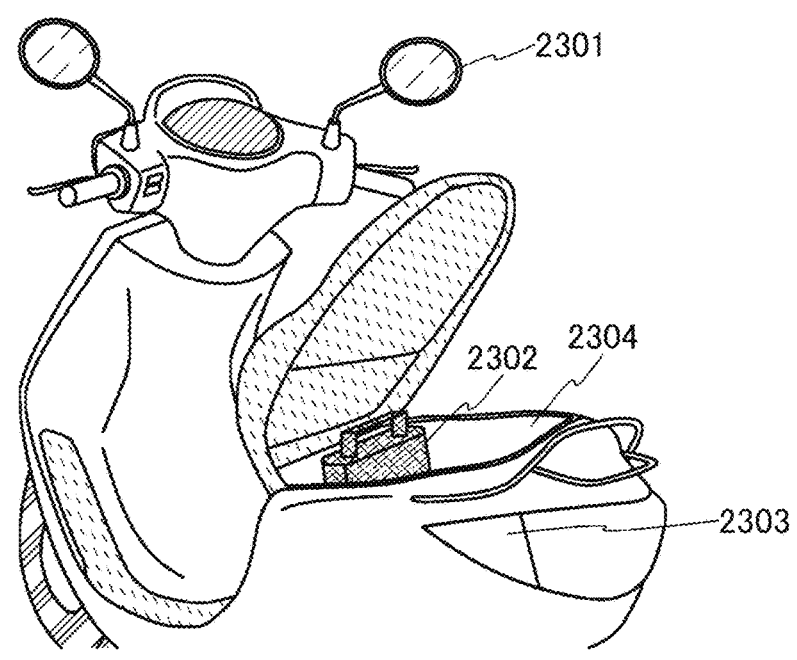
FIG. 22C is a diagram for describing an electric motorcycle.

FIG. 22C illustrates an example of a motorcycle including the secondary battery of one embodiment of the present invention. A motor scooter 2300 illustrated in FIG. 22C includes a power storage device 2302, side mirrors 2301, and indicator lights 2303. The power storage device 2302 can supply electricity to the indicator lights 2303. The power storage device 2302 including a plurality of secondary batteries including a positive electrode using the positive electrode active material of one embodiment of the present invention can have high capacity and contribute to a reduction in size. To improve safety, the control system of one embodiment of the present invention is preferably electrically connected to the secondary batteries.

In the motor scooter 2300 illustrated in FIG. 22C, the power storage device 2302 can be stored in an under-seat storage unit 2304. The power storage device 2302 can be stored in the under-seat storage unit 2304 even with a small size.

<Building>

Next, examples in which the secondary battery of one embodiment of the present invention is mounted on a building will be described with reference to FIG. 23.

Figure 23A:
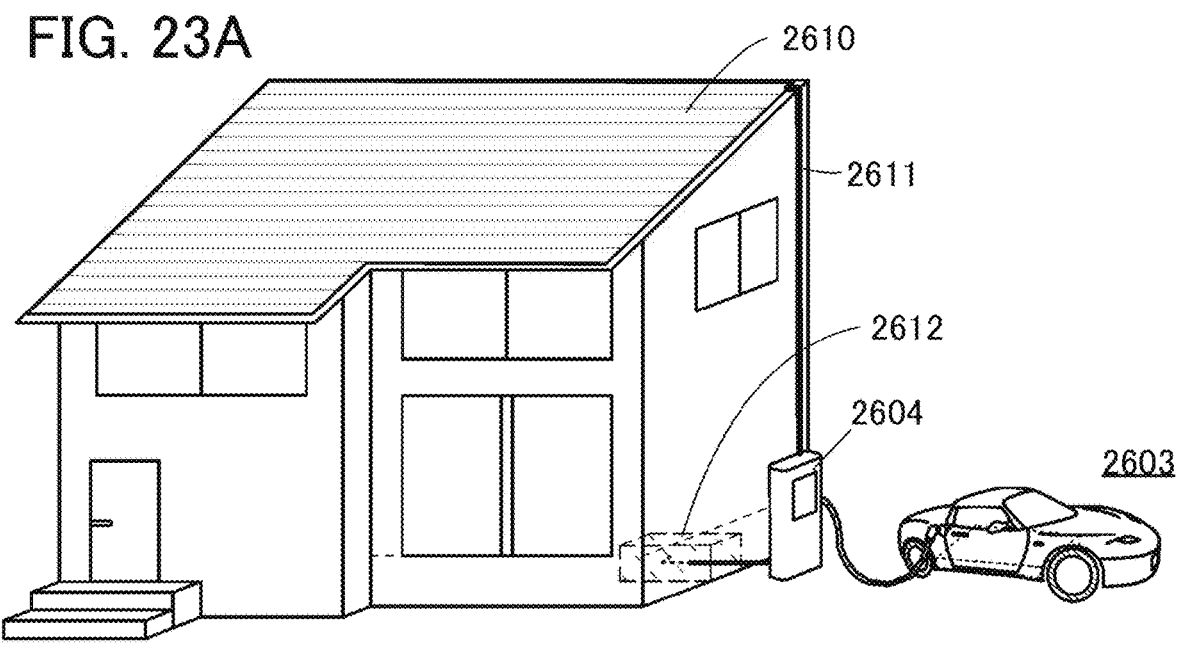
FIG. 23A and FIG. 23B are diagrams illustrating an example of a power storage device.

A house illustrated in FIG. 23A includes a power storage device 2612 including the secondary battery and a solar panel 2610. The power storage device 2612 is electrically connected to the solar panel 2610 through a wiring 2611 or the like. The power storage device 2612 may be electrically connected to a ground-based charging device 2604. The power storage device 2612 can be charged with electric power generated by the solar panel 2610. The secondary battery included in a vehicle 2603 can be charged with the electric power stored in the power storage device 2612 through the charging device 2604. The power storage device 2612 is preferably provided in an underfloor space. The power storage device 2612 is provided in the underfloor space, in which case the space on the floor can be effectively used. Alternatively, the power storage device 2612 may be provided on the floor.

The electric power stored in the power storage device 2612 can also be supplied to other electronic devices in the house. Thus, with the use of the power storage device 2612 as an uninterruptible power source, electronic devices can be used even when electric power cannot be supplied from a commercial power source due to power failure or the like.

Figure 23B:
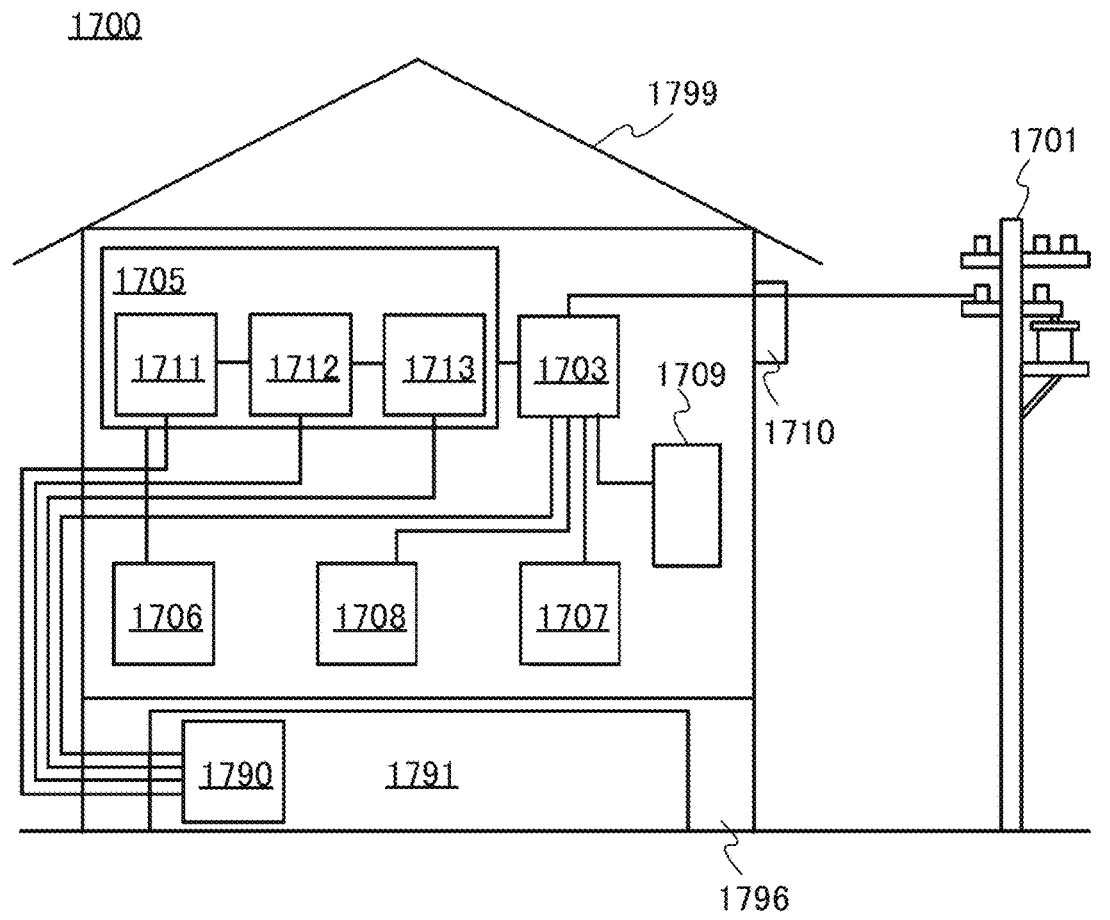

FIG. 23B illustrates an example of a power storage device 1700 of one embodiment of the present invention. As illustrated in FIG. 23B, a large storage battery 1791 to which the secondary battery of one embodiment of the present invention is applied is provided in an underfloor space 1796 of a building 1799. The storage battery 1791 is preferably electrically connected to the measurement circuit described in the above embodiment. The power storage device 1700 has a function of determining the charging conditions or discharging conditions of the storage battery 1791 on the basis of the state of the storage battery 1791 estimated by the measurement circuit of one embodiment of the present invention.

The storage battery 1791 is provided with a control device 1790, and the control device 1790 is electrically connected to a distribution board 1703, a power storage controller 1705 (also referred to as a control device), an indicator 1706, and a router 1709 through wirings.

Electric power is transmitted from a commercial power source 1701 to the distribution board 1703 through a service wire mounting portion 1710. Moreover, electric power is transmitted to the distribution board 1703 from the storage battery 1791 and the commercial power source 1701, and the distribution board 1703 supplies the transmitted electric power to a general load 1707 and a power storage load 1708 through outlets (not illustrated).

The general load 1707 is, for example, an electric device such as a TV or a personal computer. The power storage load 1708 is, for example, an electric device such as a microwave oven, a refrigerator, or an air conditioner.

The power storage controller 1705 includes a measuring portion 1711, a predicting portion 1712, and a planning portion 1713. The measuring portion 1711 has a function of measuring the amount of electric power consumed by the general load 1707 and the power storage load 1708 during a day (e.g., from midnight to midnight). The measuring portion 1711 may have a function of measuring the amount of electric power of the storage battery 1791 and the amount of electric power supplied from the commercial power source 1701. The predicting portion 1712 has a function of predicting, on the basis of the amount of electric power consumed by the general load 1707 and the power storage load 1708 during a given day, the demand for electric power consumed by the general load 1707 and the power storage load 1708 during the next day. The planning portion 1713 has a function of making a charging and discharging plan of the storage battery 1791 on the basis of the demand for electric power predicted by the predicting portion 1712.

The amount of electric power consumed by the general load 1707 and the power storage load 1708 and measured by the measuring portion 1711 can be checked with the indicator 1706. It can be checked with an electric device such as a TV or a personal computer through the router 1709. Furthermore, it can be checked with a portable electronic terminal such as a smartphone or a tablet through the router 1709. With the indicator 1706, the electric device, or the portable electronic terminal, for example, the demand for electric power depending on a time period (or per hour) that is predicted by the predicting portion 1712 can be checked.

<Electronic Device>

The secondary battery of one embodiment of the present invention can be used for one or both of an electronic device and a lighting device, for example. Examples of the electronic device include portable information terminals such as mobile phones, smartphones, and laptop computers; portable game machines; portable music players; digital cameras; and digital video cameras.

Figures 24A, 24B, 24C, 24D, 24E:
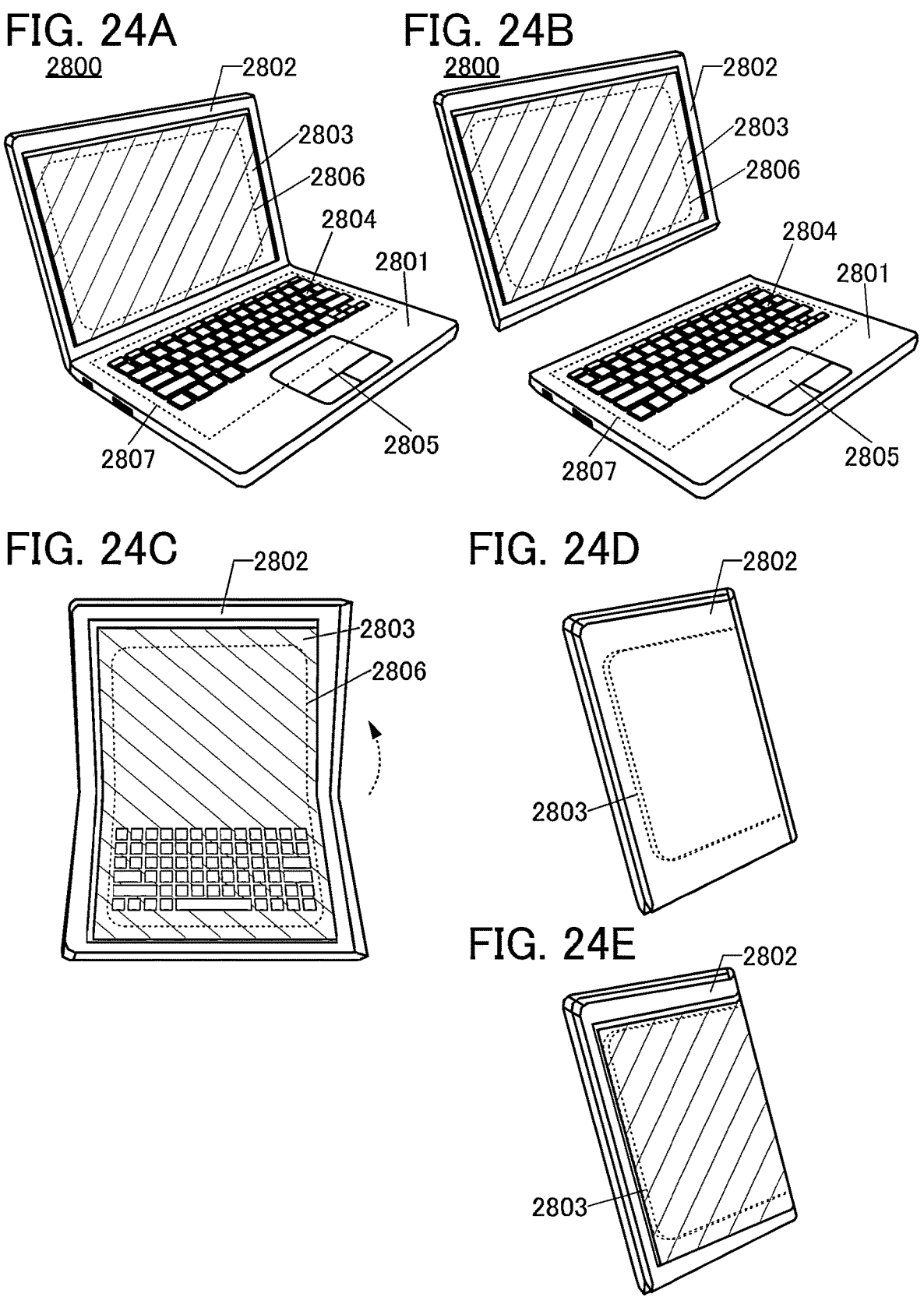
FIG. 24A to FIG. 24E are diagrams illustrating examples of electronic devices.

A personal computer 2800 illustrated in FIG. 24A includes a housing 2801, a housing 2802, a display portion 2803, a keyboard 2804, a pointing device 2805, and the like. A secondary battery 2807 is provided inside the housing 2801, and a secondary battery 2806 is provided inside the housing 2802. To improve safety, the control system of one embodiment of the present invention is preferably electrically connected to the secondary battery 2807. The use of the control system of one embodiment of the present invention can increase the density of energy of the secondary battery 2807 that can be used. Furthermore, the use of the control system of one embodiment of the present invention can extend the lifetime of the secondary battery. The control system includes the measurement circuit described in the above embodiment. A touch panel is used for the display portion 2803. As illustrated in FIG. 24B, the housing 2801 and the housing 2802 of the personal computer 2800 can be detached and the housing 2802 can be used alone as a tablet terminal.

A large secondary battery to which the secondary battery of one embodiment of the present invention can be applied can be used as one or both of the secondary battery 2806 and the secondary battery 2807. The shape of the secondary battery of one embodiment of the present invention can be changed freely by changing the shape of the exterior body. When the shapes of the secondary battery 2806 and the secondary battery 2807 fit with the shapes of the housing 2801 and the housing 2802, for example, the secondary batteries can have high capacity and thus the operating time of the personal computer 2800 can be lengthened. Moreover, the weight of the personal computer 2800 can be reduced.

A flexible display is used for the display portion 2803 of the housing 2802. The large secondary battery to which the secondary battery of one embodiment of the present invention can be applied is used as the secondary battery 2806. With the use of a flexible film as the exterior body in the large secondary battery to which the secondary battery of one embodiment of the present invention can be applied, a bendable secondary battery can be obtained. Thus, as illustrated in FIG. 24C, the housing 2802 can be used while being bent. In that case, part of the display portion 2803 can be used as a keyboard as illustrated in FIG. 24C.

Furthermore, the housing 2802 can be folded such that the display portion 2803 is placed inward as illustrated in FIG. 24D, and the housing 2802 can be folded such that the display portion 2803 faces outward as illustrated in FIG. 24E.

The secondary battery of one embodiment of the present invention can be used as a bendable secondary battery and mounted on an electronic device. The secondary battery can be incorporated along a curved inside/outside wall surface of a house or a building or a curved interior/exterior surface of an automobile.

Figures 25A, 25B, 25C, 25D, 25E, 25F, 25G, 25H:
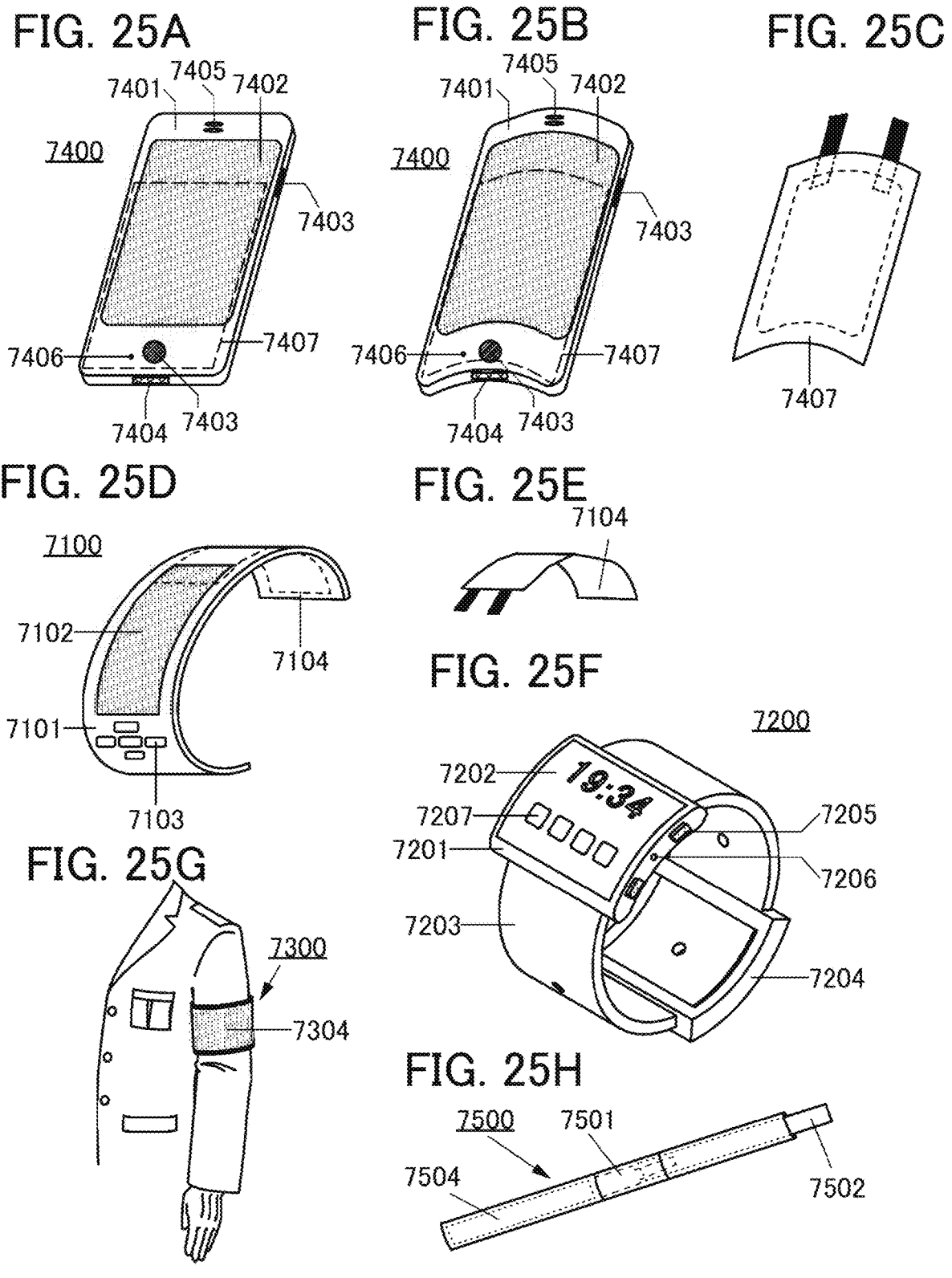
FIG. 25A to FIG. 25H are diagrams for describing examples of electronic devices.

FIG. 25A illustrates an example of a mobile phone. A mobile phone 7400 is provided with a display portion 7402 incorporated in a housing 7401, operation buttons 7403, an external connection port 7404, a speaker 7405, a microphone 7406, and the like. Note that the mobile phone 7400 includes a secondary battery 7407. When the secondary battery of one embodiment of the present invention is used as the secondary battery 7407, a lightweight mobile phone with a long lifetime can be provided. To improve safety, the control system of one embodiment of the present invention is preferably electrically connected to the secondary battery 7407. The use of the control system of one embodiment of the present invention can increase the density of energy of the secondary battery 7407 that can be used. Furthermore, the use of the control system of one embodiment of the present invention can extend the lifetime of the secondary battery. The control system includes the measurement circuit described in the above embodiment.

FIG. 25B illustrates the mobile phone 7400 that is curved. When the whole mobile phone 7400 is curved by external force, the secondary battery 7407 provided therein is also curved. FIG. 25C illustrates the secondary battery 7407 that is being bent at that time. The secondary battery 7407 is a thin storage battery. The secondary battery 7407 is fixed in a state of being bent. Note that the secondary battery 7407 includes a lead electrode electrically connected to a current collector. The current collector is, for example, copper foil, and partly alloyed with gallium; thus, adhesion between the current collector and an active material layer in contact with the current collector is improved and the secondary battery 7407 can have high reliability even in a state of being bent.

FIG. 25D illustrates an example of a bangle display device. A portable display device 7100 includes a housing 7101, a display portion 7102, operation buttons 7103, and a secondary battery 7104. To improve safety, the control system of one embodiment of the present invention is preferably electrically connected to the secondary battery 7407. FIG. 25E illustrates the secondary battery 7104 in a curved state. When the curved secondary battery 7104 is on a user's arm, the housing changes its shape and the curvature of part or the whole of the secondary battery 7104 is changed. Note that the bending condition of a curve at a given point that is represented by a value of the radius of a corresponding circle is referred to as the radius of curvature, and the reciprocal of the radius of curvature is referred to as curvature. Specifically, part or the whole of the housing or the main surface of the secondary battery 7104 is changed in the range of radius of curvature from 40 mm or more to 150 mm or less. When the radius of curvature at the main surface of the secondary battery 7104 is in the range from 40 mm or more to 150 mm or less, the reliability can be kept high. When the secondary battery of one embodiment of the present invention is used as the secondary battery 7104, a lightweight portable display device with a long lifetime can be provided.

FIG. 25F illustrates an example of a watch-type portable information terminal. A portable information terminal 7200 includes a housing 7201, a display portion 7202, a band 7203, a buckle 7204, an operation button 7205, an input/output terminal 7206, and the like.

The portable information terminal 7200 is capable of executing a variety of applications such as mobile phone calls, e-mailing, viewing and editing texts, music reproduction, Internet communication, and a computer game.

The display surface of the display portion 7202 is curved, and images can be displayed on the curved display surface. In addition, the display portion 7202 includes a touch sensor, and operation can be performed by touching the screen with a finger, a stylus, or the like. For example, by touching an icon 7207 displayed on the display portion 7202, application can be started.

With the operation button 7205, a variety of functions such as time setting, power on/off, on/off of wireless communication, setting and cancellation of a silent mode, and setting and cancellation of a power saving mode can be performed. For example, the functions of the operation button 7205 can be set freely by setting the operating system incorporated in the portable information terminal 7200.

The portable information terminal 7200 can perform near field communication that is standardized communication. For example, mutual communication between the portable information terminal 7200 and a headset capable of wireless communication enables hands-free calling.

The portable information terminal 7200 includes the input/output terminal 7206, and data can be directly transmitted to and received from another information terminal via a connector. In addition, charging via the input/output terminal 7206 is possible. Note that the charge operation may be performed by wireless power feeding without using the input/output terminal 7206.

The display portion 7202 of the portable information terminal 7200 includes the secondary battery of one embodiment of the present invention. When the secondary battery of one embodiment of the present invention is used, a lightweight portable information terminal with a long lifetime can be provided. To improve safety, a protection circuit that prevents overcharging and/or overdischarging of the secondary battery may be electrically connected to the secondary battery. For example, the secondary battery 7104 illustrated in FIG. 25E can be provided in the housing 7201 while being curved, or can be provided in the band 7203 such that it can be curved.

The portable information terminal 7200 preferably includes a sensor. As the sensor, for example, a human body sensor such as a fingerprint sensor, a pulse sensor, or a temperature sensor, a touch sensor, a pressure sensitive sensor, or an acceleration sensor is preferably mounted.

FIG. 25G illustrates an example of an armband display device. A display device 7300 includes a display portion 7304 and the secondary battery of one embodiment of the present invention. The control system of one embodiment of the present invention is preferably electrically connected to the secondary battery. The display device 7300 can include a touch sensor in the display portion 7304 and can serve as a portable information terminal.

The display surface of the display portion 7304 is curved, and images can be displayed on the curved display surface. A display state of the display device 7300 can be changed by, for example, near field communication that is standardized communication.

The display device 7300 includes an input/output terminal, and data can be directly transmitted to and received from another information terminal via a connector. In addition, charging via the input/output terminal is possible. Note that the charge operation may be performed by wireless power feeding without using the input/output terminal.

When the secondary battery of one embodiment of the present invention is used as the secondary battery included in the display device 7300, a lightweight display device with a long lifetime can be provided.

Examples of electronic devices each including the secondary battery of one embodiment of the present invention with excellent cycle performance are described with reference to FIG. 25H, FIG. 26, and FIG. 27.

When the secondary battery of one embodiment of the present invention is used as a secondary battery of an electronic device, a lightweight product with a long lifetime can be provided. Examples of the daily electronic device include an electric toothbrush, an electric shaver, and electric beauty equipment. As secondary batteries of these products, small and lightweight stick type secondary batteries with high capacity are desired in consideration of handling ease for users.

FIG. 25H is a perspective view of a device called a cigarette smoking device (electronic cigarette). In FIG. 25H, an electronic cigarette 7500 includes an atomizer 7501 including a heating element, a secondary battery 7504 that supplies electric power to the atomizer, and a cartridge 7502 including a liquid supply bottle, a sensor, or the like. To improve safety, a protection circuit that prevents overcharging and/or overdischarging of the secondary battery 7504 may be electrically connected to the secondary battery 7504. The secondary battery 7504 illustrated in FIG. 25H includes an external terminal for connection to a charger. When the electronic cigarette 7500 is held, the secondary battery 7504 is a tip portion; thus, it is preferred that the secondary battery 7504 have a short total length and be lightweight. With the secondary battery of one embodiment of the present invention, which has high capacity and excellent cycle performance, the small and lightweight electronic cigarette 7500 that can be used for a long time over a long period can be provided. The control system of one embodiment of the present invention is preferably electrically connected to the secondary battery.

Figures 26A, 26B, 26C:
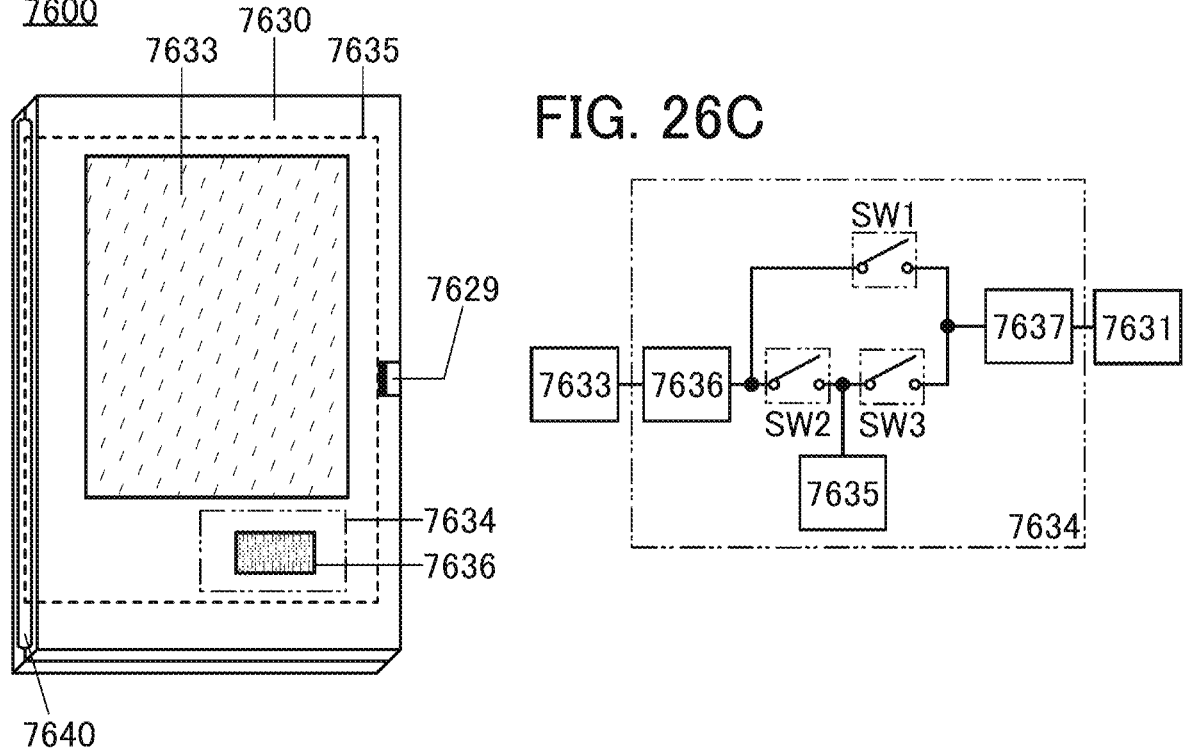
FIG. 26A to FIG. 26C are diagrams for describing an example of an electronic device.

Next, FIG. 26A and FIG. 26B illustrate an example of a tablet terminal that can be folded in half. A tablet terminal 7600 illustrated in FIG. 26A and FIG. 26B includes a housing 7630a, a housing 7630b, a movable portion 7640 connecting the housing 7630a and the housing 7630b to each other, a display portion 7631 including a display portion 7631a and a display portion 7631b, a switch 7625 to a switch 7627, a fastener 7629, and an operation switch 7628. A flexible panel is used for the display portion 7631, whereby a tablet terminal with a larger display portion can be provided. FIG. 26A illustrates the tablet terminal 7600 that is opened, and FIG. 26B illustrates the tablet terminal 7600 that is closed.

The tablet terminal 7600 includes a power storage unit 7635 inside the housing 7630a and the housing 7630b. The power storage unit 7635 is provided across the housing 7630a and the housing 7630b, passing through the movable portion 7640.

The entire region or part of the region of the display portion 7631 can be a touch panel region, and data can be input by touching text, an input form, an image including an icon, and the like displayed on the region. For example, it is possible that keyboard buttons are displayed on the entire display portion 7631a on the housing 7630a side, and data such as text or an image is displayed on the display portion 7631b on the housing 7630b side.

It is possible that a keyboard is displayed on the display portion 7631b on the housing 7630b side, and data such as text or an image is displayed on the display portion 7631a on the housing 7630a side. Furthermore, it is possible that a switching button for showing/hiding a keyboard on a touch panel is displayed on the display portion 7631 and the button is touched with a finger, a stylus, or the like to display a keyboard on the display portion 7631.

Touch input can be performed concurrently in a touch panel region in the display portion 7631a on the housing 7630a side and a touch panel region in the display portion 7631b on the housing 7630b side.

The switch 7625 to the switch 7627 may function not only as an interface for operating the tablet terminal 7600 but also as an interface that can switch various functions. For example, at least one of the switch 7625 to the switch 7627 may function as a switch for switching power on/off of the tablet terminal 7600. For another example, at least one of the switch 7625 to the switch 7627 may have a function of switching the display orientation between a portrait mode and a landscape mode or a function of switching display between monochrome display and color display. For another example, at least one of the switch 7625 to the switch 7627 may have a function of adjusting the luminance of the display portion 7631. The luminance of the display portion 7631 can be optimized in accordance with the amount of external light in use of the tablet terminal 7600 detected by an optical sensor incorporated in the tablet terminal 7600. Note that another sensing device including a sensor for sensing inclination, such as a gyroscope sensor or an acceleration sensor, may be incorporated in the tablet terminal, in addition to the optical sensor.

FIG. 26A illustrates an example in which the display portion 7631*a* on the housing 7630*a* side and the display portion 7631*b* on the housing 7630*b* side have substantially the same display area; however, there is no particular limitation on the display areas of the display portion 7631*a* and the display portion 7631*b*, and the display portions may have different sizes or different display quality. For example, one may be a display panel that can display higher-definition images than the other.

The tablet terminal 7600 is folded in half in FIG. 26B. The tablet terminal 7600 includes a housing 7630, a solar cell 7633, and a charging and discharging control circuit 7634 including a DCDC converter 7636. The secondary battery of one embodiment of the present invention is used as the power storage unit 7635.

Note that as described above, the tablet terminal 7600 can be folded in half, and thus can be folded when not in use such that the housing 7630*a* and the housing 7630*b* overlap with each other. By the folding, the display portion 7631 can be protected, which increases the durability of the tablet terminal 7600. With the power storage unit 7635 including the secondary battery of one embodiment of the present invention, which has high capacity and excellent cycle performance, the tablet terminal 7600 that can be used for a long time over a long period can be provided. To improve safety, the control system of one embodiment of the present invention is preferably electrically connected to the secondary battery included in the power storage unit 7635. The control system may include the charge and discharge control circuit 7634. The use of the control system of one embodiment of the present invention can increase the density of energy of the secondary battery that can be used. Furthermore, the use of the control system of one embodiment of the present invention can extend the lifetime of the secondary battery. The control system includes the measurement circuit described in the above embodiment.

In addition, the tablet terminal 7600 illustrated in FIG. 26A and FIG. 26B can also have a function of displaying various kinds of data (e.g., a still image, a moving image, and a text image), a function of displaying a calendar, a date, and the time on the display portion, a touch-input function of operating or editing data displayed on the display portion by touch input, a function of controlling processing by various kinds of software (programs), and the like.

The solar cell 7633, which is attached on the surface of the tablet terminal 7600, can supply electric power to a touch panel, a display portion, a video signal processing portion, and the like. Note that the solar cell 7633 can be provided on one surface or both surfaces of the housing 7630 and the power storage unit 7635 can be charged efficiently. The use of a lithium-ion battery as the power storage unit 7635 brings an advantage such as a reduction in size.

Examples of the structure and operation of the charging and discharging control circuit 7634 illustrated in FIG. 26B are described with reference to a block diagram in FIG. 26C. The solar cell 7633, the power storage unit 7635, the DCDC converter 7636, a converter 7637, a switch SW1 to a switch SW3, and the display portion 7631 are illustrated in FIG. 26C, and the power storage unit 7635, the DCDC converter 7636, the converter 7637, and the switch SW1 to the switch SW3 correspond to the charging and discharging control circuit 7634 illustrated in FIG. 26B.

First, an operation example in which electric power is generated by the solar cell 7633 using external light is described. The voltage of electric power generated by the solar cell is raised or lowered by the DCDC converter 7636 to a voltage for charging the power storage unit 7635. When the display portion 7631 is operated with the electric power from the solar cell 7633, the switch SW1 is turned on and the voltage is raised or lowered by the converter 7637 to a voltage needed for the display portion 7631. When display on the display portion 7631 is not performed, the switch SW1 is turned off and the switch SW2 is turned on, so that the power storage unit 7635 is charged.

Note that the solar cell 7633 is described as an example of a power generation unit; however, one embodiment of the present invention is not limited to this example. The power storage unit 7635 may be charged using another power generation unit such as a piezoelectric element or a thermoelectric conversion element (Peltier element). For example, the charging may be performed with a non-contact electric power transmission module that performs charging by transmitting and receiving electric power wirelessly (without contact), or with a combination of other charge units.

Figure 27:
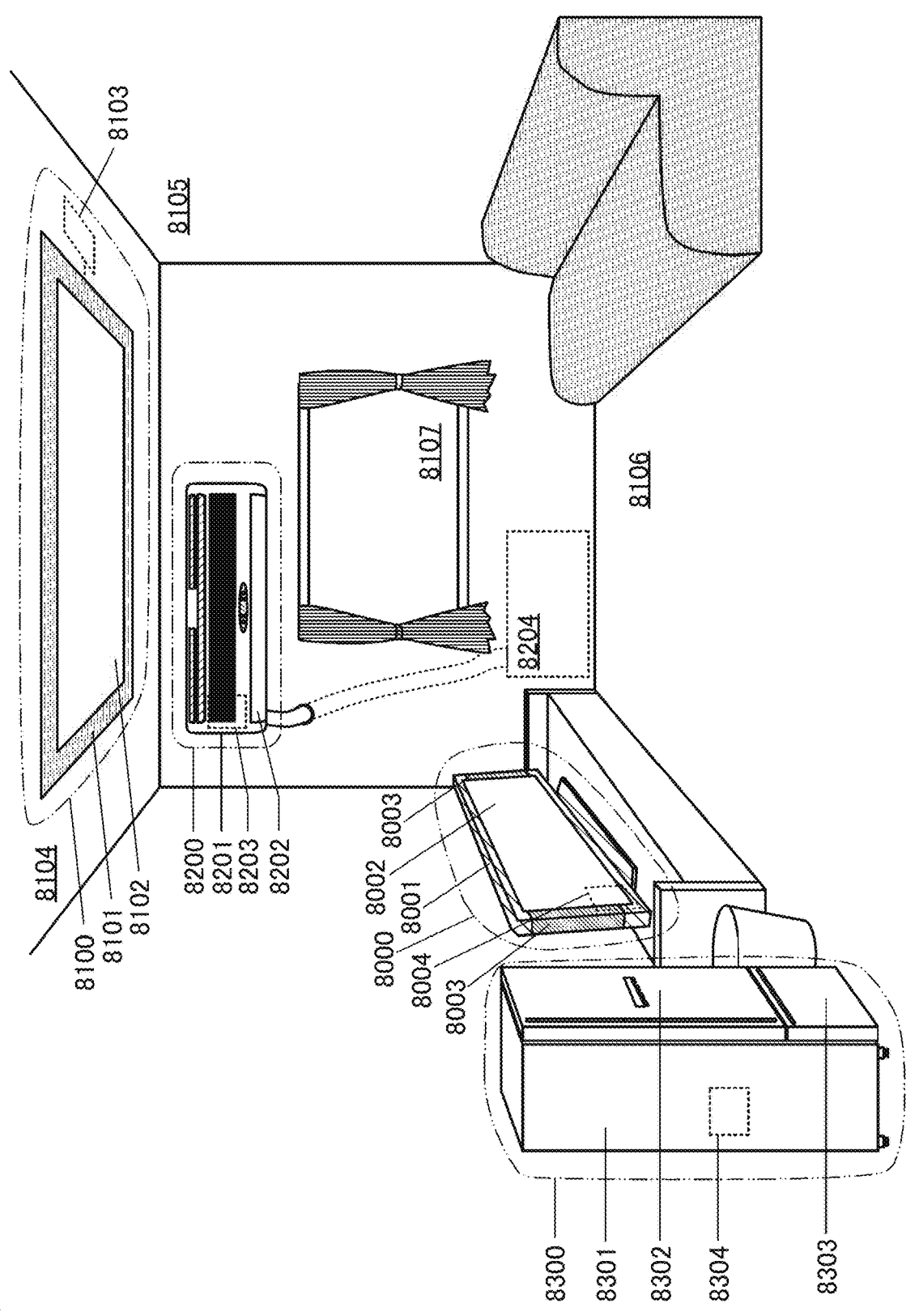
FIG. 27 is a diagram for describing examples of electronic devices.

FIG. 27 illustrates other examples of electronic devices. It is preferred that secondary batteries included in the electronic devices illustrated in FIG. 27 be each electrically connected to the control circuit of one embodiment of the present invention. In FIG. 27, a display device 8000 is an example of an electronic device including a secondary battery 8004 of one embodiment of the present invention. Specifically, the display device 8000 corresponds to a display device for TV broadcast reception and includes a housing 8001, a display portion 8002, speaker portions 8003, the secondary battery 8004, and the like. To improve safety, a protection circuit that prevents overcharging and/or overdischarging of the secondary battery 8004 may be electrically connected to the secondary battery 8004. The secondary battery 8004 of one embodiment of the present invention is provided in the housing 8001. The display device 8000 can be supplied with electric power from a commercial power source and can use electric power stored in the secondary battery 8004. Thus, the display device 8000 can be operated with the use of the secondary battery 8004 of one embodiment of the present invention as an uninterruptible power source even when electric power cannot be supplied from a commercial power source due to power failure or the like.

A semiconductor display device such as a liquid crystal display device, a light-emitting device in which a light-emitting element such as an organic EL element is provided in each pixel, an electrophoresis display device, a DMD (Digital Micromirror Device), a PDP (Plasma Display Panel), or an FED (Field Emission Display) can be used for the display portion 8002.

Note that the display device includes, in its category, all of information display devices for personal computers, advertisement displays, and the like besides information display devices for TV broadcast reception.

In FIG. 27, an installation lighting device 8100 is an example of an electronic device including a secondary battery 8103 of one embodiment of the present invention. Specifically, the lighting device 8100 includes a housing 8101, a light source 8102, the secondary battery 8103, and the like. To improve safety, a protection circuit that prevents overcharging and/or overdischarging of the secondary battery 8103 may be electrically connected to the secondary battery 8103. Although FIG. 27 illustrates the case where the secondary battery 8103 is provided in a ceiling 8104 on which the housing 8101 and the light source 8102 are installed, the secondary battery 8103 may be provided in the housing 8101. The lighting device 8100 can be supplied with electric power from a commercial power source and can use electric power stored in the secondary battery 8103. Thus, the lighting device 8100 can be operated with the use of the secondary battery 8103 of one embodiment of the present invention as an uninterruptible power source even when electric power cannot be supplied from a commercial power source due to power failure or the like.

Note that although the installation lighting device 8100 provided in the ceiling 8104 is illustrated in FIG. 27 as an example, the secondary battery of one embodiment of the present invention can be used in an installation lighting device provided in, for example, a side wall 8105, a floor 8106, or a window 8107 other than the ceiling 8104, and can be used in a tabletop lighting device or the like.

As the light source 8102, an artificial light source that emits light artificially by using electric power can be used. Specifically, an incandescent lamp, a discharge lamp such as a fluorescent lamp, and light-emitting elements such as an LED and/or an organic EL element are given as examples of the artificial light source.

In FIG. 27, an air conditioner including an indoor unit 8200 and an outdoor unit 8204 is an example of an electronic device including a secondary battery 8203 of one embodiment of the present invention. Specifically, the indoor unit 8200 includes a housing 8201, an air outlet 8202, the secondary battery 8203, and the like. To improve safety, a protection circuit that prevents overcharging and/or overdischarging of the secondary battery 8203 may be electrically connected to the secondary battery 8203. Although FIG. 27 illustrates the case where the secondary battery 8203 is provided in the indoor unit 8200, the secondary battery 8203 may be provided in the outdoor unit 8204. Alternatively, the secondary batteries 8203 may be provided in both the indoor unit 8200 and the outdoor unit 8204. The air conditioner can be supplied with electric power from a commercial power source and can use electric power stored in the secondary battery 8203. Particularly in the case where the secondary batteries 8203 are provided in both the indoor unit 8200 and the outdoor unit 8204, the air conditioner can be operated with the use of the secondary battery 8203 of one embodiment of the present invention as an uninterruptible power source even when electric power cannot be supplied from a commercial power source due to power failure or the like.

Note that although the split-type air conditioner including the indoor unit and the outdoor unit is illustrated in FIG. 27 as an example, the secondary battery of one embodiment of the present invention can be used in an air conditioner in which the function of an indoor unit and the function of an outdoor unit are integrated in one housing.

In FIG. 27, an electric refrigerator-freezer 8300 is an example of an electronic device including a secondary battery 8304 of one embodiment of the present invention. Specifically, the electric refrigerator-freezer 8300 includes a housing 8301, a refrigerator door 8302, a freezer door 8303, the secondary battery 8304, and the like. To improve safety, a protection circuit that prevents overcharging and/or overdischarging of the secondary battery 8304 may be electrically connected to the secondary battery 8304. The second-ary battery 8304 is provided in the housing 8301 in FIG. 27. The electric refrigerator-freezer 8300 can be supplied with electric power from a commercial power source and can use electric power stored in the secondary battery 8304. Thus, the electric refrigerator-freezer 8300 can be operated with the use of the secondary battery 8304 of one embodiment of the present invention as an uninterruptible power source even when electric power cannot be supplied from a commercial power source due to power failure or the like.

Note that among the electronic devices described above, a high-frequency heating apparatus such as a microwave oven and an electronic device such as an electric rice cooker require high electric power in a short time. Therefore, the tripping of a breaker of a commercial power source in use of the electronic device can be prevented by using the secondary battery of one embodiment of the present invention as an auxiliary power source for supplying electric power which cannot be supplied enough by a commercial power source.

In a time period when electronic devices are not used, particularly when the proportion of the amount of electric power which is actually used to the total amount of electric power which can be supplied from a commercial power supply source (such a proportion is referred to as a usage rate of electric power) is low, electric power is stored in the secondary battery, whereby an increase in the usage rate of electric power can be inhibited in a time period other than the above time period. For example, in the case of the electric refrigerator-freezer 8300, electric power is stored in the secondary battery 8304 in night time when the temperature is low and the refrigerator door 8302 and the freezer door 8303 are not opened or closed. Moreover, in daytime when the temperature is high and the refrigerator door 8302 and the freezer door 8303 are opened and closed, the usage rate of electric power in daytime can be kept low by using the secondary battery 8304 as an auxiliary power source.

According to one embodiment of the present invention, the secondary battery can have excellent cycle performance and improved reliability. Furthermore, according to one embodiment of the present invention, a secondary battery with high capacity can be obtained; thus, the secondary battery itself can be made more compact and lightweight as a result of improved characteristics of the secondary battery. Thus, the secondary battery of one embodiment of the present invention is used in the electronic device described in this embodiment, whereby a more lightweight electronic device with a longer lifetime can be obtained.

Figure 28A:
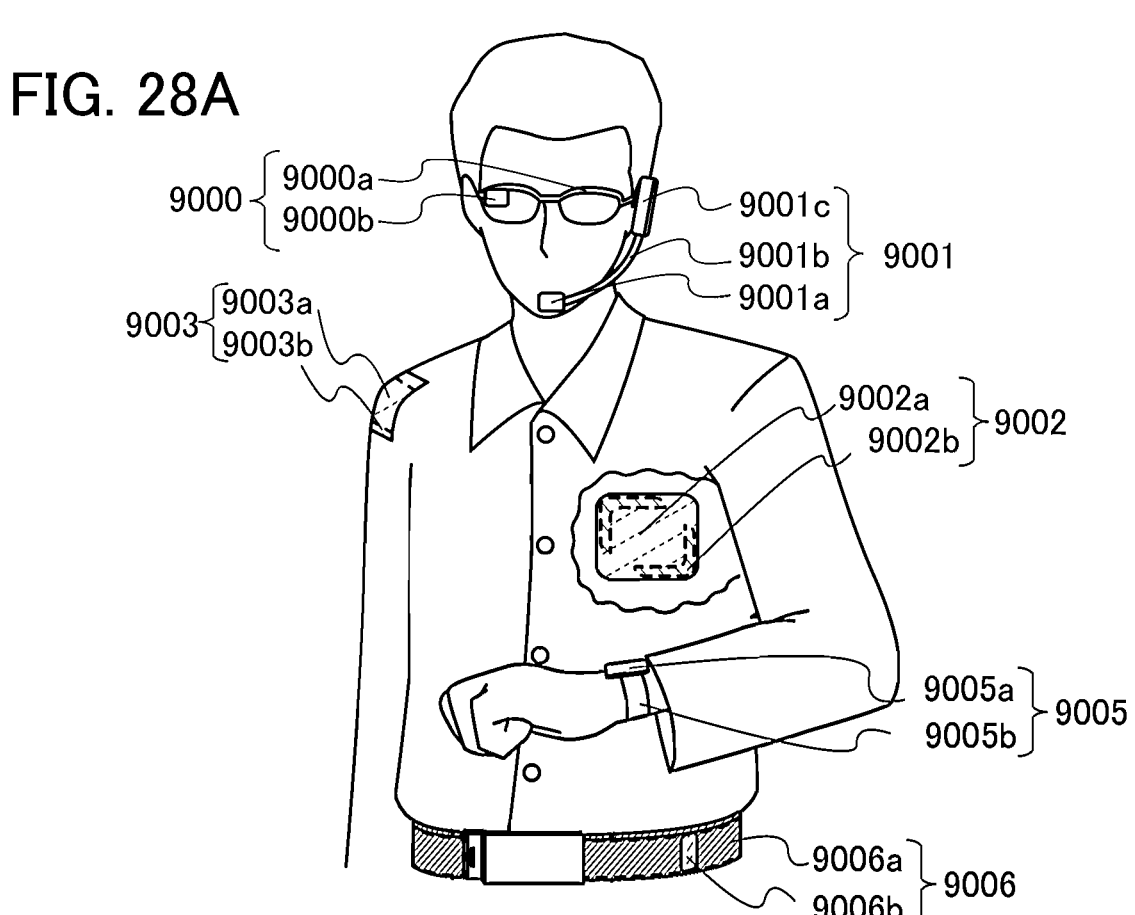
FIG. 28A to FIG. 28C are diagrams for describing an example of an electronic device.

FIG. 28A illustrates examples of wearable devices. A secondary battery is used as a power source of a wearable device. To have improved splash resistance, water resis-tance, or dust resistance in daily use or outdoor use by a user, a wearable device is desirably capable of being charged with and without a wire whose connector portion for connection is exposed.

For example, the secondary battery of one embodiment of the present invention can be provided in a glasses-type device 9000 illustrated in FIG. 28A. The glasses-type device 9000 includes a frame 9000*a* and a display part 9000*b*. The secondary battery is provided in a temple of the frame 9000*a* having a curved shape, whereby the glasses-type device 9000 can be lightweight, can have a well-balanced weight, and can be used continuously for a long time. It is preferred that the secondary battery be electrically connected to the control circuit of one embodiment of the present invention.

With the use of the secondary battery of one embodiment of the present invention, space saving required with downsizing of a housing can be achieved.

The secondary battery of one embodiment of the present invention can be provided in a headset-type device 9001. The headset-type device 9001 includes at least a microphone portion 9001a, a flexible pipe 9001b, and an earphone portion 9001c. The secondary battery can be provided in the flexible pipe 9001b or the earphone portion 9001c. To improve safety, a protection circuit that prevents overcharging and/or overdischarging of the secondary battery may be electrically connected to the secondary battery. With the use of the secondary battery of one embodiment of the present invention, space saving required with downsizing of a housing can be achieved.

The secondary battery of one embodiment of the present invention can be provided in a device 9002 that can be attached directly to a body. A secondary battery 9002b can be provided in a thin housing 9002a of the device 9002. To improve safety, a protection circuit that prevents overcharging and/or overdischarging of the secondary battery 9002b may be electrically connected to the secondary battery 9002b. With the use of the secondary battery of one embodiment of the present invention, space saving required with downsizing of a housing can be achieved.

The secondary battery of one embodiment of the present invention can be provided in a device 9003 that can be attached to clothes. A secondary battery 9003b can be provided in a thin housing 9003a of the device 9003. To improve safety, a protection circuit that prevents overcharging and/or overdischarging of the secondary battery 9003b may be electrically connected to the secondary battery 9003b. With the use of the secondary battery of one embodiment of the present invention, space saving required with downsizing of a housing can be achieved.

The secondary battery of one embodiment of the present invention can be provided in a belt-type device 9006. The belt-type device 9006 includes a belt portion 9006a and a wireless power feeding and receiving portion 9006b, and the secondary battery can be provided inside the belt portion 9006a. To improve safety, a protection circuit that prevents overcharging and/or overdischarging of the secondary battery may be electrically connected to the secondary battery. With the use of the secondary battery of one embodiment of the present invention, space saving required with downsizing of a housing can be achieved.

The secondary battery of one embodiment of the present invention can be provided in a watch-type device 9005. The watch-type device 9005 includes a display portion 9005a and a belt portion 9005b, and the secondary battery can be provided in the display portion 9005a or the belt portion 9005b. To improve safety, a protection circuit that prevents overcharging and/or overdischarging of the secondary battery may be electrically connected to the secondary battery. With the use of the secondary battery of one embodiment of the present invention, space saving required with downsizing of a housing can be achieved.

The display portion 9005a can display various kinds of information such as time and reception information of an e-mail and/or an incoming call.

In addition, the watch-type device 9005 is a wearable device that is wound around an arm directly; thus, a sensor that measures the pulse, the blood pressure, or the like of the user may be incorporated therein. Data on the exercise quantity and health of the user can be stored to be used for health maintenance.

Figure 28B:
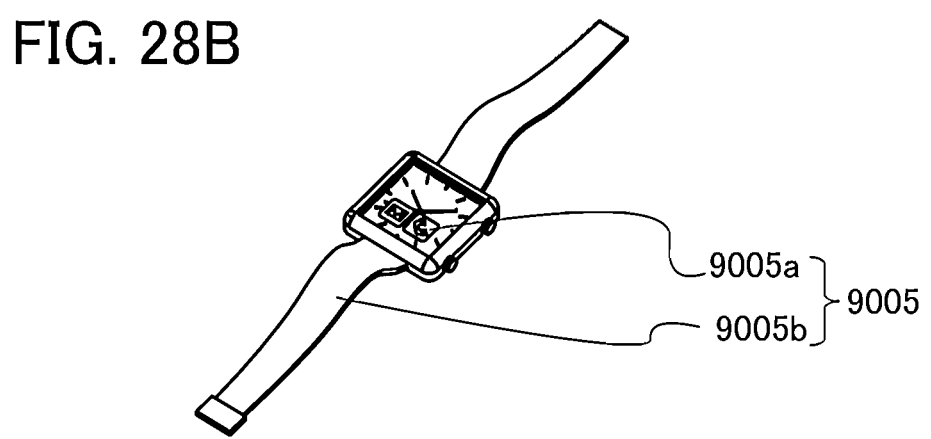

FIG. 28B is a perspective view of the watch-type device 9005 that is detached from an arm.

Figure 28C:
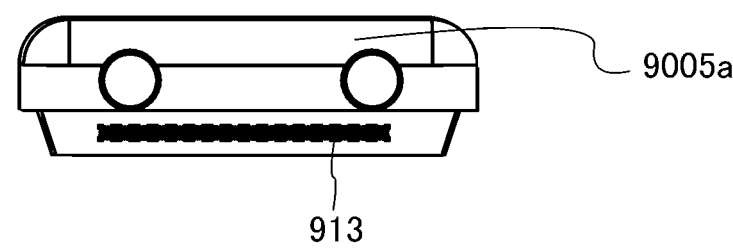

FIG. 28C is a side view of the watch-type device 9005. FIG. 28C illustrates a state where the secondary battery 913 of one embodiment of the present invention is incorporated in the watch-type device 9005. The secondary battery 913, which is small and lightweight, overlaps with the display portion 9005a. It is preferred that the secondary battery be electrically connected to the control circuit of one embodiment of the present invention.

Figure 29A:
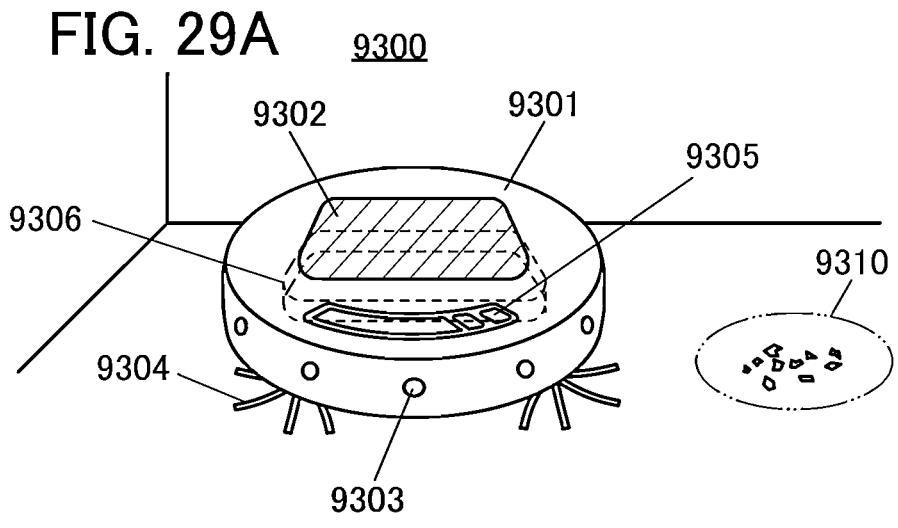
FIG. 29A to FIG. 29C are diagrams illustrating examples of electronic devices.

FIG. 29A illustrates an example of a cleaning robot. A cleaning robot 9300 includes a display portion 9302 placed on the top surface of a housing 9301, a plurality of cameras 9303 placed on the side surface of the housing 9301, a brush 9304, operation buttons 9305, a secondary battery 9306, a variety of sensors, and the like. The control circuit of one embodiment of the present invention is preferably electrically connected to the secondary battery 9306. Although not illustrated, the cleaning robot 9300 is provided with a tire, an inlet, and the like. The cleaning robot 9300 is self-propelled, detects dust 9310, and sucks up the dust through the inlet provided on the bottom surface.

For example, the cleaning robot 9300 can determine whether there is an obstacle such as a wall, furniture, or a step by analyzing images taken by the cameras 9303. In the case where the cleaning robot 9300 detects an object, such as a wire, that is likely to be caught in the brush 9304 by image analysis, the rotation of the brush 9304 can be stopped. The cleaning robot 9300 includes a secondary battery 9306 of one embodiment of the present invention and a semiconductor device or an electronic component. The cleaning robot 9300 including the secondary battery 9306 of one embodiment of the present invention can be a highly reliable electronic device that can operate for a long time.

Figure 29B:
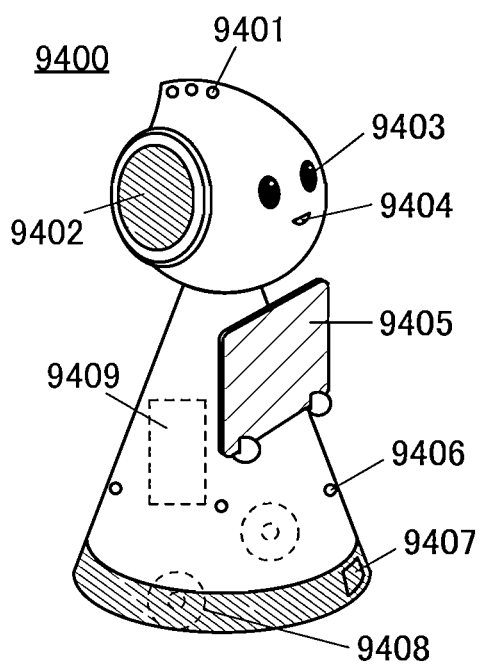

FIG. 29B illustrates an example of a robot. A robot 9400 illustrated in FIG. 29B includes a secondary battery 9409, an illuminance sensor 9401, a microphone 9402, an upper camera 9403, a speaker 9404, a display portion 9405, a lower camera 9406, an obstacle sensor 9407, a moving mechanism 9408, an arithmetic device, and the like. The control circuit of one embodiment of the present invention is preferably electrically connected to the secondary battery 9409.

The microphone 9402 has a function of detecting a speaking voice of a user, an environmental sound, and the like. The speaker 9404 has a function of outputting sound. The robot 9400 can communicate with a user using the microphone 9402 and the speaker 9404.

The display portion 9405 has a function of displaying various kinds of information. The robot 9400 can display information desired by a user on the display portion 9405. The display portion 9405 may be provided with a touch panel. Moreover, the display portion 9405 may be a detachable information terminal, in which case charging and data communication can be performed when the display portion 9405 is set at the home position of the robot 9400.

The upper camera 9403 and the lower camera 9406 each have a function of taking an image of the surroundings of the robot 9400. The obstacle sensor 9407 can detect the presence of an obstacle in the direction where the robot 9400 advances with the moving mechanism 9408. The robot 9400 can move safely by recognizing the surroundings with the upper camera 9403, the lower camera 9406, and the obstacle sensor 9407.

The robot 9400 includes the secondary battery 9409 of one embodiment of the present invention and a semiconductor device or an electronic component. The robot 9400 including the secondary battery of one embodiment of the present invention can be a highly reliable electronic device that can operate for a long time.

Figure 29C:
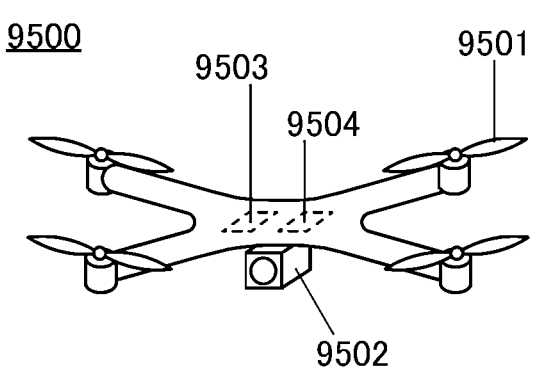

FIG. 29C illustrates an example of a flying object. A flying object 9500 illustrated in FIG. 29C includes propellers 9501, a camera 9502, a secondary battery 9503, and the like and has a function of flying autonomously. The control circuit of one embodiment of the present invention is preferably electrically connected to the secondary battery 9503.

For example, image data taken by the camera 9502 is stored in an electronic component 9504. The electronic component 9504 can analyze the image data to detect whether there is an obstacle in the way of the movement. Moreover, the electronic component 9504 can estimate the remaining battery level from a change in the power storage capacity of the secondary battery 9503. The flying object 9500 includes the secondary battery 9503 of one embodiment of the present invention. The flying object 9500 including the secondary battery of one embodiment of the present invention can be a highly reliable electronic device that can operate for a long time.

This embodiment can be implemented in appropriate combination with the other embodiments.

REFERENCE NUMERALS

100: power storage system, 120: secondary battery, 121: battery cell, 130: stack, 131: stack, 400: secondary battery, 401: positive electrode cap, 415: power storage system, 420: control system, 420a: circuit, 420b: circuit, 423: wiring, 424: conductor, 425: insulator, 426: wiring, 500: secondary battery, 501: positive electrode current collector, 502: positive electrode active material layer, 503: positive electrode, 504: negative electrode current collector, 505: negative electrode active material layer, 506: negative electrode, 507: separator, 507a: region, 507b: region, 508: electrolyte, 509: exterior body, 510: positive electrode lead electrode, 511: negative electrode lead electrode, 513: secondary battery, 515: sealant, 516: inlet, 517: antenna, 519: layer, 521: circuit board, 522: terminal, 531: secondary battery pack, 550: stack, 551: one, 552: the other, 560: secondary battery, 581: polymer film, 582: holes, 584: polymer film, 585: holes, 590: control system, 590a: circuit system, 590b: circuit system, 601: positive electrode cap, 602: battery can, 603: positive electrode terminal, 604: positive electrode, 605: separator, 606: negative electrode, 607: negative electrode terminal, 608: insulating plate, 609: insulating plate, 611: PTC element, 613: safety valve mechanism, 700: control system, 701: input protection circuit, 702: charge protection circuit, 703: discharge protection circuit, 704: selection circuit, 705: output control circuit, 706: output protection circuit, 711: potential adjustment circuit, 712: power supply generation circuit, 713: control circuit, 714: switch portion, 721: charge control circuit, 731: input terminal, 732: output terminal, 750: measurement circuit, 750a: circuit, 751: alternating signal source, 752: capacitor, 753: resistor, 754: inductor, 755: switch, 771: terminal, 772: terminal, 781: voltmeter, 782: voltmeter, 786: capacitor, 911a: terminal, 911b: terminal, 913: secondary battery, 930: housing, 930a: housing, 930b: housing, 931: negative electrode, 931a: negative electrode active material layer, 932: positive electrode, 932a: positive electrode active material layer, 933: separator, 950: wound body, 950a: wound body, 951: terminal, 952: terminal, 970: secondary battery, 971: housing, 972: stack, 973a: positive electrode lead electrode, 973b: terminal, 973c: conductor, 974a: negative electrode lead electrode, 974b: terminal, 974c: conductor, 975a: positive electrode, 975b: positive electrode, 976: separator, 977a: negative electrode, 1301a: first battery, 1301b: first battery, 1302: battery controller, 1303: motor controller, 1304: motor, 1305: gear, 1306: DCDC circuit, 1307: electric power steering, 1308: heater, 1309: defogger, 1310: DCDC circuit, 1311: second battery, 1312: inverter, 1313: audio, 1314: power window, 1315: lamps, 1316: tire, 1317: rear motor, 1320: control system, 1415: battery pack, 1421: wiring, 1422: wiring, 1700: power storage device, 1701: commercial power source, 1703: distribution board, 1705: power storage controller, 1706: indicator, 1707: general load, 1708: power storage load, 1709: router, 1710: service wire mounting portion, 1711: measuring portion, 1712: predicting portion, 1713: planning portion, 1790: control device, 1791: storage battery, 1796: underfloor space, 1799: building, 2001: automobile, 2002: transporter, 2003: transport vehicle, 2004: aircraft, 2005: transport vehicle, 2100: electric bicycle, 2101: secondary battery, 2102: power storage device, 2103: display portion, 2104: control system, 2201: battery pack, 2202: battery pack, 2203: battery pack, 2204: battery pack, 2300: motor scooter, 2301: side mirror, 2302: power storage device, 2303: indicator light, 2304: under-seat storage unit, 2603: vehicle, 2604: charging device, 2610: solar panel, 2611: wiring, 2612: power storage device, 2800: personal computer, 2801: housing, 2802: housing, 2803: display portion, 2804: keyboard, 2805: pointing device, 2806: secondary battery, 2807: secondary battery, 7100: portable display device, 7101: housing, 7102: display portion, 7103: operation button, 7104: secondary battery, 7200: portable information terminal, 7201: housing, 7202: display portion, 7203: band, 7204: buckle, 7205: operation button, 7206: input-output terminal, 7207: icon, 7300: display device, 7304: display portion, 7400: mobile phone, 7401: housing, 7402: display portion, 7403: operation button, 7404: external connection port, 7405: speaker, 7406: microphone, 7407: secondary battery, 7500: electronic cigarette, 7501: atomizer, 7502: cartridge, 7504: secondary battery, 7600: tablet terminal, 7625: switch, 7627: switch, 7628: operation switch, 7629: fastener, 7630: housing, 7630a: housing, 7630b: housing, 7631: display portion, 7631a: display portion, 7631b: display portion, 7633: solar cell, 7634: charging and discharging control circuit, 7635: power storage unit, 7636: DCDC converter, 7637: converter, 7640: movable portion, 8000: display device, 8001: housing, 8002: display portion, 8003: speaker portion, 8004: secondary battery, 8100: lighting device, 8101: housing, 8102: light source, 8103: secondary battery, 8104: ceiling, 8105: side wall, 8106: floor, 8107: window, 8200: indoor unit, 8201: housing, 8202: air outlet, 8203: secondary battery, 8204: outdoor unit, 8300: electric refrigerator-freezer, 8301: housing, 8302: refrigerator door, 8303: freezer door, 8304: secondary battery, 9000: glasses-type device, 9000a: frame, 9000b: display portion, 9001: headset-type device, 9001a: microphone portion, 9001b: flexible pipe, 9001c: earphone portion, 9002: device, 9002a: housing, 9002b: secondary battery, 9003: device, 9003a: housing, 9003b: secondary battery, 9005: watch-type device, 9005a: display portion, 9005b: belt portion, 9006: belt-type device, 9006a: belt portion, 9006b:

wireless power feeding and receiving portion, 9300: cleaning robot, 9301: housing, 9302: display portion, 9303: camera, 9304: brush, 9305: operation button, 9306: secondary battery, 9310: dust, 9400: dust, 9401: illuminance sensor, 9402: microphone, 9403: upper camera, 9404: speaker, 9405: display portion, 9406: lower camera, 9407: obstacle sensor, 9408: moving mechanism, 9409: secondary battery, 9500: flying object, 9501: propeller, 9502: camera, 9503: secondary battery, 9504: electronic component

The invention claimed is:

1. A power storage system comprising:
a secondary battery and a measurement circuit,
wherein the measurement circuit comprises a resistor, a capacitor, and an inductor,
wherein one terminal of the resistor is electrically connected to one electrode of the capacitor,
wherein the other terminal of the resistor is electrically connected to one terminal of the inductor,
wherein the one terminal of the inductor is electrically connected to a positive electrode of the secondary battery, and
wherein the measurement circuit is configured to measure impedance of the secondary battery by measuring current of the resistor.

2. A power storage system comprising:
a secondary battery and a measurement circuit,
wherein the measurement circuit comprises a resistor, a capacitor, and an inductor,
wherein one terminal of the resistor is electrically connected to one electrode of the capacitor,
wherein the other electrode of the capacitor is electrically connected to one terminal of the inductor,
wherein the one terminal of the inductor is electrically connected to a positive electrode of the secondary battery, and
wherein the measurement circuit is configured to measure impedance of the secondary battery by measuring current of the resistor.

3. The power storage system according to claim 1,
wherein the power storage system is configured to measure the impedance while supplying charge current or discharge current to the secondary battery.

4. The power storage system according to claim 3,
wherein the other terminal of the inductor is electrically connected to a first circuit, and
wherein the first circuit is configured to control charging of the secondary battery.

5. The power storage system according to claim 4,
wherein the charge current is supplied to the secondary battery from the first circuit through the inductor.

6. The power storage system according to claim 1,
wherein the measurement circuit is configured to apply voltage with an alternating component to the secondary battery,
wherein the measurement circuit is configured to sweep a frequency of the alternating component, and wherein the power storage system is configured to estimate a state of the secondary battery on the basis of correlation between the frequency and a value of the current of the resistor.

7. The power storage system according to claim 6,
wherein the power storage system is configured to determine a charging condition of the secondary battery on the basis of the estimated state of the secondary battery.

8. A power storage system comprising:
a secondary battery and a measurement circuit,
wherein the measurement circuit comprises a resistor, a capacitor, an inductor, and an alternating signal source,
wherein one terminal of the resistor is electrically connected to one electrode of the capacitor,
wherein the other terminal of the resistor is electrically connected to one terminal of the inductor,
wherein the one terminal of the inductor is electrically connected to a positive electrode of the secondary battery, and
wherein the alternating signal source is electrically connected to the other electrode of the capacitor and a negative electrode of the secondary battery.

9. A power storage system comprising:
a secondary battery and a measurement circuit,
wherein the measurement circuit comprises a resistor, a capacitor, an inductor, and an alternating signal source,
wherein one terminal of the resistor is electrically connected to one electrode of the capacitor,
wherein the other electrode of the capacitor is electrically connected to one terminal of the inductor,
wherein the one terminal of the inductor is electrically connected to a positive electrode of the secondary battery, and
wherein the alternating signal source is electrically connected to the other terminal of the resistor and a negative electrode of the secondary battery.

10. The power storage system according to claim 8,
wherein the power storage system is configured to sweep a frequency of a signal output from the alternating signal source and obtaining correlation between a current value of the resistor and the frequency.

11. The power storage system according to claim 10,
wherein the power storage system is configured to estimate a state of the secondary battery on the basis of the correlation between the current value of the resistor and the frequency, and
wherein the power storage system is configured to determine a charging condition of the secondary battery on the basis of the estimated state of the secondary battery.

12. The power storage system according to claim 10,
wherein the current value of the resistor is measured in a state where charge current or discharge current is supplied to the secondary battery.

13. The power storage system according to claim 1 comprising a temperature sensor.

14. A vehicle comprising the power storage system according to claim 1.

15. An electronic device comprising the power storage system according to claim 1.

* * * * *